United States Patent
Lane et al.

(10) Patent No.: US 6,965,249 B2
(45) Date of Patent: Nov. 15, 2005

(54) PROGRAMMABLE LOGIC DEVICE WITH REDUNDANT CIRCUITRY

(75) Inventors: Christopher Lane, San Jose, CA (US); Ketan Zaveri, San Jose, CA (US); Hyun Yi, San Jose, CA (US); Giles Powell, Alameda, CA (US); Paul Leventis, Ontario (CA); David Jefferson, Morgan Hill, CA (US); David Lewis, Ontario (CA); Triet Nguyen, San Jose, CA (US); Vikram Santurkar, San Jose, CA (US); Michael Chan, Ontario (CA); Andy Lee, San Jose, CA (US); Brian Johnson, Sunnyvale, CA (US); David Cashman, Ontario (CA)

(73) Assignee: Altera Corporation, San Jose, CA (US)

( * ) Notice: Subject to any disclaimer, the term of this patent is extended or adjusted under 35 U.S.C. 154(b) by 144 days.

(21) Appl. No.: 10/159,581

(22) Filed: May 30, 2002

(65) Prior Publication Data

US 2003/0072185 A1 Apr. 17, 2003

Related U.S. Application Data

(60) Provisional application No. 60/329,642, filed on Oct. 15, 2001.

(51) Int. Cl.[7] ............................................. H03K 19/177
(52) U.S. Cl. ............................... 326/10; 326/9; 326/41
(58) Field of Search .................................. 326/9–10, 41

(56) References Cited

U.S. PATENT DOCUMENTS

| | | | |
|---|---|---|---|
| 4,899,067 A | 2/1990 | So et al. | |
| 5,260,611 A | 11/1993 | Cliff et al. | |
| 5,369,314 A | 11/1994 | Patel et al. | |
| 5,434,514 A | 7/1995 | Cliff et al. | |
| 5,592,102 A | 1/1997 | Lane et al. | |
| 5,926,036 A | 7/1999 | Cliff et al. | |
| 6,034,536 A | 3/2000 | McClintock et al. | |
| 6,107,820 A | 8/2000 | Jefferson et al. | |
| 6,167,558 A | * 12/2000 | Trimberger | .................. 716/16 |
| 6,201,404 B1 | 3/2001 | Reddy et al. | |
| 6,344,755 B1 | 2/2002 | Reddy et al. | |
| 2001/0006347 A1 | 7/2001 | Jefferson et al. | |
| 2002/0166106 A1 | 11/2002 | Lewis et al. | |

OTHER PUBLICATIONS

U.S. patent application Ser. No. 09/844,077, Nguyen et al., filed Apr. 26, 2001.
U.S. patent application Ser. No. 10/140,287, Lewis et al., filed May 6, 2002.
U.S. patent application Ser. No. 10/289,629, Johnson et al., filed Nov. 6, 2002.
Kluwer Academic Publishers, Vaughn Betz, Jonathan Rose, Alexander Marquardt, *Architecture and CAD for Deep–Submicron FPGAs*, Chapter 2.1 (pp. 11–18), Chapter 4 (pp. 63–103), Chapter 5 (pp. 105–126), and Chapter 7 (pp. 151–190), (Mar. 1999).
Hatori, F. et al., (1993) "Introducing Redundancy In Field Programmable Gate Arrays" *IEEE Custom Integrated Circuits Conference*, 7.1.1–7.1.4.

* cited by examiner

*Primary Examiner*—Anh Q. Tran
(74) *Attorney, Agent, or Firm*—Morrison & Foerster LLP

(57) ABSTRACT

A programmable logic device and associated method is provided with repairable regions. In one aspect, general routing interconnect lines are segmented within repairable regions. In another aspect, IO bus lines and associated circuitry are provided that accommodate redundancy in a staggered segmented architecture. In another aspect, a dedicated routing architecture between particular logic regions accommodates shifting to define and utilize repairable regions. Principles of other aspects are illustrated and described in the context of several exemplary embodiments of aspects of the invention.

109 Claims, 21 Drawing Sheets

PROGRAMMABLE LOGIC DEVICE WITH REDUNDANT CIRCUITRY

TECHNICAL FIELD

This invention relates to programmable logic devices having redundant circuitry.

BACKGROUND OF THE INVENTION AND RELATED ART

Programmable logic devices ("PLDs") (also sometimes referred to as PALs, PLAs, FPLAs, EPLDs, EEPLDs, LCAs, or FPGAs), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits; however, it is possible to provide an ASIC that has a portion or portions that are programmable; thus, it is possible for an integrated circuit device to have qualities of both an ASIC and a PLD. The term PLD as used herein will be considered broad enough to not necessarily exclude such devices.

Like all integrated circuits, programmable logic devices are susceptible to manufacturing defects. In order to increase yields, programmable logic devices may be provided with spare or redundant circuits. In a repairable region, each respective row below a bad row, including the spare row, have programmable connections that can be used to replicate the pattern of connections in the row above that respective row. See, for example, U.S. Pat. Nos. 6,201,404 and 6,344,755.

A programmable logic device is typically made up of logic regions, such as logic array blocks (LABs), which in turn comprise logic elements. Signals are routed to and from the logic regions over vertical and horizontal conductors that form signal paths. Particular circuitry, including, for example, pass gates, multiplexors ("muxes"), and drivers may be used to couple and drive signals onto horizontal or vertical wires, or to receive signals from the horizontal or vertical wires and drive them to the logic regions. Circuitry forming connections between horizontal wires, vertical wires, and logic regions may be programmable. One example of a programmable connection is a pass gate coupled to a random access memory bit circuit, the pass gate programmably connecting a vertical wire to an input multiplexor of a logic region. The pass gate is open or closed depending on the data in the memory bit. However, that is just one example. Some examples may include connections based upon static or dynamic random access memory, electrically erasable read-only memory, flash, fuse, and anti-fuse programmable connections. The programmable connection could also be implemented through mask programming during fabrication of the device. While mask programming may have disadvantages relative to some of the field programmable options already listed, it may be useful in certain high Volume applications.

Horizontal wires may form signal paths that typically exist within, or are associated with, a particular logic region row. Thus, in a row-based redundancy scheme, if a spare row is utilized, the horizontal wires and associated connections to and from logic regions of a row above the spare row are replaced by those of the spare row. Vertical wires typically span several rows, or may even span all the rows on a device. Past PLDs with redundancy have had vertical wires that span all or half of the device. Repairable regions that are no larger than the length of a vertical wire rely on connections to and from the same vertical wire in each row within the repairable region.

SUMMARY OF THE INVENTION

For routing flexibility and for optimizing with respect to particular factors, it may be useful in some contexts to provide a routing architecture that does not rely on horizontal and vertical wires that span a large portion of the device. In particular, it may be desirable to provide a routing architecture whereby, for example, vertical signal paths are made up of a plurality of several wires significantly shorter than the signal path itself. Certain aspects of such an architecture are described in co-pending application entitled "System and Method for Asymmetric Routing Lines" filed Jan. 25, 2002, Ser. No. 10/057,232, and under a common obligation of assignment as the present application. In a segmented routing architecture, a vertical signal path may be broken into multiple wires between two or more rows in several places up and down a device. Furthermore, even if a particular signal path is not broken into multiple wires between two particular rows, if a segmented routing architecture is also staggered (i.e. adjacent vertical signal paths have wires that start and stop at different rather than at the same vertical position), then across a row touched by several different signal paths, it is likely that for any given row, at least one of the vertical signal paths will include multiple wires between that row and an adjacent row. Such a routing architecture presented particular challenges to implementing redundancy. For example, to accommodate such an architecture, there is a need to provide repairable regions that have vertical wires starting and stopping within a repairable region. There is a need to provide a PLD with a staggered segmented routing architecture that also has circuitry that accommodates redundancy.

A staggered segmented IO routing architecture may be useful for routing signals on an input/output ("IO") bus. The IOs at the end of a row of logic regions, on the sides of the PLD, may be referred to as horizontal IOs ("HIO"s). IO circuitry, including HIO circuitry, may be organized in units, sometimes referred to as blocks (these units may be referred to sometimes by other names, e.g., cells, segments, regions, or just "IOs"). Vertical signal paths of the HIO bus may span several rows of IO blocks. Signals routed on an IO bus are often high fanout signals, meaning, for example, that the same signal is delivered to several different IOs. There is a need for a redundancy scheme for an IO bus that can accommodate a staggered segmented routing structure and that can also accommodate the particular needs of IO signals.

In some contexts, it is useful to provide for routing schemes dedicated to directly linking the logic regions of a particular row or column. Such LAB-to-LAB dedicated routing schemes may exist independent of and in addition to the more general routing architecture of the PLD. See, e.g., U.S. Pat. No. 5,260,611. These LAB-to-LAB routing schemes allow groups of LABs to be linked to provide, for example, a larger function block for performing particular types of functions. Carry chains are one type of function that is usefully performed by such dedicated blocks, however, dedicated LAB-to-LAB routing may be useful for other routing purposes. There is a need to implement redundancy for vertical LAB-to-LAB routing architecture spanning multiple rows within a row-based redundancy scheme.

In some embodiments, the present invention provides a programmable logic device including redundant circuitry for connections between logic region rows and signal paths spanning a plurality of logic regions rows, the signal paths each including respective pluralities of lines. In some embodiments, redundant circuitry is provided for connections between logic region rows and respective lines spanning respective pluralities of logic region rows where the respective lines span fewer rows than are included in a defined repairable region above a spare row. In some embodiments, normal and redundant stitching circuitry provide routing and redundant routing over signal paths including respective pluralities of lines. In some particular embodiments, a stitching multiplexor of a first signal path is used for redundant routing by a second signal path and normal mode connections for one logic region row to drive the second signal path through the stitching multiplexor may overlap with redundant mode connections to drive the first signal path through the stitching multiplexor. In some embodiments, both upstream and downstream signal paths having pluralities of lines are provided with redundancy on either the same or different track bundles. In some particular embodiments, tracks of physical lines and associated stitching and redundant stitching circuitry provide signal paths that may stitch from one track to another in certain rows. In some embodiments, stubs provide pathways between lines and routing resources of a logic region row and between lines and stitching circuitry. In certain embodiments, the present invention provides redundancy for IO bus signal paths where the signal paths include respective pluralities of lines. In one embodiment, IO circuitry is provided to listen to a particular IO bus signal path over the same IO buffer in a majority of rows even as the IO bus signal path is provided on different physical lines over the length of the signal path. In some embodiments, dedicated routing between logic regions in different rows is provided with circuitry to accomplish bypassing rows as needed in normal and redundant modes.

BRIEF DESCRIPTION OF THE DRAWINGS

FIG. 1b illustrates further detail with respect to two of the logic region rows illustrated in FIG. 1a.

DETAILED DESCRIPTION OF PARTICULAR EMBODIMENTS OF THE INVENTION

The following description is presented to enable any person skilled in the art to make and use the invention, and is provided in the context of particular applications and their requirements. Various modifications to the disclosed embodiments will be readily apparent to those skilled in the art, and the generic principles defined herein may be applied to other embodiments and applications without departing from the spirit and scope of the invention. Thus, the present invention is not intended to be limited to the embodiments shown, which are merely descriptive of several specific embodiments illustrating the principles and features of the present invention.

Figure 1A:
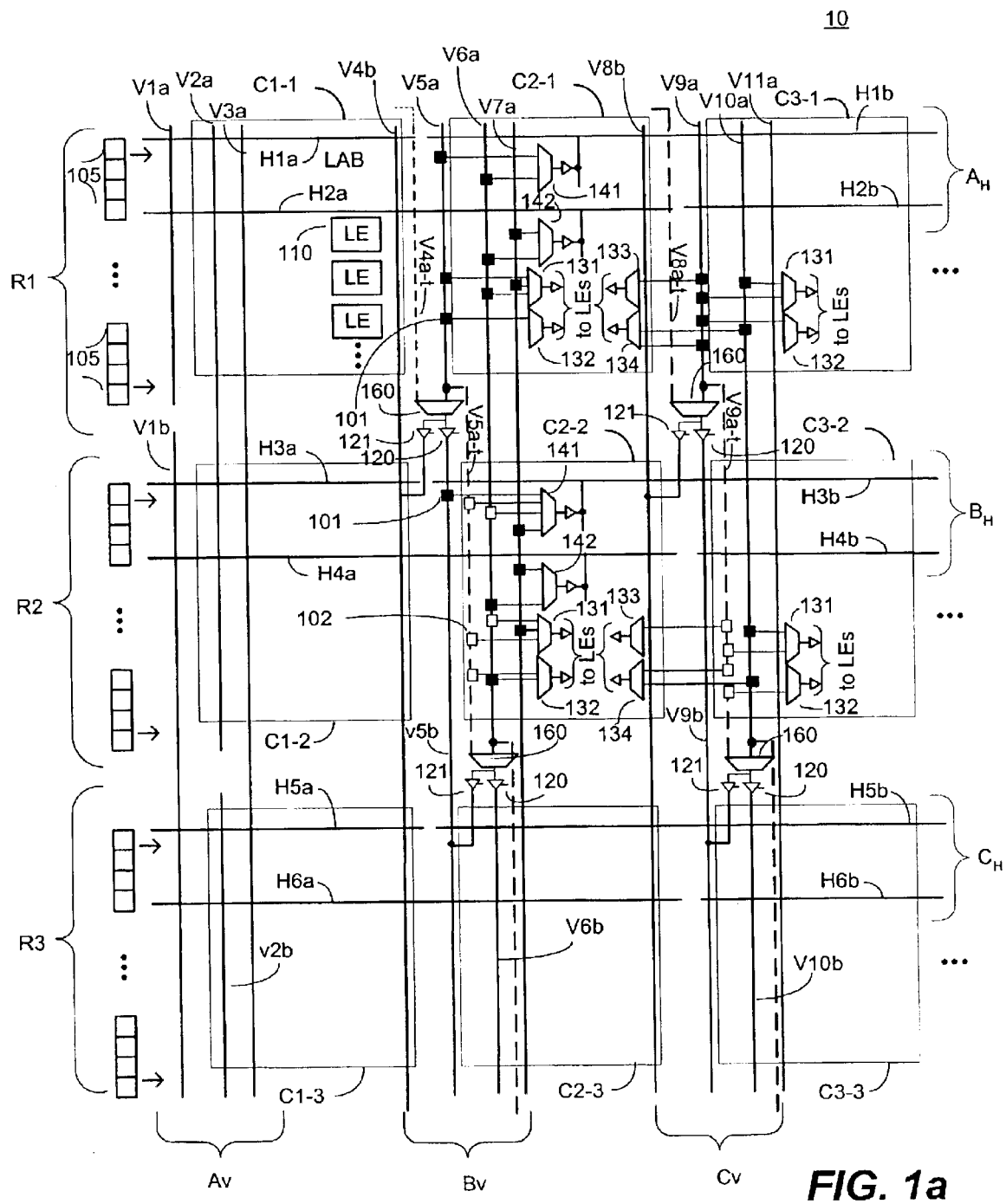
FIG. 1a illustrates a portion of programmable logic device (PLD) having a staggered segmented routing architecture and redundant connections in which an embodiment of the present invention may be implemented.

FIG. 1a illustrates a PLD section IO of a programmable logic device. PLD section 10 includes logic regions comprising logic array blocks (LABs) C1-1, C2-1, C3-1, C1-2, C2-2, C3-2, C1-3, C2-3, and C3-3. Each LAB in section 10 has logic elements (LEs) 110. Some LEs 110 are shown individually for LAB C1-1, but are not shown for other LABs. Each LAB illustrated is part of a logic region row. PLD section 10 includes portions of three logic region rows: R1, R2, and R3. Each logic region row of PLD section 10 includes the LABs of the row and further includes a horizontal channel of conductors. For example, the illustrated portion of logic region row R1 includes LABs C1-1, C2-1, and C3-1. Logic region row R1 further includes horizontal channel $A_H$ that includes two illustrated tracks of horizontal wires. A first track includes horizontal wires ("H-lines") H1a and H1b and a second track includes H-lines H2a and H2b. A horizontal channel in a logic region row typically includes several more horizontal tracks (which may be grouped in "bundles" of wires), however, the horizontal channels in the logic region rows of PLD section 10 are shown with only two tracks so as not to overcomplicate the drawing with unnecessary detail. Each logic region row of PLD section 10 further includes routing resources for coupling to the LEs of each LAB, or for coupling to a horizontal channel. For example, the illustrated portion of logic region row R1 shows routing resources including LAB input muxes ("LIMs") 131, 132, 133, and 134 for receiving signals that may be selected for routing to the LEs of LAB C2-1 (additional layers of muxing between LIMs and LEs not shown). Additional LIMs 131 and 132 are also shown for routing to the LEs of LAB C3-1. Other routing resources illustrated include driver input muxes ("DIMs") 141 and 142 for receiving signals that may be selected for driving onto, respectively, respectively, H-lines H1b and H2a.

PLD section 10 also includes vertical channels ("V-channels") Av, Bv, and Cv. Each channel includes a plurality of tracks of wires. For example, as illustrated, vertical channel Av includes a first track including vertical wires ("V-lines") V1a and V1b, a second track including V-lines V2a and V2b, and a third track including V-line V3a. A vertical channel in a PLD typically includes many more tracks of V-lines; a "bundle" might include four tracks (or a different number of tracks), however, a "channel" would typically include several bundles. Vertical channels $B_V$ and $C_V$ are each shown with only a single bundle of four tracks so as not to over-complicate the drawing with unnecessary detail.

As illustrated, the V-channels of PLD section 10 couple to the illustrated LABs in a manner that supports 3-sided routing. In other words, a LAB in PLD section 10 is coupled to an H-channel and also to two V-channels. At least some V-lines in PLD section 10 couple to two different LABs in the same logic region row. For example, V-line V9a is coupled to LIMs 131 and 132 in LAB C3-1 and V-line V9a is also coupled to LIMs 133 and 134 in LAB C2-1. A 3-sided routing architecture is described in more detail in co-pending application entitled "Routing Architecture for a Programmable Logic Device", filed May 6, 2002, Ser. No. 10/140,287, under a common obligation of assignment as the present application and incorporated herein by reference. An aspect of the present invention provides redundancy that accommodates a 3-side routing architecture as described below.

The routing architecture of PLD section 10 is a staggered, segmented routing architecture. The segmented aspect of this routing architecture is illustrated by the multiple V-lines and H-lines shown in the tracks of each vertical and horizontal channel. The staggered aspect of this routing architecture is illustrated by the fact that wires on two different tracks in the same channel do not necessarily stop and start in the same relative position. For example, V-line V1a ends between R1 and R2 and V-line V2a ends between rows R2 and R3.

The V-lines and H-lines shown form an interconnect coupling the illustrated array of logic resources (e.g., logic regions and associated routing to and from logic elements).

Stitching circuitry is shown for V-lines in V-channels Bv and Cv, but is not separately shown for the V-lines in V-channel Av. Stitching circuitry is also not shown for the H-lines in H-channels $A_H$, $B_H$, and $C_H$.

In V-channels Bv and Cv, stitching circuitry includes muxes 160 and drivers 120. Redundant stitching circuitry includes muxes 160 and redundant drivers 121 as will be explained. V-line V5a is stitched to V-line V5b by a mux 160 and a driver 120 as shown. V-line V5a also includes a tail V5a–t. Tail V5a–t is stitched to V-line V5b through a different mux 160 and through a redundant driver 121 as illustrated. Tail V4a–t (associated with a V-line ending above row R1 and not separately shown), is stitched to V-line V4b by a mux 160 and a redundant driver 121 as shown. V-line V6a is stitched to V-line V6b by a mux 160 and a driver 120 as shown. Tail V8a–t (associated with a V-line ending above row R1 and not separately shown), is stitched to V-line V8b by a mux 160 and a redundant driver 121 as shown. V-line V9a is stitched to V-line V9b by a mux 160 and a driver 120 as shown. V-line V9a also includes a tail V9a–t. Tail V9a–t is stitched to V-line V9b through a mux 160 and a redundant driver 121 as illustrated. V-line V10a is stitched to V-line V10b through a mux 160 and a driver 120 as illustrated.

As illustrated, connections 101 and connections 102 couple V-lines to routing resources of a particular logic region row. To illustrate and describe these connections without over complicating the drawings and descriptions, details are shown only for selected connections to selected routing resources in LABs C2-1 and C3-1 of logic region row R1 and LABS C2-2 and C3-2 of logic region row R2. These connections will be described from the perspective of providing routing circuitry in logic region row R2 that can serve as redundant circuitry for logic region row R1 if redundancy were to be engaged and row data would be shifted downward so that row R2 would replace row R3. Memory elements 105 hold data for programming each row of PLD section 10. The actual shifting of data associated with particular rows in normal and redundant modes is described in further detail with regard to FIG. 2 and FIG. 3.

Continuing with the description of FIG. 1a, beginning with row R-1: V-line V5a is coupled by a connector 101 to a driver input mux ("DIM") 141 (and an associated driver) for routing signals to H-line H1b. V-line V5a is also coupled by connections 101 to LE routing of LAB C2-1 through LAB input mux ("LIM") 131 and LIM 132 (and associated drivers). Continuing with row R1, V-line V6a is coupled by connections 101 to, respectively, DIMs 141 and 142 (and associated drivers). V-line V6a is also coupled by a connection 101 to LE routing of LAB C2-1 through LIM 131 (and associated driver). V-line V7a is coupled by a connection 101 to DIM 142 (and associated driver). V-line V7a is also coupled by a connection 101 to LE routing of LAB C2-1 through LIM 131 (and associated driver). V-line V9a is coupled by connections 101 both to the LE routing of LAB C2-1—through LIMs 133 and 134 (and associated drivers)—and to the LE routing of LAB C3-1, through LIMs 131 and 132 (and associated drivers). V-line V10a is coupled to the LE routing of LAB C3-1 through LIM 131 (and associated driver).

Before describing the illustrated connections in row R2, the relationship between "normal mode" connections 101 and "redundant mode" connections 102 will now be explained. Connections 101 are "normal mode" connections in the sense that they provide routing options in particular rows assuming a defective row does not exist. Connections 102 are "redundant mode" connections in the sense that they provide routing options in, for example, a second row assuming a redundancy mode is engaged and the second logic region row must provide the routing options available in, for example, a first logic region row. "Normal mode" connections in a second row may, in some instances, provide the redundant connections for a first row if they provide options to the same routing resources in the second row that were provided by the normal mode connections. Thus, a connection may, in some instances, be provided both as a normal mode connection and as a redundant mode connection. These principles will now be explained with respect to the connections 101 and 102 illustrated in row R2 relative to the connections 101 illustrated and already described for row R1.

In row R2, V-line V5b is coupled by a connection 101 to DIM 141 (and associated driver) for routing to H-line H3b. Tail V5a–t is coupled by a connection 102 to DIM 141 (and associated driver) for routing to H-line H3b. Tail V5a–t is also coupled by a connection 102 for routing to LEs of LAB C2-2 through, respectively, LIM 131 and LIM 132 (and associated drivers). When redundancy is engaged, row R2 replaces row R2 and thus the connections between tail V5a–t and the routing resources of logic region row R2 replicate the connections between V-line V5a and the routing resources of row R1. For example, the connections 102 just described coupling tail V5a–t to, respectively, DIM 141, LIM 131, and LIM 132 in LAB C2-2 provide redundancy for the connections 101 previously described coupling V-line V5a to, respectively, DIM 141, LIM 131, and LIM 132 in LAB C2-1.

Continuing with row R2, V-line V6a is coupled by a connection 102 to DIM 141 for routing to H-line H3b. V-line V6a is also coupled by a connection 101 to DIM 142 (and associated driver) for routing to H-line H4a. V-line V6a is coupled by a connection 102 to LE routing of LAB C2-2 through LIM 131 (and associated driver), and is coupled by a connection 101 to LE routing of LAB C2-2 through LIM-132 (and associated driver). Note that all connections 101 coupling V-line V6a to routing resources in logic region row R1 are replicated by the connections 101 and 102 coupling V-line V6a to the routing resources of logic region row R2. Note further, that in some instances a connection 101 in row R2 provides the redundancy for a corresponding connection 101 in row R1, but that in other instances a connection 102 in row R2 provides the redundancy for a connection 101 in row R1. For example, the connection 101 in row R2 coupling V-line V6 to DIM 142 in LAB C2-2 exists as a normal mode connection, however, it also may provide a redundant mode connection as it replicates the connection 101 in row R1 that couples V-line V6a to DIM 142 in LAB C2-1. However, in the case of a coupling between V-line V6a in row R2 and LIM 131 in LAB C2-2, a normal mode connection 101 does not exist to replicate the normal mode connection 101 in row R1 coupling V-line V6a to LIM 131, and, therefore, in row R2 a redundant-mode-only connection 102 coupling V-line V6a to LIM 131 in row R2 LAB C2-2 is provided as shown.

Continuing with row R2, V-line V7a is coupled by connections 101 to DIM 141 and DIM 142 (and associated drivers) for routing to, respectively, H-lines H3b and H4a. V-line V7a is also coupled by a connection 101 to LE routing through LIM 131 (and associated driver) as shown. The connections present in row R-1 between V-line V7a and routing resources are also provided in corresponding fashion in R2. In particular, the connection 101 coupling V-line V7a to DIM 142 for routing to H-line H2a in row R1 is replicated in row R2 by the connection 101 coupling V-line V7a to DIM 142 (and associated driver) for routing to H-line H4a. Similarly, the connection 101 coupling V-line V-7a to LE routing of LAB C2-1 through LIM 131 in row R1 is matched in row 2 by the connection 101 coupling to LE routing of LAB C2-2 through LIM 131 (and associated driver). Note that the connection 102 coupling V-line V-7a to LE routing of LAB C2-1 through LIM 132 in R1 does not necessarily need to be replicated in row R2 since that connection would not be engaged in normal mode operation, but only in a redundant mode (that connection provides redundancy for a connection in an earlier row, earlier row and connection not separately shown.). In the presently illustrated embodiment, the connections in row R2 need to provide redundancy for the normal mode connections 101 of row R1, but not for the redundant-mode-only connections 102 of row R1.

Continuing with row R2, tail V9a–t of V-line V9a is coupled by connections 102 to LE routing of LAB C2-2 through, LIM 133 and LIM 134 (and associated drivers) as illustrated. Tail V9a–t is also coupled by connections 102 to LE routing of LAB C3-2 through, respectively, LIM 131 and LIM 132. These connections through LIMs 133 and 134 in LAB C2-2 and LIMs 131 and 132 in LAB C3-2 in row R2 provide redundancy for connections in row R1 coupling V-line V9a through, respectively, LIMs 131 and 132 in LAB C2-1 and LIMs 133 and 134 in LAB C3-1.

Continuing with row R2, V-line V10a is coupled by connections 101 to LE routing of LAB C3-2 through LIM 131 (and associated driver) and to LE routing of LAB C2-2 through LIM 134 (and associated driver) as shown. These "normal mode" connections in row R2 provide redundancy for connections in row R1 coupling V-line V10a through, respectively, LIM 131 of LAB C3-1 and LIM 134 of LAB C2-1. The aspect of the present embodiment illustrating connection between V-channel Cv and both LABs C2-1 and C3-1 in row R1 and the provision for connections that provide redundancy for these connections in row R2 coupling V-channel Cv to both LABs C2-2 and C3-2 in row R1 provides one example of redundancy supporting an aspect of a 3-sided routing architecture.

Figure 1B:
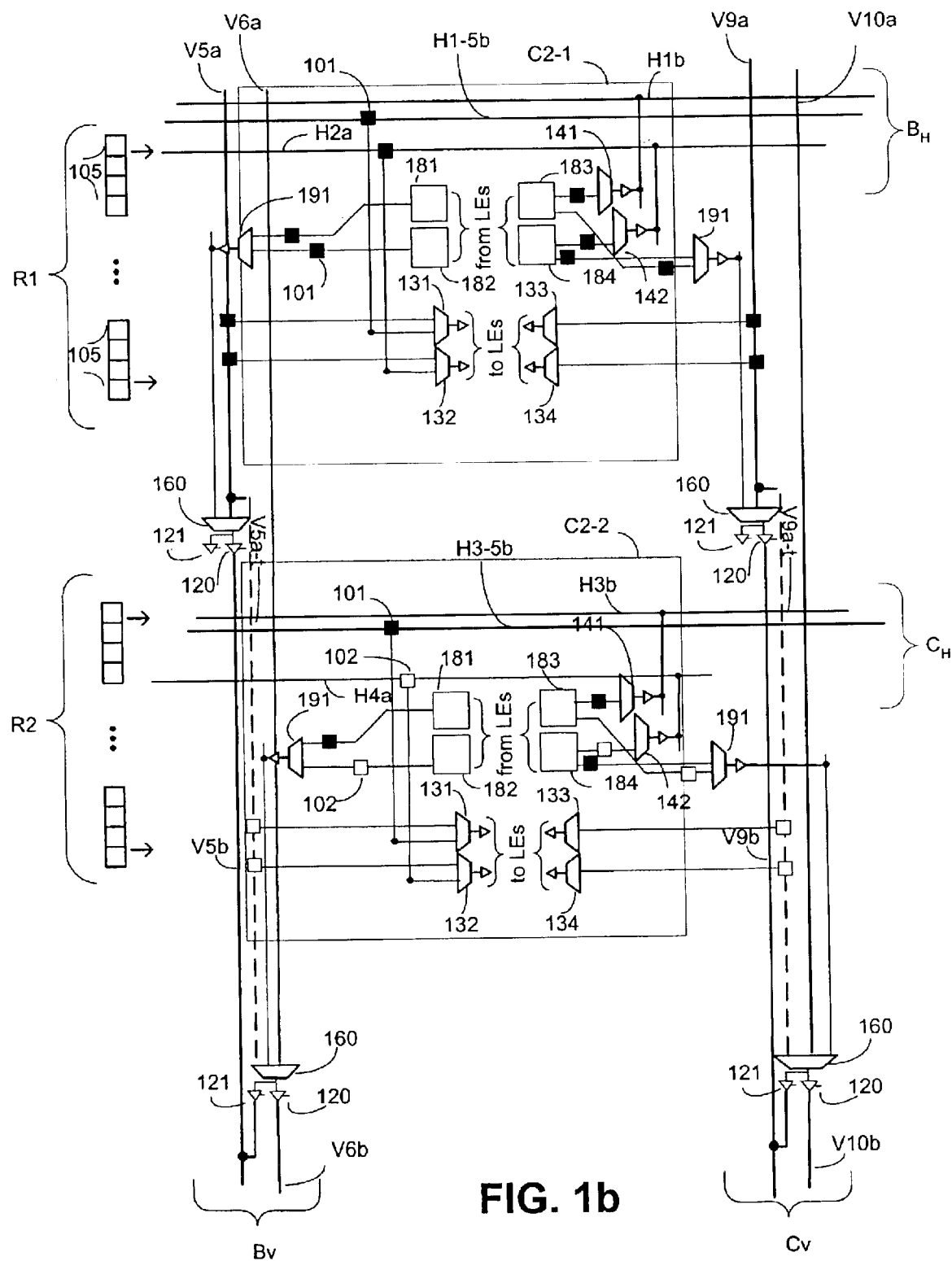

FIG. 1b illustrates additional connections and routing of PLD section 10 of FIG. 1a that highlight additional aspects of an example of redundancy supporting additional aspects of a 3-sided routing architecture. FIG. 1b shows LABs C2-1 and C2-2 in, respectively, logic region rows R1 and R2. FIG. 1b also shows portions of vertical channels $B_V$ and $C_V$ and horizontal channels $B_H$ and $C_H$ previously illustrated and described in FIG. 1a and accompanying text. As illustrated in FIG. 1b, horizontal channels $B_H$ and $C_H$ further include, respectively, V-lines H1–5b and H3–5b. FIG. 1b shows aspects of a 3-sided routing architecture including LE routing to and from two vertical channels and one horizontal channel in each row and shows an example of how one aspect of the present invention supports redundancy within the context of a 3-sided routing architecture. Logic region rows R1 and R2, LABs C2-1 and C2-2 each further include LE outputs 181, 182, 183, and 184.

As was described for the portion of PLD section 10 illustrated and described in FIG. 1a and accompanying text, the additional connection and routing circuitry of FIG. 1b (to the extent not already described in the text accompanying FIG. 1a) will be described from the perspective of providing routing circuitry in logic region row R2 that can serve as redundant circuitry for logic region row R1 if redundancy were to be engaged and row data would be shifted downward so that row R2 would replace row R3. Beginning with logic region row R1, LE outputs 181 and 182 in LAB C2-1 are respectively coupled by respective connections 101 to V-line V5b through DIM 191 (and associated driver) and through a stitching mux 160 and a stitching driver 120 as shown. LE output 183 of LAB C2-1 is coupled by a connection 101 for routing to H-line H1b through DIM 141 (and associated driver) as shown. LE output 184 of LAB C2-1 is coupled by a connection 102 for routing to H-line H2a through DIM 142 (and associated driver) as shown. LE outputs 183 and 184 are respectively coupled by respective connections 101 to V-line V9b through DIM 191 (and associated driver) and through a stitching mux 160 and a stitching driver 120 as shown. Also in row R1, H-lines H1–5b and H2a are respectively coupled by respective connections 101 to the LE routing of LAB C2-1 through, respectively, LIM 131 and 132 (and associated drivers).

Turning to row R2, LE outputs 181 and 182 in LAB C2-2 are coupled by, respectively, a connection 101 and a connection 102 to V-line V5b through DIM 191 (and associated driver) and through a stitching mux 160 and a redundant stitching driver 121 as shown. LE output 183 of LAB C2-2 is coupled by a connection 101 for routing to H-line H3b through DIM 141 (and associated driver) as shown. LE output 184 of LAB C2-2 is coupled by a connection 102 for routing to H-line H4a through a DIM 142 (and associated driver) as shown. LE outputs 183 and 184 are coupled by, respectively, a connection 102 and a connection 101 to V-line V9b through DIM 191 (and associated driver) and through a stitching mux 160 and a redundant stitching driver 121 as shown. Also in row R2, H-lines H3–5b and H4a are coupled by, respectively, a connection 101 and a connection 102 to the LE routing of LAB C2-2 through, respectively, LIM 131 and 132 (and associated drivers).

Because the coupling between respective channels and routing resources of LAB C2-1 in row R1 through "normal mode" connections 101, also exists as corresponding coupling in row R2, either through normal mode connections 101 or through redundant mode connections 102, row R-2 may be used as a replacement for row R1 if redundancy is engaged.

Figure 2:
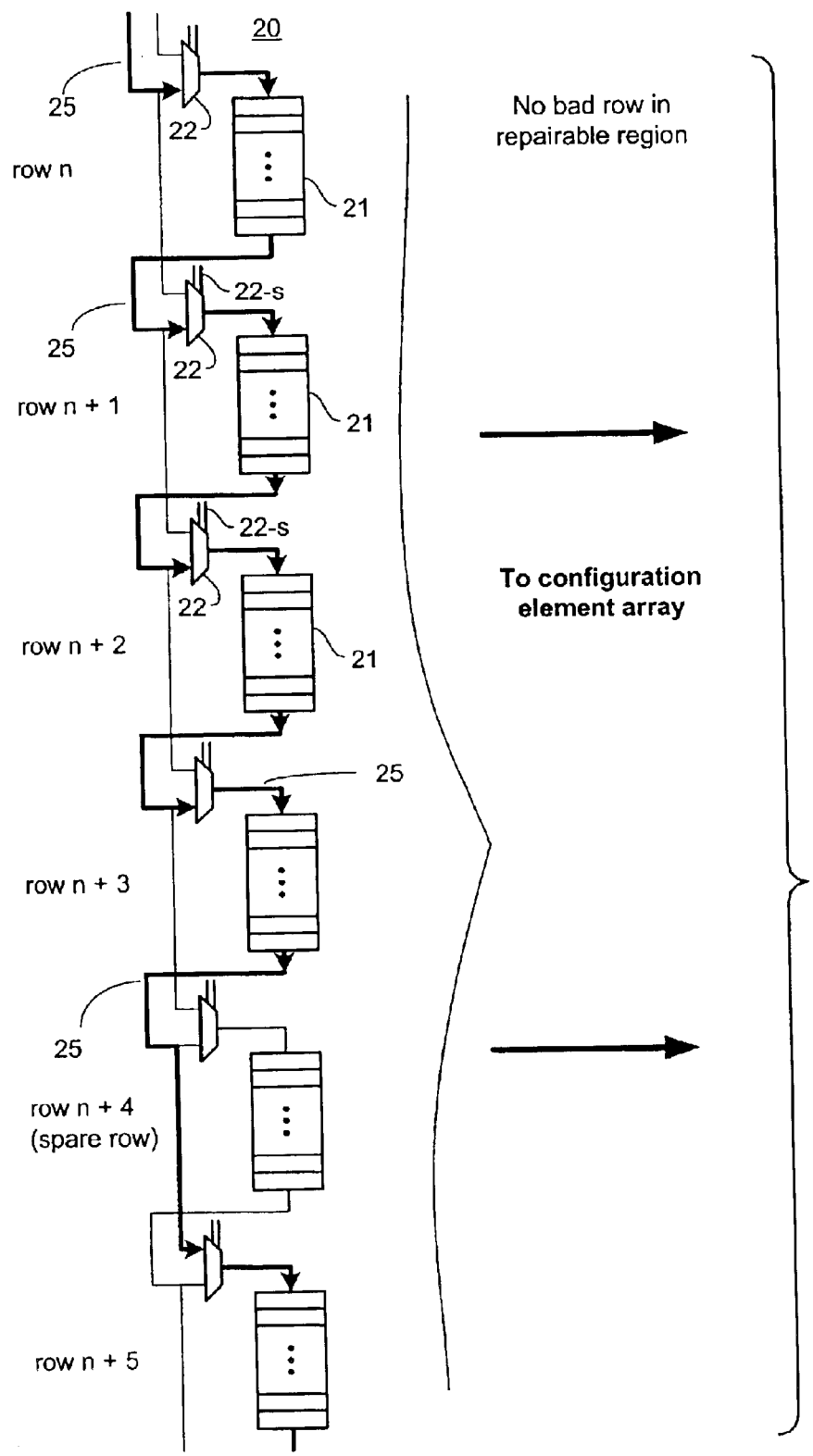
FIG. 2 illustrates a portion of a data register and accompanying switching circuitry that accommodates shifting configuration data to define a repairable region of rows above a spare row.

FIG. 2 illustrates a register portion 20 used for shifting configuration data that programs a PLD having redundant circuitry in a spare row. Register portion 20 includes shift register segments 21, each shift register segment 21 corresponding to a row to be programmed. Shift register segments 21 are shown corresponding to, respectively, rows n, n+1, n+2, n+3, n+4, and n+5. Data is routed between shift register segments 21 by connections to steering muxes 22 as shown. Steering muxes 22 receive steering data at enable inputs 22-s for determining whether or not a particular shift register segment will receive data from a configuration data stream.

As illustrated, a data path is defined between shift register segments 21 over bolded lines 25 based on steering data received at enable input 22-s. Enable inputs 22-s instruct each mux 22 to select data at either or neither of two mux inputs for outputting to a particular shift register segment 21. In FIG. 2, no bad row exists in the repairable region defined by the rows above spare row n+4. Therefore, configuration data is directed along lines 25 to each of the shift register segments 21 corresponding to each of rows n, n+1, n+2, and n+3 above spare row n+4. However, since now repair is needed, steering data at inputs 22-s of the mux 22 shown just above the segment 21 corresponding to spare row n+4 directs that mux 22 to bypass that segment 21. Because no row is being replaced, it is not necessary in the particular example shown in FIG. 2, to activate programmable connections in the spare row n+4, and therefore, that row's corresponding register segment 21 may be bypassed from the stream of configuration data.

Figure 3:
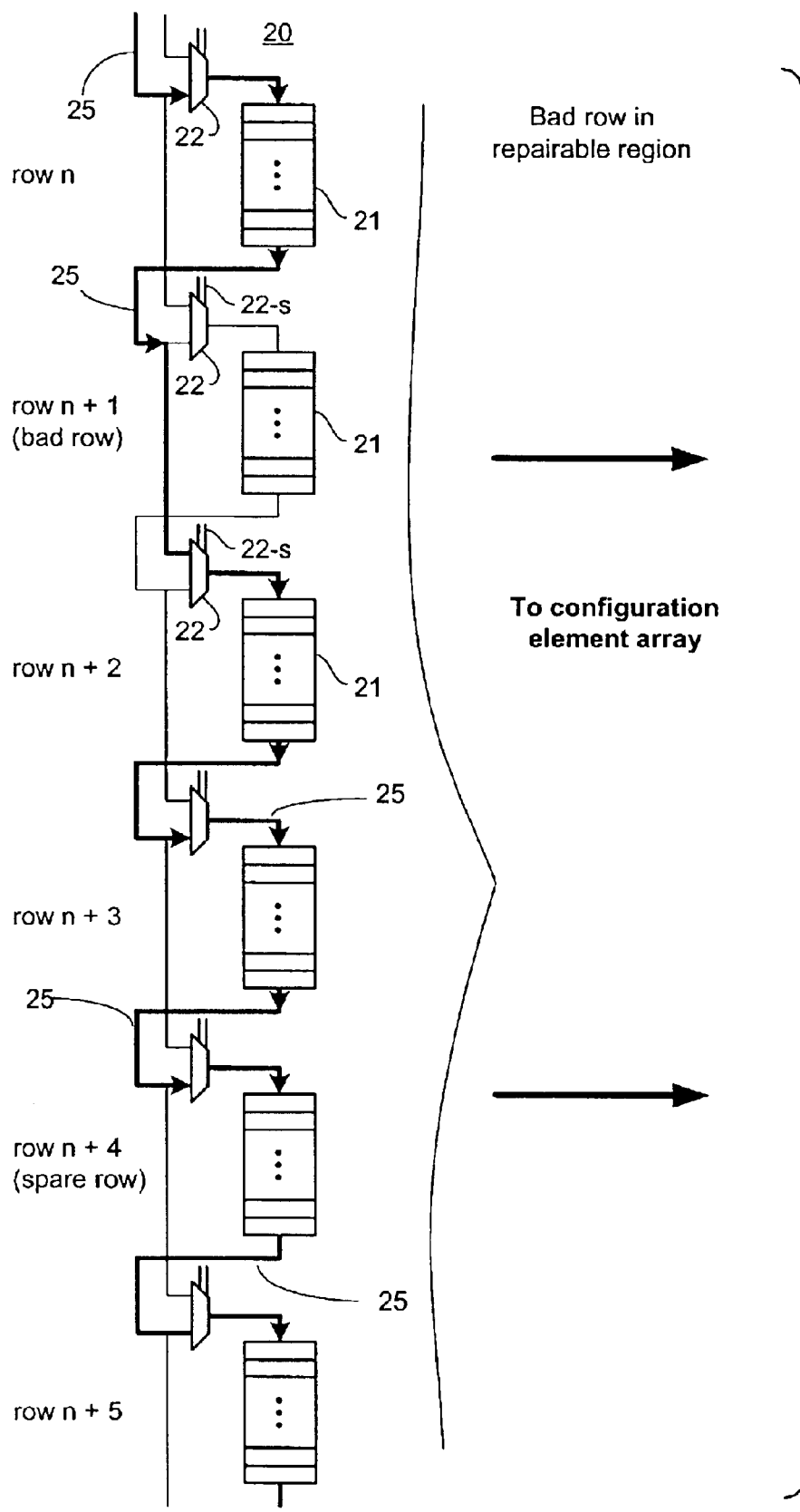
FIG. 3 illustrates the data register and accompanying switching circuitry of FIG. 2 configured to shift data to bypass a bad row and to utilize a spare row to repair a repairable region of rows.

FIG. 3 illustrates the same register portion 20 illustrated in FIG. 2 reconfigured to bypass a bad row and utilize a spare row. In particular, as shown in FIG. 2, row n+1 is a bad row. Steering data at inputs 22-s of the mux 22 shown just above the segment 21 corresponding to the bad row n+1 directs that mux 22 to bypass that segment 21 so that no configuration data is provided to the bad row. Instead, row replacement begins below the bad row n+1 until the spare row n+5. In particular, data from the stream of configuration data that would otherwise have been directed to row n+1, is shifted into row n+2. Furthermore, the mux 22 just above the segment 21 corresponding to spare row n+4 is directed by data provided at its enable inputs 22 to direct data into that segment 21 corresponding to the spare row. In this manner, when the configuration data stream stops shifting, spare row n+4's segment 21 has configuration data that otherwise would have been in row n+3's segment 21, row n+3 has configuration data that otherwise would have been in row n+2's segment 21, and row n+2 has configuration data that otherwise would have been in row n+1's segment 21, had row n+1 not been determined to be a bad row. Data determining which row, if any, in a repairable region is bad is held in a separate register such as a fuse register (fuse register not separately shown), and the fuse register provides steering data to inputs 22-s of muxes 22.

Figure 4:
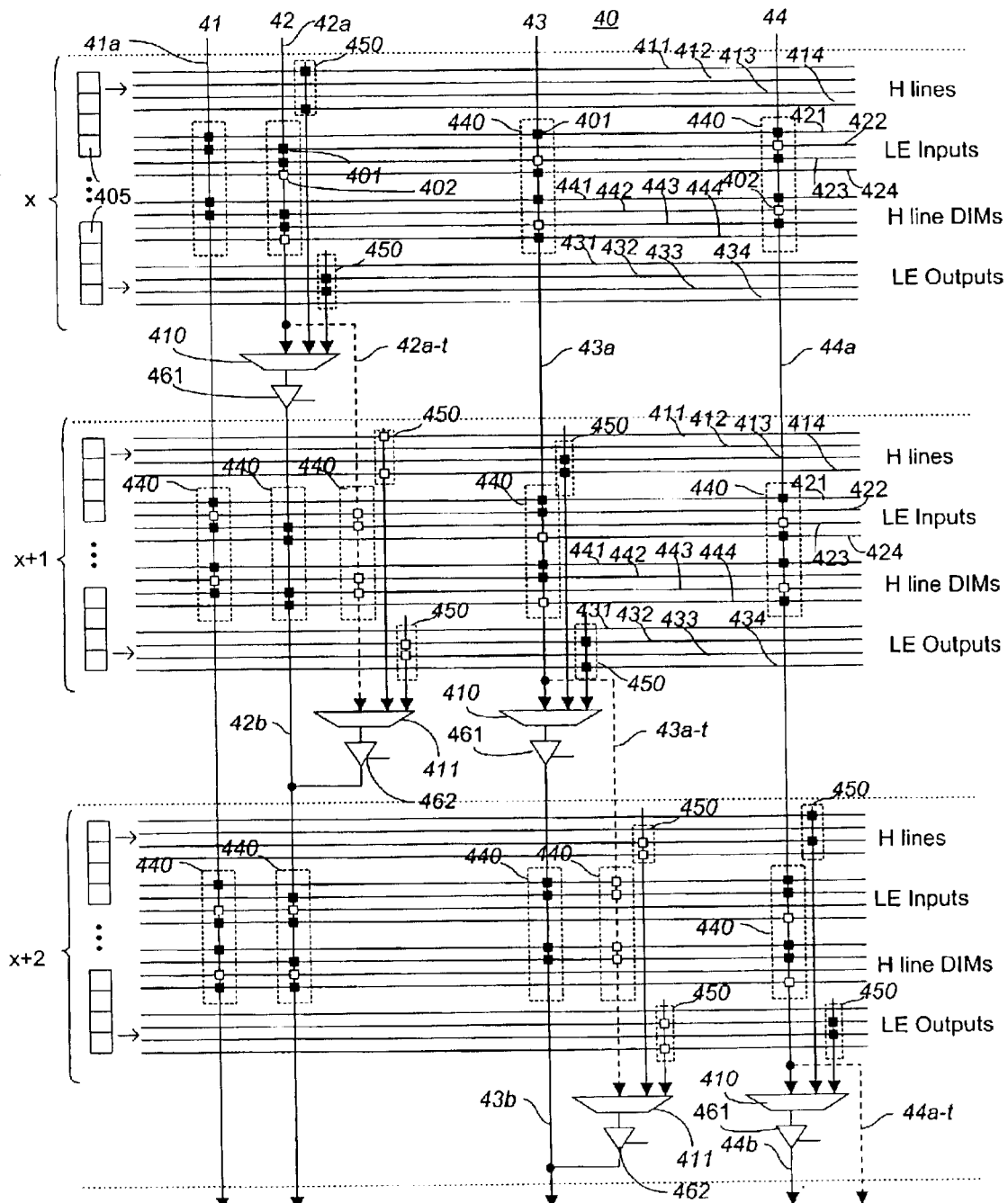
FIG. 4 illustrates three logic region rows in a column including a staggered segmented routing architecture and redundant circuitry in accordance with an aspect of the present invention.

FIG. 4 illustrates a routing architecture 40 with redundant circuitry that illustrates programmable routing in three logic region rows, row x, x+1, and x+2 in a logic region column. Each row illustrated shows the portion of a row associated with one of the logic array blocks (LABs) in that row (LABs not separately shown). Memory elements 405 hold programming data for each illustrated row. Four vertical signal paths, each spanning all three illustrated rows, are illustrated including vertical signal paths 41, 42, 43, and 44. Vertical signal path 41 includes line 41a; vertical signal path 42 includes line 42a, tail 42a–t, and line 42b; vertical signal path 43 includes line 43a, tail 43a–t, and line 43b; and vertical signal path 44 includes line 44a, tail 44a–t, and line 44b. For those signal paths illustrated having multiple lines, the lines of each signal path are stitched together by stitching circuitry or redundant stitching circuitry. Line 42a is stitched to line 42b by stitching circuitry including a stitching mux 410 and a stitching driver 461. Tail 42a–t is stitched to line 42b by redundant mux 411 and redundant stitching driver 462. Line 43a is stitched to line 43b by stitching circuitry including a stitching mux 410 and a stitching driver 461. Tail 43a–t is stitched to line 43b by redundant mux 411 and redundant stitching driver 462. Line 44a is stitched to line 44b by stitching circuitry including a stitching mux 410 and a stitching driver 461.

Routing resources are shown in general form for each row. Each row includes logic region routing resources including H-lines 411, 412, 413, 414, LE inputs 421, 422, 423, 424, H-line DIMs 441, 442, 443, and 444, and LE outputs 431, 432, 433, 444. Each distinct routing resource is represented by a horizontal line to simplify the drawing and allow better illustration of patterns of connections and redundant connections from row to row.

The routing resources and associated connections 401 and 402 coupling the routing resources to a particular vertical line include particular combinations of field programmable connections that may be programmed based on data in memory cells 405. For example, connections 401 and connections 402 to each routing resource are implemented as pass gates. Each LE input (421, 422, 423, and 424) represented is a particular LAB input mux (LIM). Before a signal actually reaches an individual LE, additional levels of muxing occur behind the LIMs in the form of LE input muxes (LEIMs) (LEIMs not separately shown). Each H-line DIM (441, 442, 443, and 444) represented is a particular driver input mux that connects to the H-line itself. An H-line driven by a one of the H-line DIMs may be one of the H lines 411, 412, 413, and 414, or may be different H-lines (different H-lines not separately shown). LE outputs 431, 432, 433, and 444 are coupled by connections 100 or 101 to a DIM (DIM not separately shown) for driving a line connected to drive a V-line through a stitching mux 410 or redundant stitching mux 411 as illustrated. These types of field programmable connections (i.e. muxes and pass gates) used in the illustrated embodiment are just examples of the types of connections that might be used to couple V-lines to the resources of a particular logic region row. For example, in alternative embodiments, connections to the resources of a particular row might represent various combinations of field re-programmable, hard-wired, fuse programmable, or other types of indirect or direct connections that may or may not include a tristate or other driver circuitry.

As shown, two types of groups of connections 401 and or 402 are shown. Groups 440 of connections 401 and 402 are coupled to drive signals from V-lines to routing resources of a logic region row. Groups 450 of connections 401 and 402 are coupled to drive signals from routing resources of a logic region row to particular V-lines. From row to row, patterns of connections 401 and/or 402 in a particular row provide redundancy for similar connections 401 in a preceding row. Each row illustrated, i.e., row x, x+1, and x+2 is a row above a spare row within a repairable region. When a redundant mode is engaged, row x+2 replaces row x+1, and row x+1 replaces row x. This will now be described in more detail.

Beginning with signal path 41, in row x, V-line 41a is coupled by connections 401 to LE inputs 421 and 422. Also in row x, V-line 41a is coupled by connections 401 to H-line DIMs 441 and 442.

In row x+1, V-line 41a is coupled: to an LE input 421 by a connection 401, to an LE input 422 by a connection 402, and to an LE input 423 by a connection 401. Note that the couplings by a connection 401 to an LE input 421 and by a connection 402 to an LE input 422, allow redundancy to be provided in row x+1 for the couplings of signal path 41 to LE inputs 421 and 422 by connection 401 in row x. Also, in row x+1, signal path 41 is coupled: to an H-line DIM 441 by a connection 401, to an H-line DIM 442 by a connection 402, and to an H-line DIM 443 by a connection 401. The couplings to H-line DIMs 441 and 442 provides redundancy for couplings by connections 401 to H-line DIMs 441 and 442 in row x.

In row x+2, V-line 41a is coupled: to an LE Input 421 by a connection 401, to an LE input 423 by a connection 402, and to an LE input 424 by a connection 401. Note that in row x+2, the coupling of signal path 41 to an LE input 421 by a connection 401 and to an LE input 423 by a connection 402 allow redundancy to be provided in row x+2 for the coupling of signal path 41 to LE inputs 421 and 423 by connections 401 in row x+1. Also, in row x+2, signal path 41 is coupled: to an H-line DIM 441 by a connection 401, to an H-line DIM 443 by a connection 402, and to an H-line DIM 444 by a connection 401. The coupling of signal path 41 to H-line DIMs 441 and 443 by connections 401 and 402 in row x+2 allows redundancy to be provided for couplings by connections 401 to H-line DIMs 441 and 443 in row x+1.

Now referring to signal path 42, in row x, line 42a of signal path 42 is coupled: to LE inputs 422 and 423 by connections 401 and to an LE input 424 by a connection 402. Also in row x, line 42a is coupled: to H-line DIMs 442 and 443 by connection 401 and to H-line DIM 444 by a connection 402. As previously described, line 42a is stitched to line 42b through mux 410 and driver 461. Further in row x, H lines 411 and 414 are coupled by connections 401 to provide signals to signal path 42 through stitching mux 410 and stitching driver 461 as shown. LE outputs 432 and 433 are coupled by connections 401 to provide signals to signal path 42 through stitching mux 410 and stitching driver 461 as shown.

Continuing with signal path 42, in row x+1, line 42b of signal path 42 is coupled to LE inputs 423 and 424 by connections 401. Tail 42a–t of signal line 42a is coupled to LE inputs 422 and 423 by connections 402. As previously described, tail 42a–t is stitched to line 42b through redundant stitching mux 420 and redundant stitching driver 462 as shown. When redundancy is engaged, the stitching driver 410 between rows x and x+1 is tri-stated and redundant stitching driver 462 is enabled. Connections 402 coupling tail 42a–t to LE inputs 422 and 423 and to H-line DIMs 442 and 443 in row x+1 provide redundancy for the couplings by connections 401 of line 42a to LE inputs 422 and 423 and to H-line DIMs 442 and 443 in row x. Further in row x+1, H lines 411 and 414 are coupled by connections 402 to provide signals to signal path 42 through redundant stitching mux 411 and redundant stitching driver 462. These couplings in row x+1 allow redundancy for the couplings of H lines 411 and 414 by connections 401 signal path 42 in row x. Also in row x+1, LE outputs 432 and 433 are coupled by connections 402 to provide signals to signal path 42 through redundant stitching mux 411 and redundant stitching driver 462 as shown. These couplings in row x+1 allow redundancy for the couplings of LE outputs 432 and 433 by connections 401 to signal path 42 in row x.

Continuing further with signal path 42, in row x+2, line 42b is coupled: to an LE input 422 by a connection 401, to an LE input 423 by a connection 402, and to an LE input 424 by a connection 401. Note that in row x+2, the coupling of signal path 42 to an LE input 423 by a connection 402 and to an LE input 424 by a connection 401 allow redundancy to be provided in row x+2 for the coupling of signal path 42 to LE inputs 423 and 424 by connections 401 in row x+1. Also, in row x+2, signal path 42 is coupled: to an H-line DIM 442 by a connection 401, to an H-line DIM 443 by a connection 402, and to an H-line DIM 444 by a connection 401. The coupling of signal path 42 to H-line DIMs 443 and 444 by connections 402 and 401 in row x+2 allows redundancy to be provided for couplings by connections 401 to H-line DIMs 443 and 444 in row x+1.

Now referring to signal path 43, in row x, line 43a of signal path 43 is coupled: to an LE input 421 by a connection 401, an LE input 423 by a connection 402, and an LE input and 424 by a connection 401. Also in row x, line 43*a* is coupled: to an H-line DIM 441 by a connection 401, to an H-line DIM 443 by a connection 402, and to an H-line DIM 444 by a connection 401.

Continuing with signal path 43, in row x+1, line 43*a* of signal path 43 is coupled: to LE inputs 421 and 422 by connections 401 and to an LE input and 424 by a connection 402. Note that in row x+2, the coupling of signal path 43 to an LE input 421 by a connection 401 and to an LE input 424 by a connection 402 allow redundancy to be provided in row x+2 for the coupling of signal path 43 to LE inputs 421 and 424 by connections 401 in row x+1. Also in row x+1, line 43*a* is coupled to H-line DIMs 441 and 442 by connections 401 and to an H-line DIM 444 by a connection 402. Note that in row x+2, the coupling of signal path 43 to an H-line DIM 441 by a connection 401 and to an H-line DIM 444 by a connection 402 allow redundancy to be provided in row x+2 for the coupling of signal path 43 to H-line DIMs 441 and 444 by connections 401 in row x+1.

Further in row x+1, H lines 413 and 414 are coupled by connections 401 to provide signals to signal path 43 through stitching a mux 410 and a stitching driver 461 as shown. LE outputs 432 and 434 are coupled by connections 401 to provide signals to signal path 43 through a stitching mux 410 and a stitching driver 461 as shown.

Continuing with signal path 43, in row x+2, line 43*b* of signal path 43 is coupled to LE inputs 421 and 422 by connections 401. Tail 43*a–t* of line 43*a* is coupled to LE inputs 421 and 422 by connections 402. As previously described, tail 43*a–t* is stitched to line 43*b* through redundant stitching mux 411 and redundant stitching driver 462 as shown. When redundancy is engaged, the stitching driver 461 between rows x+1 and x+2 is tri-stated and redundant stitching driver 462 on signal path 43 is enabled. Connections 402 coupling tail 43*a–t* to LE inputs 421 and 422 and to H-line DIMs 441 and 442 in row x+2 provide redundancy for the couplings by connections 401 of line 43*a* to LE inputs 421 and 422 and to H-line DIMs 441 and 442 in row x+1. Further in row x+2, H lines 413 and 414 are coupled by connections 402 to provide signals to signal path 43 through redundant stitching mux 411 and redundant stitching driver 462 as shown. These couplings in row x+2 allow redundancy for the couplings of H lines 413 and 414 by connections 401 to signal path 43 in row x+1.

Referring now to signal path 44, in row x, line 44*a* is coupled: to an LE input 421 by a connection 401, to an LE input 422 by a connection 402, and to an LE input 423 by a connection 401. Also in row x, V-line 44*a* is coupled: to an H-line DIM 441 by a connection 401, to an H-line DIM 442 by a connection 402, and to an H-line DIM 443 by a connection 440.

In row x+1, V-line 44*a* is coupled: to an LE input 421 by a connection 401, to an LE input 423 by a connection 402, and to an LE input 424 by a connection 401. Note that the couplings by a connection 401 to an LE input 421 and by a connection 402 to an LE input 423, allow redundancy to be provided in row x+1 for the couplings of signal path 44 to LE inputs 421 and 423 by connection 401 in row x. Also, in row x+1, signal path 44 is coupled: to an H-line DIM 441 by a connection 401, to an H-line DIM 443 by a connection 402, and to an H-line DIM 444 by a connection 401. The couplings of signal path 44 to H-line DIM 441 by a connection 401 and to H-line DIM 443 by a connection 402 in row x+1 provide redundancy for couplings of signal path 44 by connections 401 to H-line DIMs 441 and 443 in row x.

In row x+2, V-line 44*a* is coupled: to an LE Input 421 by a connection 401, to an LE input 422 by a connection 401, and to an LE input 424 by a connection 402. Note that in row x+2, the coupling of signal path 44 to an LE input 421 by a connection 401 and to an LE input 424 by a connection 402 allow redundancy to be provided in row x+2 for the coupling of signal path 44 to LE inputs 421 and 424 by connections 401 in row x+1. Also, in row x+2, signal path 44 is coupled: to an H-line DIM 441 by a connection 401, to an H-line DIM 442 by a connection 401, and to an H-line DIM 444 by a connection 402. The coupling of signal path 44 to an H-line DIM 441 by a connection 401 and to an H-line DIM 444 by connections 402 in row x+2 allows redundancy to be provided for couplings of signal path 44 by connections 401 to H-line DIMs 441 and 444 in row x+1. Further in row x+2, H lines 411 and 413 are coupled by connections 401 to provide signals to signal path 44 through stitching mux 410 and driver 461 as shown. Further in row x+2, LE outputs 432 and 433 are coupled by connections 401 to provide signals to signal path 44 through stitching mux 410 and driver 461 as shown. As already described, line 44*a* is stitched to line 44*b* as shown. Tail 44*a–t* provides a redundant path to the next row (next row not shown).

Signal paths 41–44 of the illustrated architecture 40 are "downstream" meaning that signals are driven in the same direction as the row shift direction for implementing a redundant mode. When redundancy is engaged, data for each row illustrated is shifted down so that row x is replaced by row x+1, and row x+1 is replaced by row X+2. In other words, the row shift direction for architecture 40 is down the page from row x to row x+1, to row X+2. Similarly, stitching muxes 410 and drivers 420 as well as redundant stitching muxes are coupled to drive signals down the respective vertical signal paths from row x to row x+1, to row X+2. Signal paths 41–44 are provided on a "bundle" of wires within a vertical channel. Architectures for providing redundancy on upstream bundles and on bundles that combine upstream and downstream paths are illustrated and described in subsequent figures and accompanying text (see FIGS. 7, 11–13 and accompanying text.).

Figure 5:
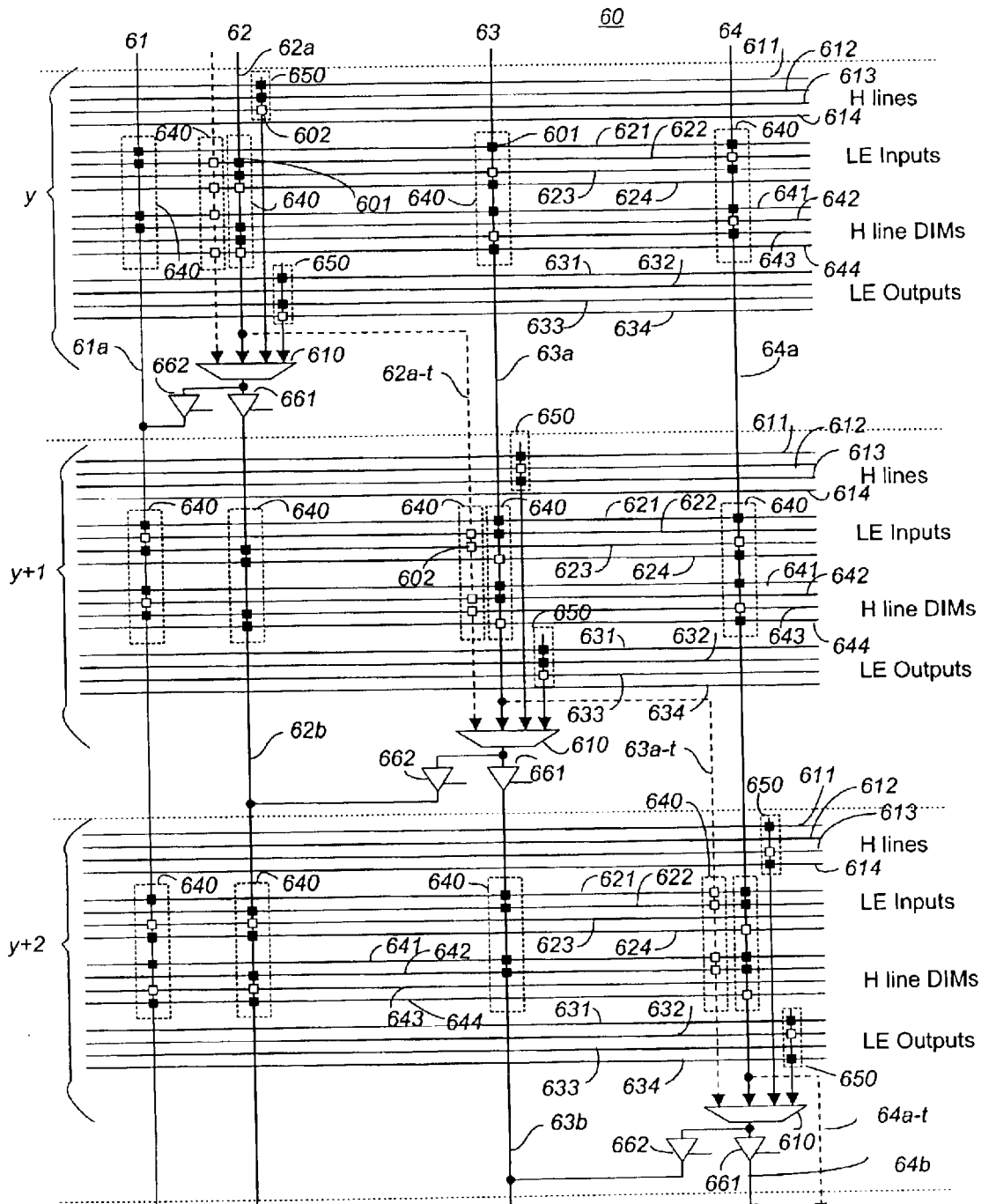
FIG. 5 illustrates an embodiment of another aspect of the present invention, the embodiment being an alternative to the embodiment illustrated in FIG. 4.

FIG. 5 illustrates a routing architecture 60 with redundant circuitry that illustrates programmable routing in three logic region rows, row y, y+1, and y+2 in a logic region column. Each row illustrated shows the portion of a row associated with one of the logic array blocks (LABs) in that row (LABs not separately shown). Four vertical signal paths, each spanning all three illustrated rows, are illustrated including vertical signal paths 61, 62, 63, and 64. Vertical signal path 61 includes line 61*a*; vertical signal path 62 includes line 62*a*, tail 62*a–t*, and line 62*b*; vertical signal path 63 includes line 63*a*, tail 63*a–t*, and line 63*b*; and vertical signal path 64 includes line 64*a*, tail 64*a–t*, and line 64*b*. For those signal paths illustrated having multiple lines, the lines of each signal path are stitched together by stitching circuitry or redundant stitching circuitry. Line 62*a* is stitched to line 62*b* by stitching circuitry including a stitching mux 610 and a stitching driver 661. Tail 62*a–t* is stitched to line 62*b* by a stitching mux 610 and redundant stitching driver 662. Line 63*a* is stitched to line 63*b* by stitching circuitry including a stitching mux 610 and a stitching driver 661. Tail 63*a–t* is stitched to line 63*b* by a stitching mux 610 and redundant stitching driver 662. Line 64*a* is stitched to line 64*b* by stitching circuitry including a stitching mux 610 and a stitching driver 661.

One aspect of the embodiment of FIG. 5 is that the "normal mode" stitching mux of one signal path is also the "redundant mode" stitching mux of another signal path. For example, notice that tail 62*a–t* (utilized in redundancy) is stitched to line 62*b* through the same stitching mux 610 that is part of the stitching circuitry stitching line 63*a* to line 63*b*.

As was the case in illustrating and describing architecture 40 of FIG. 4, in FIG. 5 illustrated architecture 60, routing resources are shown in general form for each row. Each row includes logic region routing resources including H-lines 611, 612, 613, 614, LE inputs 621, 622, 623, 624, H-line DIMs 641, 642, 643, and 644, and LE outputs 631, 632, 633, and 634. Each distinct routing resource is represented by a horizontal line to simplify the drawing and allow better illustration of patterns of connections and redundant connections from row to row.

As shown, two types of groups of connections 601 and/or 602 are shown. Groups 640 of connections 601 and 602 are coupled to provide signals from V-lines to routing resources of a logic region row. Groups 650 of connections 601 and 602 are coupled to provide signals from routing resources of a logic region row to particular V-lines. From row to row, patterns of connections 601 and/or 602 in a particular row, provide redundancy for similar connections 601 in a preceding row. Each row illustrated, i.e., row y, y+1, and y+2 is a row above a spare row within a repairable region. When a redundant mode is engaged, row y+2 replaces row y+1, and row y+1 replaces row y. This will now be described in more detail.

Beginning with signal path 61, in row y, V-line 61*a* is coupled by connections 601 to LE inputs 621 and 622. Also in row y, V-line 61*a* is coupled by connections 601 to H-line DIMs 641 and 642.

In row y+1, V-line 61*a* is coupled: to an LE input 621 by a connection 601, to an LE input 622 by a connection 602, and to an LE input 623 by a connection 601. The couplings by a connection 601 to an LE input 621 and by a connection 602 to an LE input 622 in row y+1 allow redundancy to be provided in row y+1 for the couplings of signal path 61 to LE inputs 621 and 622 by connections 601 in row y. Also, in row y+1, signal path 61 is coupled: to an H-line DIM 641 by a connection 601, to an H-line DIM 642 by a connection 602, and to an H-line DIM 643 by a connection 601. The couplings of signal path 61 to H-line DIMs 641 and 642 in row y+1 provide redundancy for the couplings by connections 601 to H-line DIMs 641 and 642 in row y.

In row y+2, V-line 61*a* is coupled: to an LE Input 621 by a connection 601, to an LE input 623 by a connection 602, and to an LE input 624 by a connection 601. The coupling of signal path 61 to an LE input 621 by a connection 601 and to an LE input 623 by a connection 602 in row y+2 allow redundancy to be provided for the coupling of signal path 61 to LE inputs 621 and 623 by connections 601 in row y+1. Also, in row y+2, signal path 61 is coupled: to an H-line DIM 641 by a connection 601, to an H-line DIM 643 by a connection 602, and to an H-line DIM 644 by a connection 601. The couplings of signal path 61 to H-line DIMs 641 and 643 by connections 601 and 602 in row y+2 allows redundancy to be provided in row y+2 for the couplings of signal path 61 by connections 601 to H-line DIMs 461 and 463 in row y+1.

Now referring to signal path 62, in row y, line 62*a* of signal path 62 is coupled: to LE inputs 622 and 623 by connections 601 and to an LE input 624 by a connection 602. Also in row y, line 62*a* is coupled to H-line DIMs 642 and 643 by connections 601 and to H-line DIM 644 by a connection 602. As previously described, line 62*a* is stitched to line 62*b* through stitching mux 610 and stitching driver 661. Further in row y, H lines 611 and 612 are coupled by connections 601 and an H line 613 by a connection 602 to provide signals to signal path 62 through stitching mux 610 and stitching driver 661 as shown. LE outputs 631 and 633 are coupled by connections 601 and an LE output 634 is coupled by a connection 602 to provide signals to signal path 62 through stitching mux 610 and stitching driver 661 as shown.

Continuing with signal path 62, in row y+1, line 62*b* of signal path 62 is coupled to LE inputs 623 and 624 by connections 601. Tail 62*a–t* of line 62*a* is coupled to LE inputs 622 and 623 and to H-line DIMs 642 and 643 by connections 602 As previously described, tail 62*a–t* is stitched to line 62*b* through stitching mux 610 and redundant stitching driver 662 as shown. When redundancy is engaged, the stitching driver 661 between rows y and y+1 is tristated and redundant stitching driver 662 between rows y+1 and y+2 is enabled. Connections 602 coupling tail 62*a–t* to LE inputs 622 and 623 and to H-line DIMs 642 and 643 in row y+1 provide redundancy for the couplings of V-line 62*a* by connections 601 to LE inputs 622 and 623 and to H-line DIMs 642 and 643 in row y. Additional redundancy connections in row y+1 for row y relevant to signal path 62 will be described subsequently in the context of describing signal path 63.

Continuing with signal path 62, in row y+2, line 62*b* is coupled: to an LE input 622 by a connection 601; to an LE input 623 by a connection 602; to an LE input 624 by a connection 601; to an H-line DIM 642 by a connection 601; to an H-line DIM 643 by a connection 602; and to an H-line DIM 644 by a connection 602. The couplings of line 62*b* to: an LE input 623 by a connection 602, an LE input 624 by a connection 602, an H-line DIM 643 by a connection 602 and an H-line DIM 644 by a connection 601 provide redundancy in row y+2 for couplings of line 62*b* to LE inputs 623 and 624 and H-line DIMs 643 and 644 by connections 601 in row y+1.

Now turning to signal path 63, in row y line 63*a* is coupled: to an LE input 621 by a connection 601; to an LE input 623 by a connection 602; to an LE input 624 by a connection 601; to an H-line DIMs 641 by a connection 601; to an H-line DIM 643 by a connection 602; and to an H-line DIM 644 by a connection 601.

Continuing with signal path 63, in row y+1, line 63*a* is coupled: to LE inputs 621 and 622 by connections 601; to an LE input 624 by a connection 602; to H-line DIMs 641 and 642 by connections 601; and to H-line DIM 644 by a connection 602. The coupling of line 63*a*: to an LE input 621 by a connection 601; to an LE input 624 by a connection 602; to an H-line DIM 641 by a connection 601; and to an H-line DIM 644 by a connection 602, all in row y+1, provide redundancy for the couplings of line 63*a* to LE inputs 621 and 624 and H-line DIMs 641 and 644 in row y.

Coupling the stitching mux 610 between rows y+1 and y+2 to both a stitching driver 661 for driving signal path 63 and a redundant stitching driver 662 for driving signal path 62 allows some of the illustrated connections 601 coupled for providing signals in normal mode from routing resources to signal path 63 in row y+1 to also provide redundant connections for certain connection coupled to provide signals to signal path 62 in row y. This will now be explained in further detail.

In row y+1, H lines 611 and 613 are coupled by connections 601 to provide signals in a "normal mode" operation to signal path 63 through stitching mux 610 and stitching driver 661 as shown. The coupling of H line 611 by connection 601 also provides "redundant mode" coupling to signal path 62 through stitching mux 610 and redundant driver 662 as shown; this coupling provides redundancy in row y+1 for the coupling of the H-line 611 to signal path 62 by connection 601 in row y. Also in row y+1, H line 612 is coupled by a connection 602 to provide signals in redundant mode operation to signal path 62 through stitching mux 610 and a redundant driver 662 as shown. This coupling provides redundancy in row y+1 for the coupling of the H-line 612 to signal path 62 by connection 601 in row y. Also in row y+1, LE outputs 631 and 632 are coupled by connections 601 to provide signals in a "normal mode" operation to signal path 63 through stitching mux 610 and stitching driver 661 as shown. The coupling of LE output 631 by connection 601 also provides "redundant mode" coupling to signal path 62 through stitching mux 610 and redundant driver 662 as shown; this coupling provides redundancy in row y+1 for the coupling of the LE output 631 to signal path 62 by connection 601 in row y. Also in row y+1, LE output 633 is coupled by a connection 602 to provide signals in redundant mode operation to signal path 62 through stitching mux 610 and a redundant driver 662 as shown. This coupling provides redundancy in row y+1 for the coupling of the LE output 633 to signal path 62 by connection 601 in row y.

Continuing with signal path 63, in row y+2, line 63b is coupled to LE inputs 621 and 622 and to H-line DIMs 641 and 642 by connections 601.

Now referring to signal path 64, in row y, line 64a of signal path 63 is coupled: to an LE input 621 by a connection 601, an LE input 622 by a connection 602, and an LE input and 623 by a connection 601. Also in row y, line 63a is coupled: to an H-line DIM 641 by a connection 601, to an H-line DIM 642 by a connection 602, and to an H-line DIM 643 by a connection 601.

Continuing with signal path 64, in row y+1, V-line 64a is coupled: to an LE input 621 by a connection 601, to an LE input 623 by a connection 602, and to an LE input 624 by a connection 601. Note that the couplings by a connection 601 to an LE input 621 and by a connection 602 to an LE input 623, allow redundancy to be provided in row y+1 for the couplings of signal path 64 to LE inputs 621 and 623 by connections 601 in row y. Also, in row y+1, signal path 64 is coupled: to an H-line DIM 641 by a connection 601, to an H-line DIM 643 by a connection 602, and to an H-line DIM 644 by a connection 601. The couplings of signal path 64 to H-line DIM 641 by a connection 601 and to H-line DIM 643 by a connection 602 in row y+1 provide redundancy for couplings of signal path 64 by connections 601 to H-line DIMs 641 and 643 in row y.

Continuing with signal path 64, in row y+2, V-line 64a is coupled: to an LE Input 621 by a connection 601, to an LE input 622 by a connection 601, and to an LE input 624 by a connection 602. Note that the coupling of signal path 64 to an LE input 621 by a connection 601 and to an LE input 624 by a connection 602 in row y+2 allow redundancy to be provided for the coupling of signal path 64 to LE inputs 621 and 624 by connections 601 in row y+1. Also, in row y+2, signal path 64 is coupled to H-line DIMs 641 and 642 by connections 601 and to an H-line DIM 644 by a connection 602. The coupling of signal path 64 to an H-line DIM 641 by a connection 601 and to an H-line DIM 644 by a connection 602 in row y+2 allows redundancy to be provided for couplings of signal path 64 by connections 601 to H-line DIMs 641 and 644 in row y+1.

Continuing with signal path 64, in row y+2, H lines 611 and 614 are coupled by connections 601 to provide signals in a "normal mode" operation to signal path 64 through stitching mux 610 and stitching driver 661 as shown. The coupling of H line 611 by connection 601 also provides "redundant mode" coupling to signal path 63 through stitching mux 610 and redundant driver 662 as shown; this coupling provides redundancy in row y+2 for the coupling of the H-line 611 to signal path 63 by connection 601 in row y+1. Also in row y+2, H line 613 is coupled by a connection 602 to provide signals in redundant mode operation to signal path 63 through stitching mux 610 and a redundant driver 662 as shown. This coupling provides redundancy in row y+2 for the coupling of the H-line 613 to signal path 63 by connection 601 in row y+1. Also in row y+2, LE outputs 631 and 634 are coupled by connections 601 to provide signals in a "normal mode" operation to signal path 64 through stitching mux 610 and stitching driver 661 as shown. The coupling of LE output 631 by connection 601 also provides "redundant mode" coupling to signal path 63 through stitching mux 610 and redundant driver 662 as shown; this coupling provides redundancy in row y+2 for the coupling of the LE output 631 to signal path 62 by connection 601 in row y+1. Also in row y+2, LE output 632 is coupled by a connection 602 to provide signals in redundant mode operation to signal path 63 through stitching mux 610 and a redundant driver 662 as shown. This coupling provides redundancy in row y+2 for the coupling of the LE output 632 to signal path 63 by connection 601 in row y+1.

The illustrated embodiments in FIGS. 4 and 5 show V-lines stitching from one to the other. In alternative embodiments, a particular V-line may stitch to multiple V-lines. The illustrated embodiments also show V-lines stitching from the lowest row before a tail in normal mode or from the tail in redundant mode. However, in alternative embodiments, a particular V-line might stitch to another from other positions on the V-line, such as, for example, the middle of the V-line. From the perspective of redundancy, a connection to another V-line may be viewed as similar to connections to other routing resources, such as the routing resources of a particular logic region. The term "stitching" as used herein thus is only meant to provide a convenient label for talking about switching connections between V-lines (i.e. connections coupling one V-line to another V-line), and the term is not meant to limit the way in which such connections might occur in other embodiments. It is also possible in alternative embodiments for a particular V-line not to stitch to and drive any other V-line. In such various alternatives, a tail might still be used to provide routing and connections over a portion of the V-line in redundant mode that is not used in normal mode. These various alternatives are relevant as alternatives to the illustrated embodiments regarding physical implementation (see, e.g., FIGS. 8–10 and accompanying text) as well as being relevant as alternatives to the more general diagrams illustrated in FIGS. 4 and 5.

Figure 6:
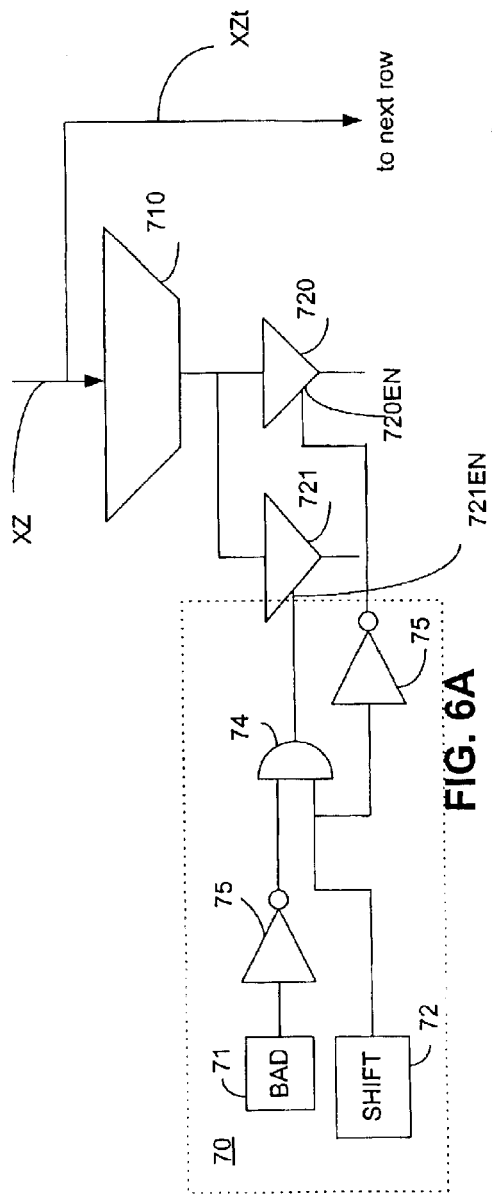
FIG. 6a illustrates an example of logic circuitry for enabling or not enabling the normal or redundant stitching drivers of embodiments of aspects of the present invention.
FIG. 6b is a table illustrating values for the two input signals of the logic circuitry of FIG. 6a when no defects exist.
FIG. 6c is a table illustrating values for the two input signals of the logic circuitry of FIG. 6a when a defect exists in each repairable region.
FIG. 6d is a table illustrating values of the two input signals of the logic circuitry of FIG. 6a when a defect exists in some but not all repairable regions.

FIG. 6A show an example of logic 70 that may be used to determine whether a stitching driver 720 (comparable to drivers 661 of the embodiment of FIG. 5) and redundant stitching driver 721 (comparable to drivers 621 of the embodiment of FIG. 5) should be enabled or turned off. As shown, stitching driver 720 and redundant stitching driver 721 are coupled to receive signals from the output of stitching mux 710 (comparable to stitching mux 610 of the embodiment of FIG. 5). Logic 70 includes BAD signal generator 71, SHIFT signal generator 72, AND gate 74, and inverters 75. A first inverter 75 is coupled to receive a BAD signal and provide inverted output to a first input of AND gate 74 as shown. A second inverter 75 and a second input of AND gate 74 are coupled to receive a SHIFT signal as shown. The second inverter 75 is coupled to provide an inverted output at an enable input 720EN of stitching driver 720 as shown. The AND gate 74 is coupled to provide its output to an enable input 721EN of redundant stitching driver 721 as shown.

When a high "1" is provided to an enable input 720EN or 721EN, the respective driver 720 or redundant driver 721 is turned on. When a low "0" is provided to enable input 720EN or 721EN, the respective driver 720 or redundant driver 721 is tristated.

BAD signal generator 71 and SHIFT signal generator 72 are implemented as configuration elements holding either a high or low value. Thus, these configuration elements are receptively coupled to the respective driver 720 and redundant driver 721 through the remaining elements of logic 70. Those skilled in the art will recognize that logic 70 is just one example of logic that may be utilize to selectively enable or not enable a respective driver and redundant driver. Furthermore, those skilled in the art will recognize that in alternative embodiments, configuration elements may be coupled to respective stitching drivers and redundant stitching drivers without the use of intervening logic circuitry. In such embodiments, configuration data will need to account for whether or not a row is a spare row, below a spare row, is a bad row, or is between a bad row and a spare row.

FIGS. 6B, 6C, and 6D are tables showing the values of BAD and SHIFT signals provided by signal generators 71 and 72, respectively. As illustrated in FIG. 6B, in a perfect part, in an "GOOD" row (i.e., a row that have not been defined as defective), a stitching driver 720 is turned on and a redundant driver 721 is tristated. This is accomplished as shown by providing low "SHIFT" and "BAD" signals. In a perfect part, redundancy is not engaged and spare rows are bypassed with both stitching driver 720 and redundant stitching driver 721 being tristated. This is accomplished by providing high SHIFT and BAD signals (note that if SHIFT is low, redundant driver 721 is tristated whether or not BAD is also low). In a spare row with stitching driver 720 and redundant stitching driver 662 tristated, although any signal provided on V-line XZ is not passed through that row's stitching circuitry, such signals are provided by tail XZt to a subsequent row.

FIG. 6C illustrates BAD rows in each repairable region. A first repairable region exists above row r3. A second repairable region exists above row r6. In both repairable regions, a BAD row exists, thus redundancy is engaged for at least part of both regions. In FIG. 6C, rows r2 and r4 are bad. Row r1 is a good row. Because row r1 is above BAD row r2 in the repairable region defined above row r3, row shifting for redundancy does not need to be engaged for row r1. Thus, in GOOD row r1, a stitching driver 720 is enabled and a redundant stitching driver 721 is tristated by providing low SHIFT and BAD signals. Row r2 is a bad row needing to be bypassed, thus both stitching driver 720 and redundant stitching driver 721 for that row are tristated by providing high SHIFT and BAD signals. SPARE row r3 is utilized to replace row r2, and in row r3 redundant stitching driver 721 is enabled and stitching driver 720 is tristated by providing a high SHIFT signal and low BAD signal. Row r4 is bad and is bypassed in the same manner indicated for row r2. Row r5 is good. Row r5 is below BAD row r4, and with redundancy engaged GOOD row r5 replaces BAD row r4 with stitching driver 720 tristated and redundant driver 721 turned on for row r5, which is accomplished by providing a high SHIFT signal and low BAD signal. SPARE row r6 replaces row r5, and a stitching driver 720 is tristated and redundant stitching driver 721 is enabled.

FIG. 6D illustrates a bad row in only some but not all of the repairable regions. As in FIG. 6C, two repairable regions are defined, a first above row r3 and a second above row r6. Also as in FIG. 6C, row r2 is bad. Rows r1, r2, and r3 of are treated the same regarding SHIFT and BAD signaling in FIG. 6D as in FIG. 6C. However, in the repairable region above row r6 and below row r3, no BAD row exists. Thus, rows r4, r5, and r6 are treated the same regarding SHIFT and BAD signaling in FIG. 6D as in FIG. 6B, which defined a part without defects.

Figure 7:
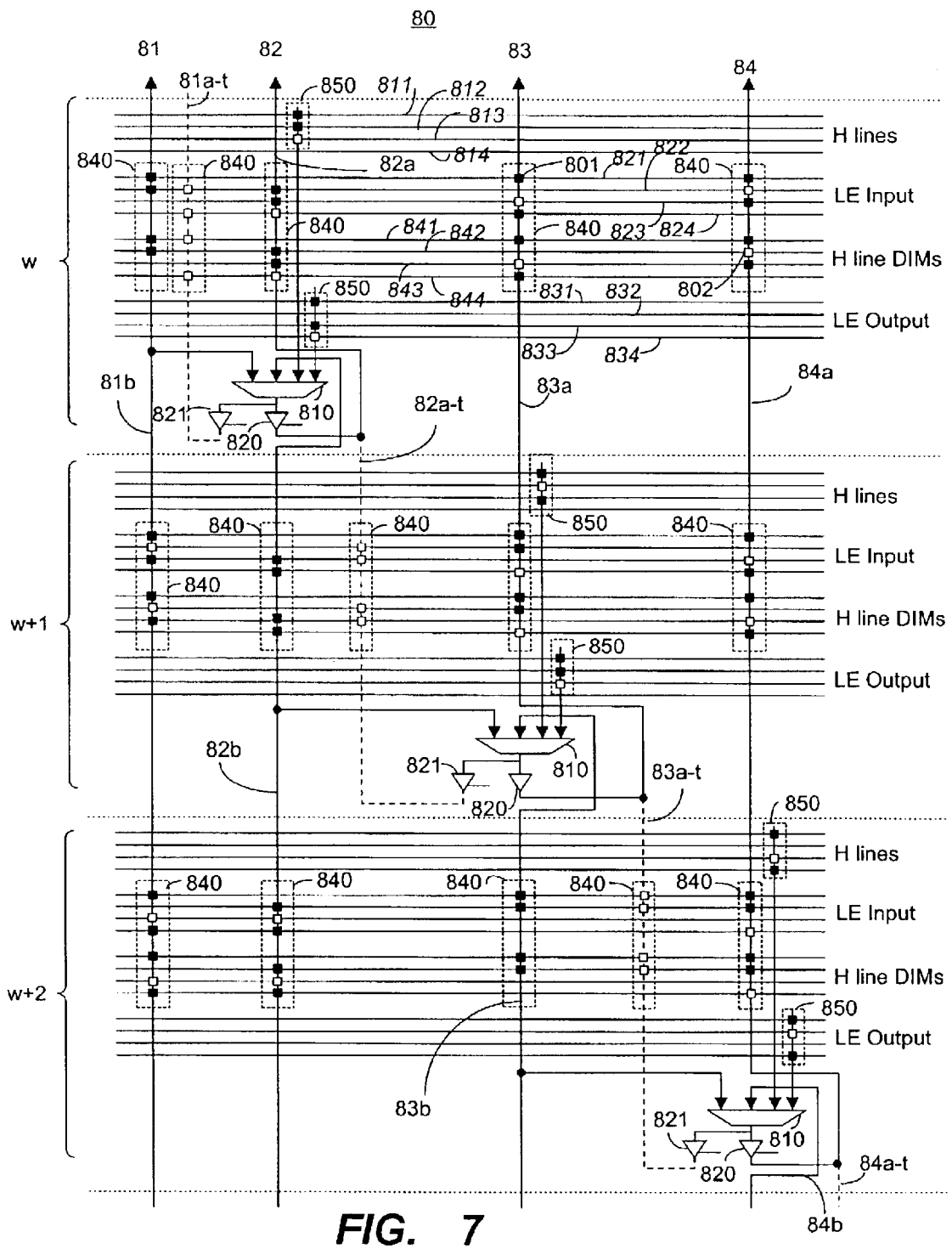
FIG. 7 illustrates another embodiment of an aspect of the present invention implemented on signal paths that drive signals upstream against a row shift direction.

FIG. 7 illustrates upstream wires and associated circuitry providing signal paths in a routing architecture portion 80 with redundant circuitry. The wires and associated circuitry provide signal paths in architecture portion 80 that are driven against a row shift direction. FIG. 7 illustrates programmable routing in three logic region rows: w, w+1, and w+2 in a logic region column. Although signals are driven up the page, the row shift direction when a redundant mode is engaged is down the page. Each row illustrated shows the portion of a row associated with one of the logic array blocks (LABs) in that row (LABs not separately shown).

Four vertical signal paths, each spanning all three illustrated rows, are shown including vertical signal paths 81, 82, 83, and 84, each signal path including a plurality of vertical lines. Vertical signal path 81 includes line 81b and tail 81a–t; vertical signal path 82 includes line 82a, tail 82a–t, and line 82b; vertical signal path 83 includes line 83a, tail 83a–t, and line 83b; and vertical signal path 84 includes line 84a, and line 84b. For those signal paths illustrated having multiple lines, the lines of each signal path are stitched together by stitching circuitry or redundant stitching circuitry. Stitching connections will be described from bottom to top of the architecture portion 80 as the lines drive signals upstream. Line 81b is stitched to tail 81a–t by a mux 810 and a redundant driver 821 (mux and driver between rows w and w+1) as shown. Line 82b is stitched to line 82a by stitching circuitry including a stitching mux 810 and a stitching driver 820 as shown. Line 82b is also stitched to tail 82a–t by a stitching mux 810 and a redundant stitching driver 821 (mux and redundant driver between rows w+1 and w+2) as shown. Line 83b is stitched to line 83a by stitching circuitry including a stitching mux 810 and a stitching driver 820 (mux and driver between rows w+1 and w+2) as shown. Line 83b is also stitched to tail 83a–t by stitching circuitry including a stitching mux 810 and a redundant stitching driver 821 (mux and redundant driver at bottom of row w+2) as shown. Line 84b is stitched to line 84a by stitching circuitry including a stitching mux 810 and a stitching driver 820 (mux and driver at bottom or row w+2) as shown.

Similar to an aspect discussed of the embodiment of FIG. 5, one aspect of the embodiment of FIG. 7 is that the "normal mode" stitching mux of one signal path is also the "redundant mode" stitching mux of another signal path. For example, referring to the stitching circuitry illustrated between rows w+1 and w+2, tail 82a–t (utilized in redundancy) is stitched to receive signals from line 82b via a redundant driver 821 through the same stitching mux 810 that is used to couple line 83b to line 83a via normal mode driver 820.

As was the case in illustrating and describing architecture 40 of FIG. 4, and architecture 60 of FIG. 5, in FIG. 7 illustrated architecture 80, routing resources are shown in general form for each row. Each row includes logic region routing resources including H-lines 811, 812, 813, 814, LE inputs 821, 822, 823, 824, H-line DIMs 841, 842, 843, and 844, and LE outputs 831, 832, 833, and 834 (numbering shown separately only for row w). Each distinct routing resource is represented by a horizontal line to simplify the drawing and allow better illustration of patterns of connections and redundant connections from row to row.

As shown, two types of groups of connections 801 and/or 802 are shown. Groups 840 of connections 801 and/or 802 are coupled to provide signals from V-lines to routing resources of a logic region row. Groups 850 of connections 801 and 802 are coupled to provide signals from routing resources of a logic region row to particular V-lines. From row to row, patterns of connections 801 and/or 802 in a particular row, provide redundancy for similar connections 801 in a preceding row. Each row illustrated, i.e., row w, w+1, and w+2 is a row above a spare row within a repairable region. When a redundant mode is engaged, row w+2 replaces row w+1, and row w+1 replaces row w. This will now be described in more detail.

Beginning with signal path 81, in row w, V-line 81b is coupled by connections 801 to LE inputs 821 and 822. Also in row w, V-line 81b is coupled by connections 801 to H-line DIMs 841 and 842.

In row w+1, V-line 81b is coupled: to an LE input 821 by a connection 801, to an LE input 822 by a connection 802, and to an LE input 823 by a connection 801. The couplings by a connection 801 to an LE input 821 and by a connection 802 to an LE input 822 in row w+1 allow redundancy to be provided in row w+1 for the couplings of signal path 81 to LE inputs 821 and 822 by connections 801 in row w. Also, in row w+1, signal path 81 is coupled: to an H-line DIM 841 by a connection 801, to an H-line DIM 842 by a connection 802, and to an H-line DIM 843 by a connection 801. The couplings of signal path 81 to H-line DIMs 841 (a connection 801) and 842 (a connection 802) in row w+1 provide redundancy for the couplings by connections 801 to H-line DIMs 841 and 842 in row w.

In row w+2, V-line 81b is coupled: to an LE Input 821 by a connection 801, to an LE input 823 by a connection 802, and to an LE input 824 by a connection 801. The coupling of signal path 81 to an LE input 821 by a connection 801 and to an LE input 823 by a connection 802 in row w+2 allow redundancy to be provided for the coupling of signal path 81 to LE inputs 821 and 823 by connections 801 in row w+1. Also, in row w+2, signal path 81 is coupled: to an H-line DIM 841 by a connection 801, to an H-line DIM 843 by a connection 802, and to an H-line DIM 844 by a connection 801. The couplings of signal path 81 to H-line DIMs 841 and 843 by connections 801 and 802 in row w+2 allow redundancy to be provided in row w+2 for the couplings of signal path 81 by connections 801 to H-line DIMs 841 and 843 in row w+1.

Now referring to signal path 82, in row w, line 82a of signal path 82 is coupled: to LE inputs 822 and 823 by connections 801 and to an LE input 824 by a connection 802. Also in row w, line 82a is coupled to H-line DIMs 842 and 843 by connections 801 and to H-line DIM 844 by a connection 802. As previously described, line 82b is stitched to line 82a through stitching a mux 810 and a stitching driver 820 as shown. Further in row w, H lines 811 and 812 are coupled by connections 801 and an H line 813 is coupled by a connection 802 to provide signals to signal path 82 (driving onto line 82a) through stitching mux 810 and stitching driver 820 as shown. LE outputs 831 and 833 are coupled by connections 801 and an LE output 834 is coupled by a connection 802 to provide signals to signal path 82 (driving onto line 82a) through stitching mux 810 and stitching driver 820 as shown.

Continuing with signal path 82, in row w+1, line 82b of signal path 82 is coupled to LE inputs 823 and 824 by connections 801. Tail 82a–t of line 82a is coupled to LE inputs 822 and 823 and to H-line DIMs 832 and 833 by connections 802. As previously described, line 82b stitches to tail 82a–t through stitching mux 810 and redundant stitching driver 821 as shown. When redundancy is engaged, the stitching driver 820 between rows w and w+1 is tri-stated and redundant stitching driver 821 between rows w+1 and w+2 is enabled. Line 82a thus becomes driven in redundancy from the bottom of row w+1 through tail 82a–t rather than from the bottom of row w as in normal mode operation. Connections 802 coupling tail 82a–t to LE inputs 822 and 823 and to H-line DIMs 842 and 843 in row w+1 provide redundancy for the couplings of V-line 82a by connections 801 to LE inputs 822 and 823 and to H-line DIMs 842 and 843 in row w. Additional redundancy connections in row w+1 for row w relevant to signal path 82 will be described subsequently in the context of describing signal path 83.

Continuing with signal path 82, in row w+2, line 82b is coupled: to an LE input 822 by a connection 801; to an LE input 823 by a connection 802; to an LE input 824 by a connection 801; to an H-line DIM 842 by a connection 801; to an H-line DIM 843 by a connection 802; and to an H-line DIM 844 by a connection 801. The couplings of line 82b to: an LE input 823 by a connection 802, an LE input 824 by a connection 801, an H-line DIM 843 by a connection 802 and an H-line DIM 844 by a connection 801 provide redundancy in row w+2 for couplings of line 82b by connections 801 to LE inputs 823 and 824 and H-line DIMs 843 and 844 in row w+1.

Now turning to signal path 83, in row w line 83a is coupled: to an LE input 821 by a connection 801; to an LE input 823 by a connection 802; to an LE input 824 by a connection 801; to an H-line DIM 841 by a connection 801; to an H-line DIM 843 by a connection 802; and to an H-line DIM 844 by a connection 801.

Continuing with signal path 83, in row w+1, line 83a is coupled: to LE inputs 821 and 822 by connections 801; to an LE input 824 by a connection 802; to H-line DIMs 841 and 842 by connections 801; and to H-line DIM 844 by a connection 802. The coupling of line 83a: to an LE input 821 by a connection 801; to an LE input 824 by a connection 802; to an H-line DIM 841 by a connection 801; and to an H-line DIM 844 by a connection 802, all in row w+1, provide redundancy for the couplings of line 83a to LE inputs 821 and 824 and H-line DIMs 841 and 844 in row w.

Coupling the stitching mux 810 between rows w+1 and w+2 to both a stitching driver 820 for driving signal path 83 and a redundant stitching driver 821 for driving signal path 82 allows some of the illustrated connections 801 coupled for providing signals in normal mode from routing resources to signal path 83 in row w+1 to also provide redundant connections for certain connections coupled to provide signals to signal path 82 in row w. This will now be explained in further detail.

In row w+1, H lines 811 and 813 are coupled by connections 801 to provide signals in a normal mode operation to signal path 83 (driving onto line 83a) through stitching mux 810 and stitching driver 820 as shown. The coupling of H line 811 by connection 801 also provides redundant mode coupling to signal path 82 through stitching mux 810 and redundant driver 821 driving onto line 82a through tail 82a–t as shown; this coupling provides redundancy in row w+1 for the coupling of the H-line 811 to signal path 82 by connection 801 in row w. Also in row w+1, H line 812 is coupled by a connection 802 to provide signals in redundant mode operation to signal path 82 through stitching mux 810 and a redundant driver 821 driving onto line 82a through tail 82a–t as shown. This coupling provides redundancy in row w+1 for the coupling of the H-line 812 to signal path 82 by connection 801 in row w. Also in row w+1, LE outputs 831 and 832 are coupled by connections 801 to provide signals in a normal mode operation to signal path 83 through stitching mux 810 and stitching driver 820 driving onto line 83a as shown. The coupling of LE output 831 by connection 801 also provides redundant mode coupling to signal path 82 through stitching mux 810 and redundant driver 821 driving onto line 82a through tail 82a–t as shown; this coupling provides redundancy in row w+1 for the coupling of the LE output 831 to signal path 82 by connection 801 in row w. Also in row w+1, LE output 833 is coupled by a connection 802 to provide signals in redundant mode operation to signal path 82 through a stitching mux 810 and a redundant driver 821 as shown. This coupling provides redundancy in row w+1 for the coupling of the LE output 833 to signal path 82 by connection 801 in row w.

Continuing with signal path 83, in row w+2, line 83b is coupled to LE inputs 821 and 822 and to H-line DIMs 841 and 842 by connections 801. These couplings provide redundancy for like coupling by connections 801 in row w+1.

Now referring to signal path 84, in row w, line 84a of signal path 84 is coupled: to an LE input 821 by a connection 801, an LE input 822 by a connection 802, and an LE input 823 by a connection 801. Also in row w, line 83a is coupled: to an H-line DIM 841 by a connection 801, to an H-line DIM 842 by a connection 802, and to an H-line DIM 843 by a connection 801.

Continuing with signal path 84, in row w+1, V-line 84a is coupled: to an LE input 821 by a connection 801, to an LE input 823 by a connection 802, and to an LE input 824 by a connection 801. Note that the couplings by a connection 801 to an LE input 821 and by a connection 802 to an LE input 823, allow redundancy to be provided in row w+1 for the couplings of signal path 84 to LE inputs 821 and 823 by connections 801 in row w. Also, in row w+1, signal path 84 is coupled: to an H-line DIM 841 by a connection 801, to an H-line DIM 843 by a connection 802, and to an H-line DIM 844 by a connection 801. The couplings of signal path 84 to H-line DIM 841 by a connection 801 and to H-line DIM 843 by a connection 802 in row w+1 provide redundancy for couplings of signal path 84 by connections 801 to H-line DIMs 841 and 843 in row w.

Continuing with signal path 84, in row w+2, V-line 84a is coupled: to an LE Input 821 by a connection 801, to an LE input 822 by a connection 801, and to an LE input 824 by a connection 802. Note that the coupling of signal path 84 to an LE input 821 by a connection 801 and to an LE input 824 by a connection 802 in row w+2 allow redundancy to be provided for the coupling of signal path 84 to LE inputs 821 and 824 by connections 801 in row w+1. Also, in row w+2, signal path 84 is coupled to H-line DIMs 841 and 842 by connections 801 and to an H-line DIM 844 by a connection 802. The coupling of signal path 84 to an H-line DIM 841 by a connection 801 and to an H-line DIM 844 by a connection 802 in row w+2 allows redundancy to be provided for couplings of signal path 84 by connections 801 to H-line DIMs 841 and 844 in row w+1.

Continuing with signal path 84, in row w+2, H lines 811 and 814 are coupled by connections 801 to provide signals in a normal mode operation to signal path 84 through stitching mux 810 and stitching driver 820 driving onto line 84a as shown. The coupling of H line 811 by connection 801 also provides redundant mode coupling to signal path 83 through stitching mux 810 and redundant driver 821 driving onto line 83a through tail 83a–t as shown; this coupling provides redundancy in row w+2 for the coupling of the H-line 811 to signal path 83 by connection 801 in row w+1. Also in row w+2, H line 813 is coupled by a connection 802 to provide signals in redundant mode operation to signal path 83 through stitching mux 810 and a redundant driver 821 driving line 83a through tail 83a–t as shown. This coupling provides redundancy in row w+2 for the coupling of the H-line 813 to signal path 83 by connection 801 in row w+1. Also in row w+2, LE outputs 831 and 834 are coupled by connections 801 to provide signals in a normal mode operation to signal path 84 through stitching mux 810 and stitching driver 820 driving line 84a as shown. The coupling of LE output 831 by connection 801 also provides redundant mode coupling to signal path 83 through stitching mux 810 and redundant driver 821 driving line 83a through tail 83a–t as shown; this coupling provides redundancy in row w+2 for the coupling of the LE output 831 to signal path 83 by connection 801 in row w+1. Also in row w+2, LE output 832 is coupled by a connection 802 to provide signals in redundant mode operation to signal path 83 through stitching mux 810 and a redundant driver 821 as shown. This coupling provides redundancy in row w+2 for the coupling of the LE output 832 to signal path 83 by connection 801 in row w+1.

Figure 8:
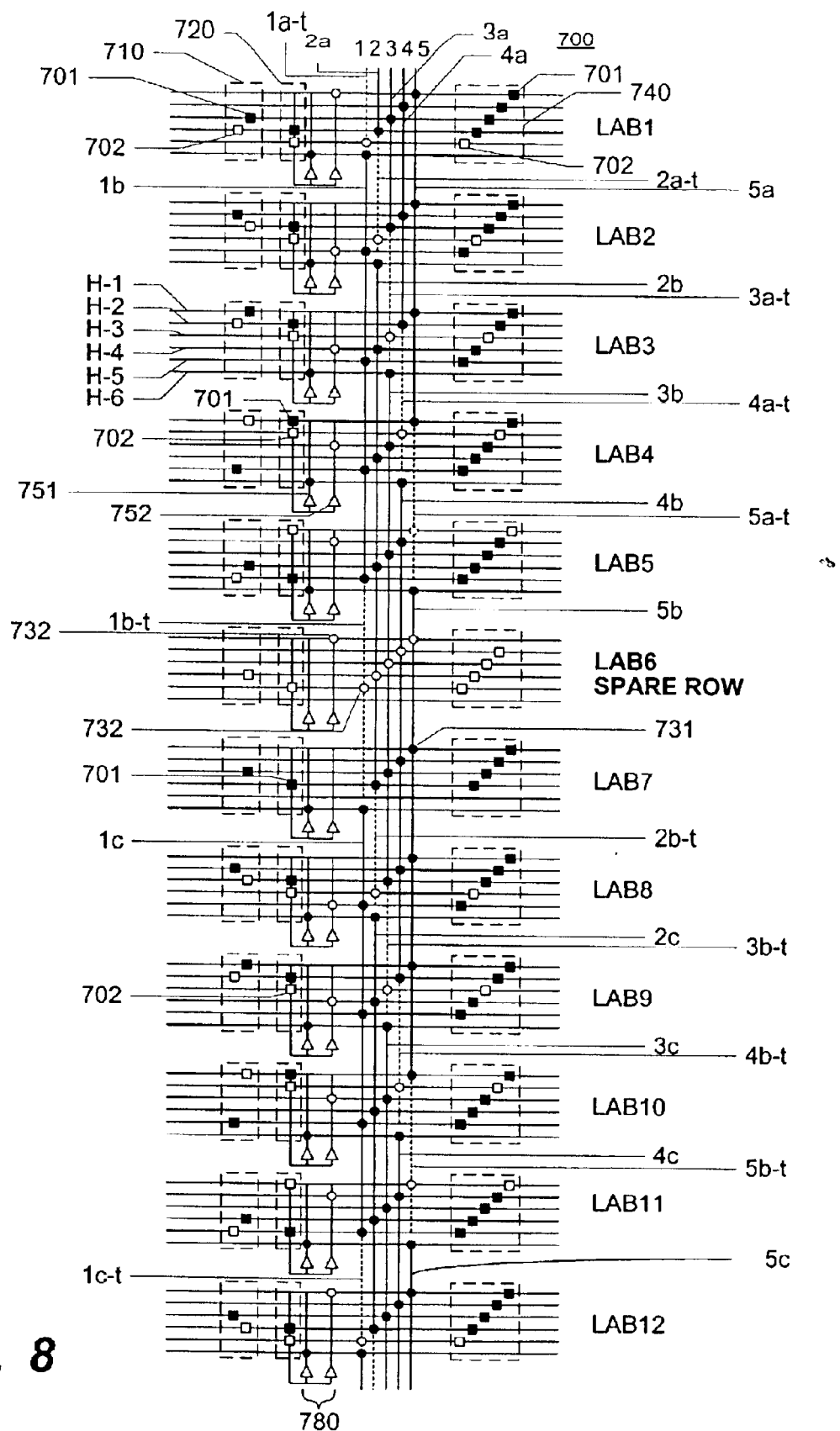
FIG. 8 illustrates a portion of several rows within a programmable logic device including a spare row, the portion including multiple physical tracks and being in accordance with aspects of the present invention.
Figure 9:
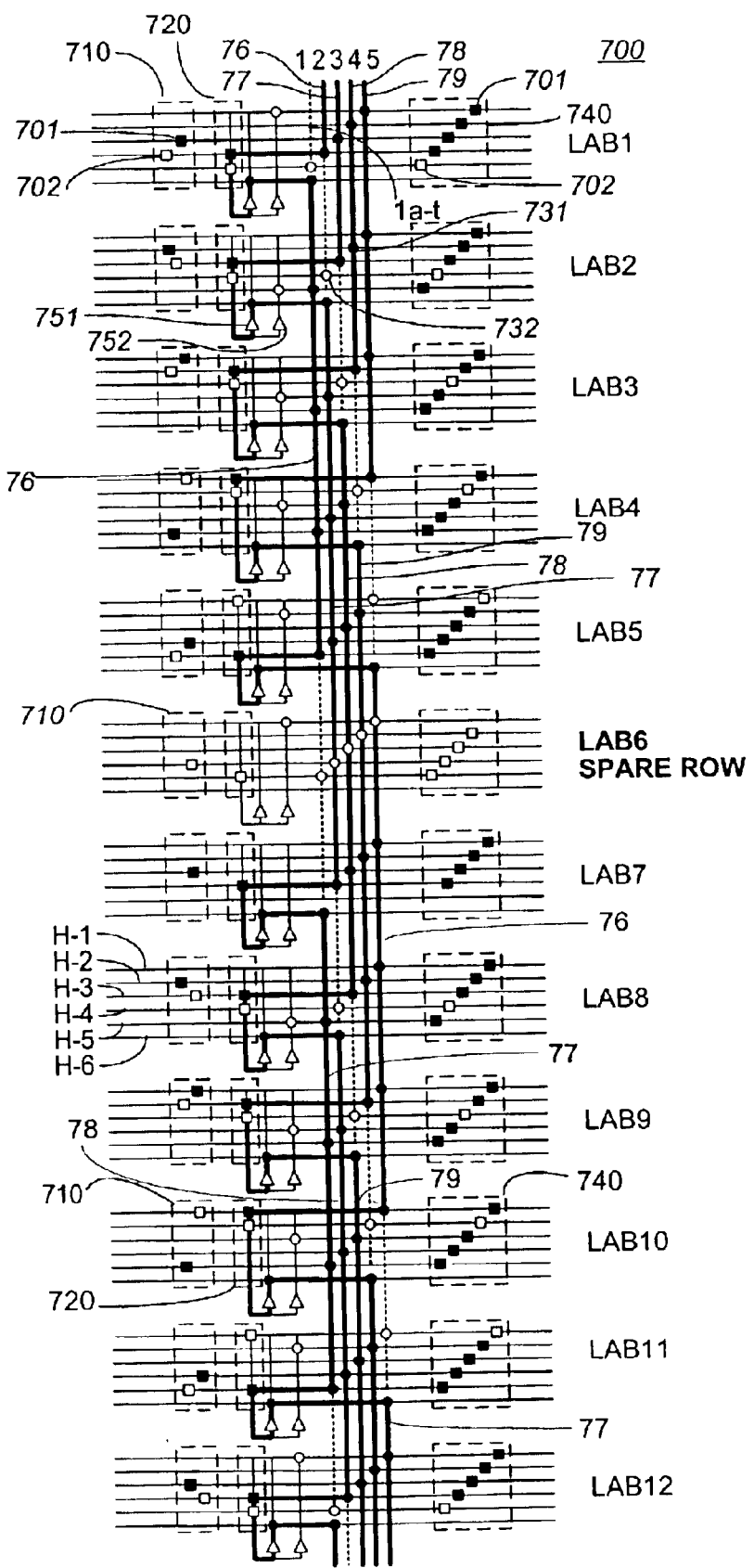
FIG. 9 illustrates signal paths that may be accommodated on the tracks of the portion of FIG. 8 when the programmable logic device is configured for normal mode operation.
Figure 10:
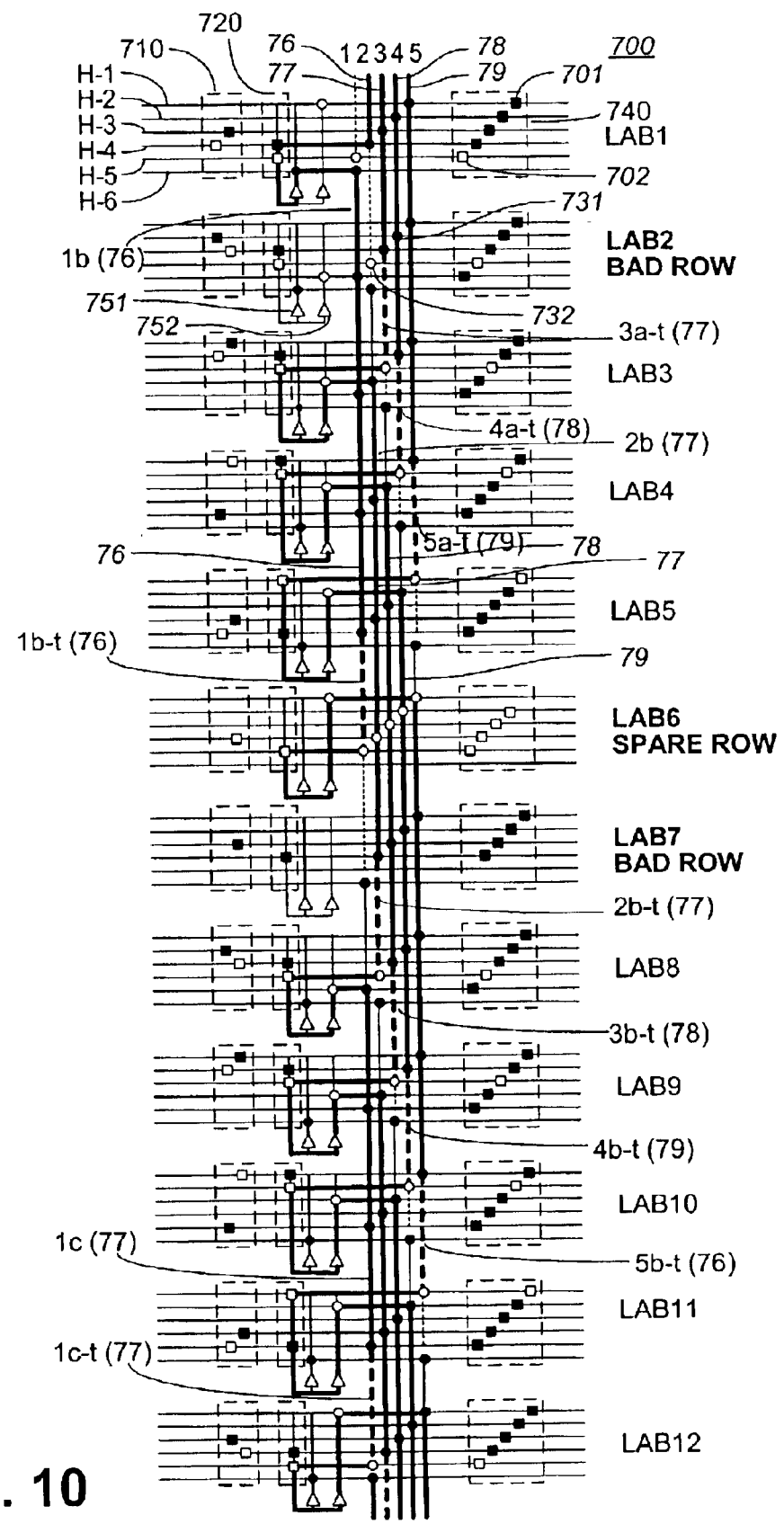
FIG. 10 illustrates the portion of FIG. 8 when the programmable logic device is configured to bypass a bad row and utilize redundant circuitry to provide redundant mode signal paths corresponding to the normal mode signal paths of FIG. 9.

FIGS. 8–10 illustrates a portion 700 including multiple rows in a PLD. The portion 700 includes 12 rows of LABs, rows LAB1–LAB12.

In fabricating a device, it is generally most efficient within the requirements of diffusion processes to provide drivers in somewhat proximate positions. Thus, as illustrated in FIG. 8, portion 700 provides stitching drivers 751 and redundant stitching drivers 752 in a vertical column 780 of drivers 751 and 752.

Further referring to FIG. 8, portion 700 further includes vertical tracks 1, 2, 3, 4, and 5. Each track includes a plurality of individual wires or V-lines. As shown, from top to bottom of FIG. 8, track 1 includes V-line tail 1a–t, V-line 1b and tail 1b–t, and V-line 1c and tail 1c–t. Track 2 includes V-line 2a and tail 2a–t, V-line 2b and tail 2b–t, and V-line 2c. Track 3 includes V-line 3a and tail 3a–t, V-line 3b and tail 3b–t, and V-line 3c. Track 4 includes V-line 4a and tail 4a–t, V-line 4b and tail 4b–t, and V-line 4c. Track 5 includes V-line 5a and tail 5a–t, V-line 5b and tail 5b–t, and V-line 5c.

In the illustrated embodiment, each tail is part of the same wire as its associated V-line and is simply that portion of the wire not used during normal mode operation (e.g. tail 3a–t is part of the same wire that provides V-line 3a). However, in alternative embodiments, such a tail may be provided on a different wire than the wire providing the associated V-line (e.g., a wire coupled to the V-line wire) without necessarily departing from the spirit and scope of other aspects of the present invention.

Portion 700 further includes horizontal stubs H-1, H-2, H-3, H-4, H-5, and H-6. Connections 731 and 732 couple V-lines to horizontal stubs as indicated and also couple driver outputs to horizontal stubs as indicated.

Portion 700 further includes groups 710, 720, and 740 of connections 701 and 702. Groups 710 include connections 701 and 702 to DIMs for driving H-lines (H-line DIMs, associated drivers, and H-lines not separately shown), groups 720 include connections 701 and 702 for stitching between V-lines through DIMs and drivers 751 or 752 (V-line DIMs not separately shown), and groups 740 include connections 701 and 702 to LIMs for routing to LEs (LIMs and LEs not separately shown). Regarding groups 720, for those rows in which the group 720 has both a connection 701 and a connection 702, those connections connect from respective stubs and provide different inputs of the same V-line DIM (remainder of V-line DIMs not separately shown) and the output of that V-line DIM connects to both a driver 751 and a redundant driver 752. This is similar to the principle illustrated and described in regard to the muxes 610 of FIG. 5 under which, for those rows that are illustrated in FIG. 5, a mux 610 receives inputs from both the normal mode portion of one signal path and a redundant mode portion of another signal path. Note that one way to implement a mux is as a collection of pass gates coupled to a common output and programmable to be on or off based on data in configuration elements—in the case of a one-output mux, only one pass gate is programmed to be "on" at any given time. In this illustrated example, other pass gates connected to the drivers 751 and 752 are not separately shown As illustrated in FIGS. 8–10, the patterns of normal mode connections 701 and redundant mode connections 702 generally provide redundancy for connections 701 from row to row. For example, considering the pattern of connections in LIM groups 740 in rows LAB2 and LAB3 as illustrated in FIG. 8: In row LAB2, connections 701 provide LIM connections coupled to V-lines 1$b$, 3$a$, 4$a$, and 5$a$ by, respectively, stubs H-5, H-3, H-2, and H-1 of row LAB2 via connections 731 as shown. In row LAB3, connections 701 and a connection 702 provide LIM connections (group 740) that can become redundant for the connections 701 to LIMs in row LAB2. In particular, in row LAB3, connections 701 and a connection 702 provide redundant LIM connections coupled to V-line 1$b$ (a connection 701), tail 3$a$–$t$ (a connection 702), V-line 4$a$ (a connection 701), and V-line 5$a$ (a connection 701), by, respectively, stubs H-5, H-3, H-2, and H-1 of row LAB3 via connections 731 and a connection 732 as shown. These row LAB3 LIM connections can be used in a redundant mode to replace the row LAB2 LIM connections just described.

In similar fashion, considering the pattern of connections in DIM groups 710 in rows LAB2 and LAB3 as illustrated in FIG. 8: In row LAB2, a connection 701 provides a DIM connection coupled to V-line 4$a$ by a stub H-2 of row LAB2 via a connection 731 as shown. In row LAB3, a connection 702 provides a DIM connection (group 710) that can become redundant for the connection 701 to a DIM in row LAB2. In particular, in row LAB3, a connection 702 provides a redundant DIM connection coupled to V-line 4$a$ by a stub H-2 of row LAB3 via a connection 731 as shown. This row LAB3 DIM connection can be used in a redundant mode to replace the row LAB2 DIM connection just described.

Two variations to the pattern of connections in one row replacing connections in another row are as follows: In the spare row LAB6, only redundant mode connections 702 and 732 exists because row LAB6 is not utilized during normal mode operation. Also, in row LAB7, below spare row LAB6, redundant only mode connection 702 and 732 need not exist because row LAB7 is not used to replace spare row LAB6. Because row LAB6 is not used in normal mode operation, its various connections do not need to be replicated in row LAB7 for redundant mode operation.

V-lines together with respective tails in each track have an actual length measured in LAB rows spanned (whether or not used) and a logical length measured in LAB rows actually used in a particular mode. Actual length as used herein refers to the number of rows that the V-line reaches into, not including the row in which the line first exists. For example, V-line 1$c$ and tail 1$c$–$t$ together have an actual length of five (counting rows LAB8, LAB9, LAB10, LAB11, and LAB12); by contrast, V-line 2$b$ and tail 2$b$–$t$ together have an actual length of 6 LAB rows (counting rows LAB3, LAB4, LAB5, LAB6, LAB7, and LAB8). The logical length, by contrast, is the length that the line is considered to be for purposes of configuration and routing on the device for operation in a particular mode. The logical length is measured by counting, beginning with the first row after the row from which the line is first driven, the active rows which the line spans (i.e. in normal mode, not counting spare rows and rows only touching a the line's tail; and in redundant mode, counting spare rows and rows touching the needed portions of the line's tail but not bad rows).

In an aspect of the embodiment illustrated in FIGS. 8–10, for V-lines together with tails that are not crossing a spare row (e.g. spare row LAB6), the actual length is five and, for V-lines together with tails that are crossing spare rows, the actual length is six. This aspect allows the logical length of all V-lines including tails to be consistent at length four in a particular mode of operation. For example, as discussed above, V-line 1$c$ together with tail 1$c$–$t$ has an actual length of five and, in normal mode operation, a logical length of four. In normal mode operation, the V-line tail V$c$–$t$ is not utilized, and thus rows into which the tail extends are not counted in logical length, thus the logical length of four includes rows LAB8, LAB9, LAB10, and LAB11. V-line 2$b$ together with tail 2$b$–$t$ has an actual length of 6 and, in normal mode operation, an logical length of four. In normal mode operation, the tail V2$b$–$t$ is not utilized and thus not counted for logical length; moreover, the spare row is not utilized, and thus is also not counted in logical length; thus, the logical length of four in normal mode operation includes rows LAB3, LAB4, LAB5, and LAB7.

The logical length of lines when a redundancy mode is engaged will be illustrated and discussed in FIG. 10 and accompanying text. Generally, however, under this aspect of the illustrated embodiments, the actual length of conductors not crossing spare row boundaries is one logical unit greater than the desired logical length while the actual length of conductors crossing spare row boundaries is two logical units greater than the desired logical length. The physical length can be extended as necessary to make the logical lengths of the lines match based on the frequency and orientation of the redundant circuitry and other factors. Furthermore, although FIG. 8 illustrates an example in the context of lines having a logical length of four, lines with greater or lesser logical lengths that also match whether or not a spare row is crossed may be provided utilizing principles such as those illustrated and described for lines of length four.

With respect to V-lines that only cross the spare row with the V-line tail, the actual length of the V-line together with the tail may be either five or six (i.e. one greater or two greater than the desired logical length) and still be consistent with this aspect of the embodiment of FIG. 8. For example, as illustrated, V-line 1$b$ does not extend into spare row LAB6, however, tail 1$b$–$t$ of V-line 1$b$ does extend into spare row LAB6. As illustrated, the actual length of V-line 1$b$ together with tail 1$b$–$t$ is 6. However, the portion of tail 1$b$–$t$ extending into row LAB7 is not necessary as it is not utilized even in redundant mode operation.

In alternative embodiments, V-lines may be provided that are all the same actual length. Such embodiments, may, depending on the context, need to account for limited stitching ability in rows prior to a spare row. Such embodiments may also require accounting for similar V-lines having different logical lengths if some V-lines cross spare rows and others do not. For designing routing algorithms, it may be useful in some contexts to provide a layout such as that provided in the aspect of the illustrated embodiment under which the logical length is consistent across wires whether or not a spare row is crossed.

FIG. 9 shows the portion 700 of FIG. 8 configured to provide normal mode operation with a spare row at row LAB 6 and routing for four signal paths, 76, 77, 78, and 79. As shown, five physical tracks are used to provide routing for the four signal paths. This allows a portion of each track to be reserved for use in redundant mode operation. As shown, signal paths stitch from 1 track to another through a connection 701 in a connection group 720 in each row. Thus one V-line in a particular signal path is not necessarily in the same physical track as another V-line in the same signal path. These stitching connections will now be described in more detail.

Beginning with signal path 76, in row LAB1, the signal path 76 is provided on track 2. However, in row LAB 1, the signal path 76 stitches from one V-line to another as follows. It is coupled to a stub H-4 by a connection 731. From stub H-4, it is coupled by a connection 701 to a driver 751 input as shown. From the output of the driver 751 it is coupled to a stub H-6 by a connection 731, and from stub H-6 it is coupled by another connection 731 to a V-line in track 1 as indicated. Signal path 76 continues in track 1 until row LAB5 where it is coupled by a connection 731 to a stub H-5, which in turn is coupled by a connection 701 to a driver 751 input. The output of the driver 751 is coupled by a connection 731 to a stub H-6 which in turn is coupled by another connection 731 to a V-line in track 5 as indicated. Signal path 76 continues in track 5 until row LAB10 where it is coupled by a connection 731 to a stub H-1, which in turn is coupled by a connection 701 to a driver 751 input. The output of the driver 751 in row LAB10 is coupled by a connection 731 to a stub H-6 which in turn is coupled by another connection 731 to a V-line in track 4.

Now turning to signal path 77, in row LAB1, the signal path is provided on track 3. In row LAB2, the signal path 77 stitches from one V-line to another as follows: It is coupled to a stub H-3 by a connection 731. From the stub H-3, it is coupled by a connection 701 to a driver 751 input as shown. From the driver 751 output in row LAB2, it is coupled to a stub H-6 by a connection 731, and from stub H-6 it is coupled by another connection 731 to a V-line in track 2 as indicated. Signal path 77 continues in track 2 until row LAB7 where it is coupled by a connection 731 to a stub H-4, which in turn is coupled by a connection 701 to a driver 751 input. The output of the driver 751 in row LAB7 is coupled by a connection 731 to a stub H-6 which in turn is coupled by another connection 731 to a V-line in track 1 as indicated. Signal path 77 continues in track 1 until row LAB11 where it is coupled by a connection 731 to a stub H-5, which in turn is coupled by a connection 701 to a driver 751 input. The output of the driver 751 in row LAB11 is coupled by a connection 731 to a stub H-6 which in turn is coupled by a connection 731 to a V-line in track 5 as indicated.

Now turning to signal path 78, in row LAB1, the signal path is provided on track 4. In row LAB3, the signal path 78 stitches from one V-line to another as follows: It is coupled to a stub H-2 by a connection 731. From the stub H-2, it is coupled by a connection 701 to a driver 751 input as shown. From the driver 751 output in row LAB3, it is coupled to a stub H-6 by a connection 731, and from stub H-6 it is coupled by another connection 731 to a V-line in track 3 as indicated. Signal path 78 continues in track 3 until row LAB8 where it is coupled by a connection 731 to a stub H-3, which in turn is coupled by a connection 701 to a driver 751 input. The output of the driver 751 in row LAB8 is coupled by a connection 731 to a stub H-6 which in turn is coupled by another connection 731 to a V-line in track 2 as indicated. Signal path 78 continues in track 2 until row LAB12 where it is coupled by a connection 731 to a stub H-4, which in turn is coupled by a connection 701 to a driver 751 input. The output of the driver 751 in row LAB12 is coupled by a connection 731 to a stub H-6 which in turn is coupled by another connection 731 to a V-line in track 1 as indicated.

Now turning to signal path 79, in row LAB1, the signal path is provided on track 5. In row LAB4, the signal path 79 stitches from one V-line to another as follows: It is coupled to a stub H-1 by a connection 731. From the stub H-1, it is coupled by a connection 701 to a driver 751 input as shown. From the driver 751 output in row LAB4, it is coupled to a stub H-6 by a connection 731, and from stub H-6 it is coupled by another connection 731 to a V-line in track 4 as indicated. Signal path 79 continues in track 4 until row LAB9 where it is coupled by a connection 731 to a stub H-2, which in turn is coupled by a connection 701 to a driver 751 input. The output of the driver 751 in row LAB9 is coupled by a connection 731 to a stub H-6 which in turn is coupled by another connection to a V-line in track 3 as indicated.

In normal mode operation, connections are not utilized in spare row LAB6. Thus drivers 751 and 752 are tristated in that row and all four signal paths extend through the row without making stitching connections.

In the illustrated embodiment, at least one connection 701 in a group 740 is provided to each signal path via a horizontal stub and a connection 731. Also, at least one connection 702 in a LIM connection group 740 is provided between a tail of a vertical track via a horizontal stub and a connection 732. Furthermore, given that the signal path logical lengths are length 4, there are four signal paths, and a staggered routing architecture is used, each row has one stitching connection. This quantity of connections is facilitated by the use of 6 horizontal stubs per row, or 2 more stubs than the number of signal paths. Taking row LAB1 as an example, signal paths 76, 77, 78, and 79 each couple to a connection 701 in LIM connection group 740 via, respectively, stubs H-4, H-3, H-2, and H-1 via normal mode connections 73 1. Tail 1a–t couples to a redundant mode connection 702 in LIM connection group 740 via stub H-5 and a redundant mode connection 732. Finally, stub H-6 is utilized in row LAB1 so that signal path 76 can stitch from track 2 to track 1 as shown and line 1b is driven in normal mode from a driver 751 in row LAB1 via stub H-6 as shown.

Although in the illustrated embodiment, 6 stubs (or "n+2" where n is the number of signal paths) are utilized in each row, the same number of connections per row or a different number of connections per row might be obtained through use of the same or a different number of horizontal stubs. To cite one example, the illustrated embodiment might be modified to provide 8 stubs and the additional stubs might be utilized to provide additional couplings to additional LIM connections. Or, to cite but one other example, additional couplings from V-lines to LIM connections might be provided using the same number of stubs as illustrated by modifying the illustrated embodiment to provide additional connections per V-line to stubs in the same row, e.g., additional connections coupling the same V-line to two different stubs for connection to different LIMs in the same row.

FIG. 10 shows the portion 700 of FIG. 8 configured to implement redundant mode operation in particular region to repair bad rows LAB2 and LAB7.

Redundant mode operation is engaged to affect routing from bad row LAB2 to spare row LAB6. Redundant mode operation is also engaged to affect routing from bad row LAB 7 through row LAB12. A spare row exists below row LAB12, but is not separately shown. Thus FIGS. 8–10 represent portions of two repairable regions that can each accommodate repair of a bad row. In alternative embodiments, a greater or smaller number of repairable regions may be defined over a similar section by providing spare rows according to the desired number of repairable regions.

As shown in FIG. 10, with redundancy engaged, provision is made for the same four signal paths (76, 77, 78, and 79) illustrated in the normal mode operation of FIG. 9. However, in the redundant operation illustrated in FIG. 10, tails of respective V-lines are utilized to shift connections down one row in the regions from a bad row to a spare row.

In row LAB1, note that all connections illustrated in FIG. 10 are identical to those shown in FIG. 9. Since row LAB1 is above bad row LAB2, no shifting of connections from row LAB1 relative to normal mode is necessary. However, beginning from row LAB2, connections are shifted downward to bypass the bad row LAB2 and utilize spare row LAB6 to accommodate the same signal paths and corresponding stitching connections in connection groups 720, DIM connections in connection groups 710, and LIM connections in connection groups 740.

Stitching connections are shifted downward as follows: in bad row LAB2, drivers 751 and 752 are tristated. Instead of being stitched from track 3 to track 2 in row LAB2 as illustrated in FIG. 9, signal path 77 is stitched from track 3 to track 2 in row LAB3 as illustrated in FIG. 10. The signal path 77 connects via tail 3a–t to a redundant mode connection 732 in row LAB3 coupling tail 3a–t to a stub H-3 which in turn is coupled by a redundant mode connection 702 to a redundant driver 752 which drives a V-line in track 2 via a redundant mode connection 732 to a stub H-4 and a connection 731 coupling the stub H-4 to V-line 2b in track 2 as shown.

As further illustrated in FIG. 10, the following additional stitching connections are shifted downward in redundant mode operation relative to the normal mode operation illustrated in FIG. 9: Instead of being stitched from track 4 to track 3 in row LAB3, signal path 78 connects via tail 4a–t for stitching from track 4 to track 3 in row LAB4 as illustrated. Instead of being stitched from track 5 to track 4 in row LAB4, signal path 79 connects via tail 5a–t for stitching from track 5 to track 4 in row LAB5 as illustrated. Instead of being stitched from track 1 to track 5 in row LAB5, signal path 76 connects via tail 1b–t for stitching from track 1 to track 5 in spare row LAB6 as illustrated. No downward shifting of connections occurs from spare row LAB6 to bad row LAB7, however, from bad row LAB7 through row LAB12, downward shifting of stitching connection in redundant mode as illustrated in FIG. 10 relative to normal mode as illustrated in FIG. 9 continues as follows: Instead of being stitched from track 2 to track 1 in row LAB7, signal path 77 connects via tail 2b–t for stitching from track 2 to track 1 in row LAB8 as illustrated. Instead of being stitched from track 3 to track 2 in row LAB8, signal path 78 connects via tail 3b–t for stitching from track 3 to track 2 in row LAB9 as illustrated. Instead of being stitched from track 4 to track 3 in row LAB9, signal path 79 connects via tail 4b–t for stitching from track 4 to track 3 in row LAB10 as illustrated. Instead of being stitched from track 5 to track 4 in row LAB10, signal path 79 connects via tail 5b–t for stitching from track 5 to track 4 in row LAB11 as illustrated. Instead of being stitched from track 1 to track 5 in row LAB11, signal path 76 connects via tail 1c–t for stitching from track 1 to track 5 in row LAB12 as illustrated.

As illustrated in FIG. 10, the choice of actual length for V-lines and respective tails described in relation to FIG. 8 (i.e., desired logical length+1 for lines not crossing a spare row, desired logical length+2 for lines crossing a spare row, and desired logical length+1 or +2 for lines only extending into the spare row via a tail) allows a consistent logical length to be maintained in both normal mode and redundant mode operation whether or not a spare row is being crossed. For example, V-line 2b, together with tail 2b–t crosses spare row LAB6 and has an actual length of six. In redundant mode, the logical length of V-line 2b together with tail 2b–t is four. In redundant mode operation, V-line 2b is driven from row LAB3 and the logical length of four counts rows LAB4, LAB5, spare row LAB6, and row LAB8 (row LAB7 is bad and is not counted). This is the same logical length that line 2b together with tail 2b–t had in normal mode operation as illustrated in FIG. 9. There, line 2b is driven from row LAB2, the spare row LAB6 is not used, and the logical length of four counts rows LAB3, LAB4, LAB5, and LAB7. It is also the same logical length of a physically shorter line not crossing a spare row. For example, line 1c together with tail 1c–t has an actual length of five counting rows LAB8, LAB9, LAB10, LAB11, and LAB12. However, its logical length is four. In redundant operation as illustrated in FIG. 10, line 1c is driven from row LAB8, thus the logical length of four counts row LAB9, LAB10, LAB11, and LAB12. This is the same logical length that line 1c together with tail 1c–t has in normal mode operation as illustrated in FIG. 9. There, line 1c is driven from row LAB7, however, the tail is not utilized in normal mode operation, thus the logical length of four counts rows LAB8, LAB9, LAB10, and LAB11.

As one other example, V-line 1b in the redundant mode illustrated in FIG. 10 is driven from row LAB1 in both redundant (FIG. 10) and normal mode (FIG. 9) operations. Bad row LAB2 is below row LAB1, thus the connections and driving points of row LAB1 do not need to shift when redundancy is engaged to repair row LAB2. However, the logical length of line 1b together with tail 1b–t is maintained. In particular, the logical length in redundant operation is four, counting rows LAB3, LAB4, LAB5, and spare row LAB6 (bad row LAB2 is not counted). This is the same logical length that line 1b together with tail 1b–t has in normal mode operation as illustrated in FIG. 9. There, line 1b is also driven from row LAB1—row LAB2 is assumed to be good in normal operation and therefore counted in logical length; however, the tail is not utilized in normal mode operation, thus the logical length of four counts rows LAB2, LAB3, LAB4, and LAB5 (note that spare row LAB6 is not utilized in normal mode operation).

Figure 11:
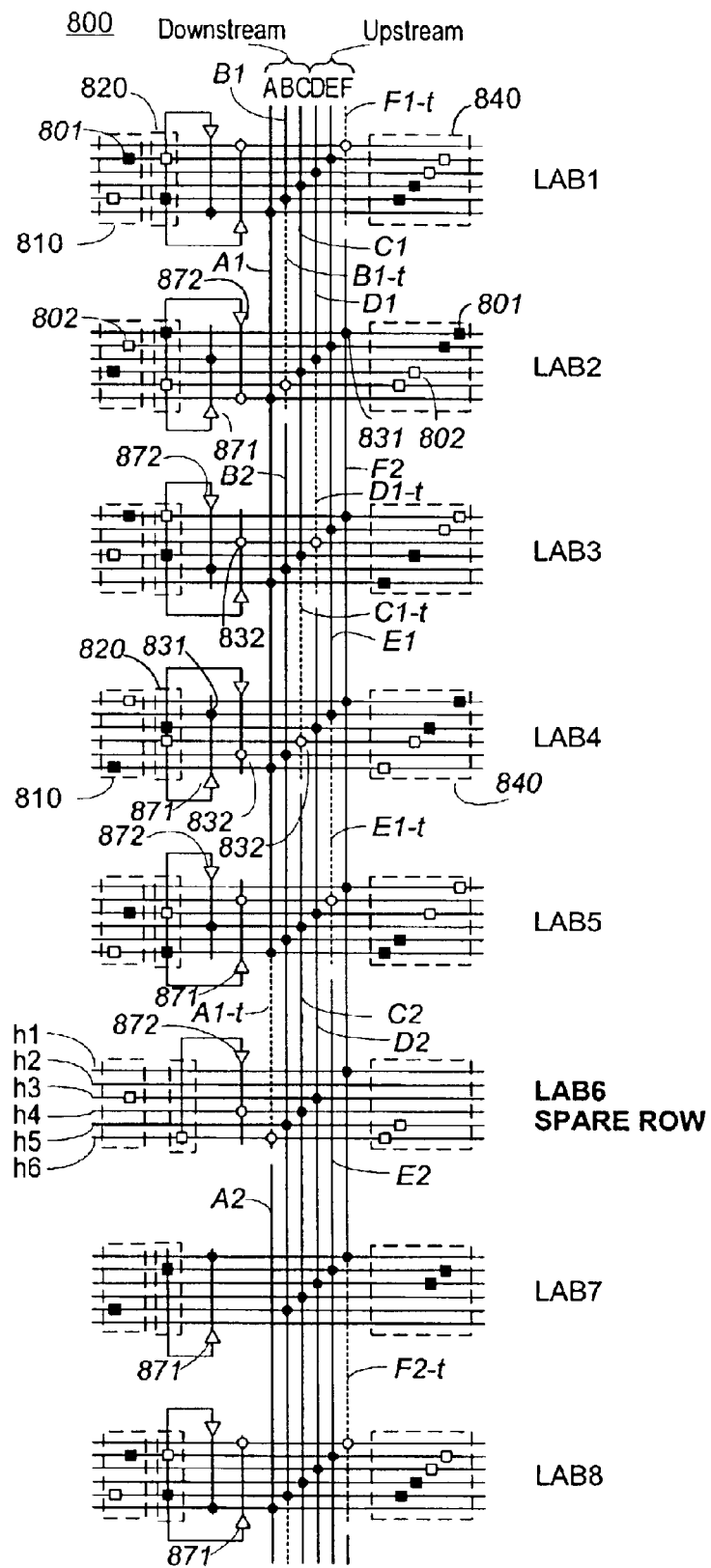
FIG. 11 illustrates a portion of several rows within a programmable logic device including a spare row, the portion having adjacent upstream and downstream physical tracks, normal mode stitching circuitry and redundant mode stitching circuitry being alternated between upstream and downstream physical tracks in accordance with an embodiment of an aspect of the present invention.
Figure 12:
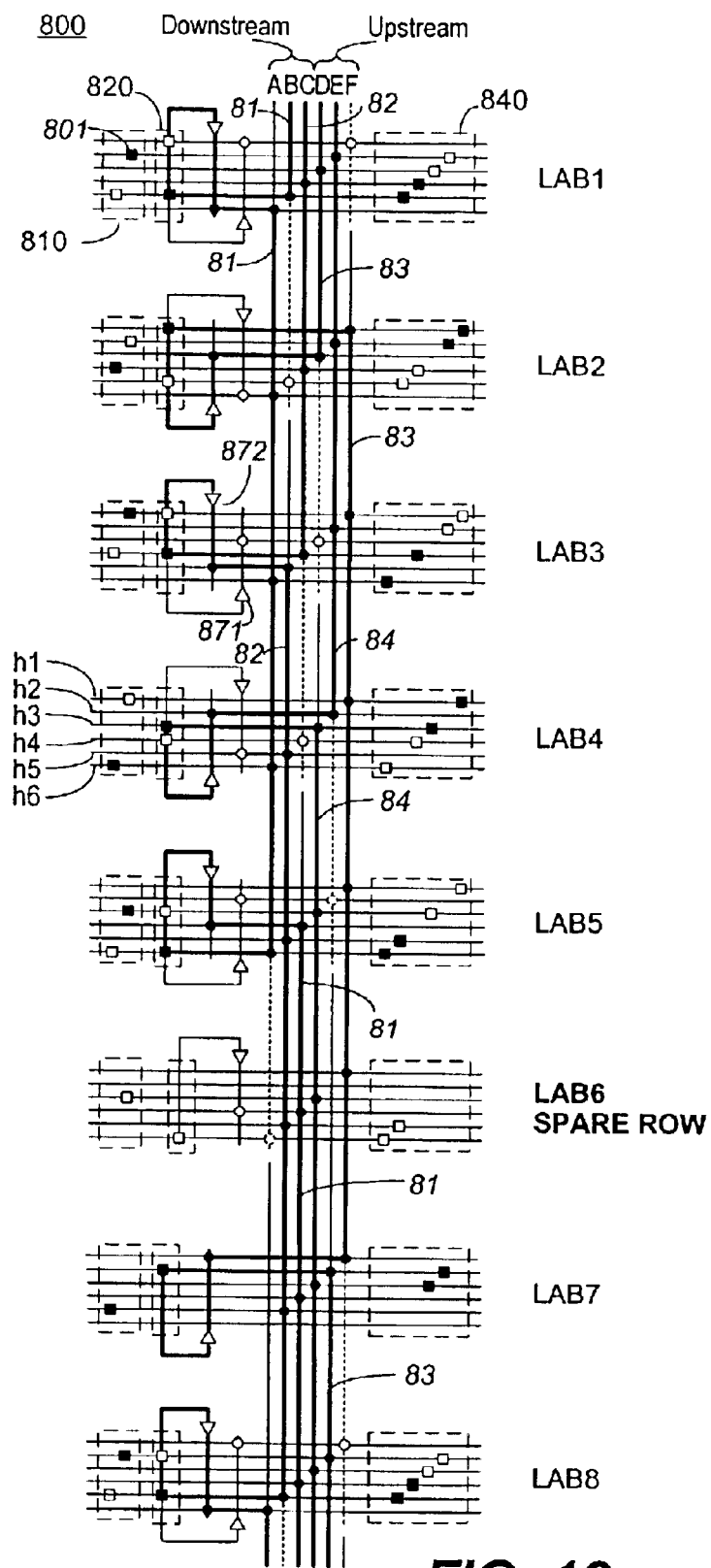
FIG. 12 illustrates signal paths that may be accommodated on the physical tracks of the portion of FIG. 11 when the programmable logic device is configured for normal mode operation.

FIGS. 11–12 illustrate a portion 800 including multiple rows in a PLD. The portion 800 includes eight rows of LABs, rows LAB1–LAB8. Portion 800 includes six tracks of wires, track A, B, C, D, E, and F. In contrast to the portion 700 of FIGS. 8–10, in which wires illustrated utilizing drivers in the driver column 780 were all driving signals in the same relative direction (e.g., downstream), portion 800 of FIGS. 11–12 includes both upstream and downstream wires. The six tracks of wires include three downstream tracks: A, B, and C; and 3 upstream tracks: D, E, and F. Also shown are upstream drivers 871 and downstream drivers 872.

In the portion as illustrated in FIG. 11, track A includes V-line A1 and tail A1-t and V-line A2. Track B includes V-line B1 and tail B1-*t* and V-line B2. Track C includes V-line C1 and tail C1-*t* and V-line C2. Track D includes V-line D1 and tail D1-*t* and V-line D2. Track E includes V-line E1 and tail E1-*t* and V-line E2. Track F includes tail F1-*t* and V-line F2 and tail F2-*t*.

Portion 800 further includes horizontal stubs h1, h2, h3, h4, h5, and h6. Connections 831 and 832 couple V-lines to horizontal stubs as indicated and also couple driver outputs to horizontal stubs as indicated.

Portion 800 further includes groups 810, 820, and 840 of connections 801 and 802. Groups 810 include connections 801 and 802 to DIMs for driving H-lines (DIMs and H-lines not separately shown), groups 820 include connections 801 and 802 for stitching between V-lines through DIMs and drivers 871 or 872 (V-line DIMs not separately shown), and groups 840 include connections 801 and 802 to LIMs for routing to LEs (LIMs and LEs not separately shown). Regarding groups 820, for those rows in which the group 820 has both a connection 801 and a connection 802, those connections connect from respective stubs and form different inputs of the same V-line DIM (remainder of the V-line DIMs not separately shown) and the output of that V-line DIM connects to both a driver 871 and a driver 872.

Figure 13:
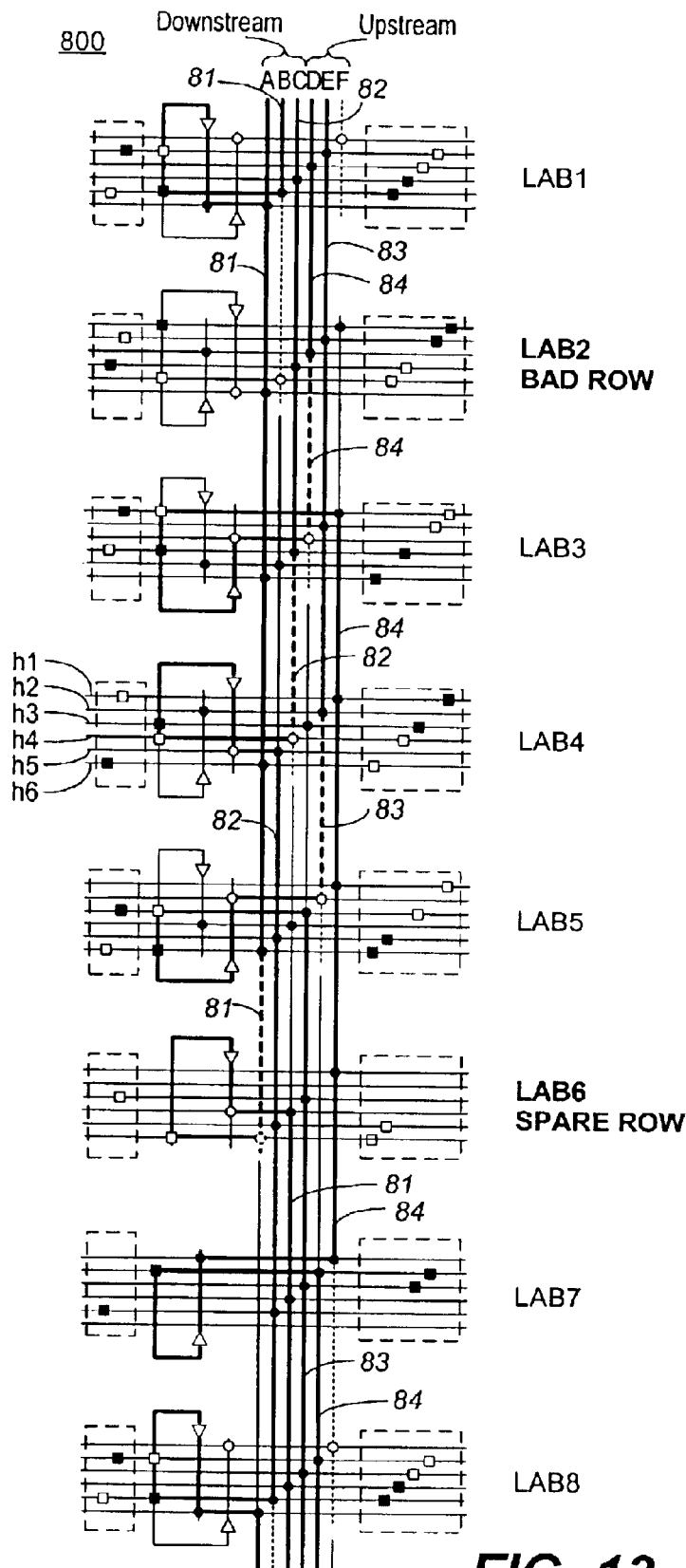
FIG. 13 illustrates the portion of FIG. 11 when the programmable logic device is configured to bypass a bad row and utilize redundant circuitry to provide redundant mode signal paths corresponding to the normal mode signal paths of FIG. 12.

As illustrated in FIGS. 11–13, the patterns of redundant mode connections 802 generally provide redundancy for connections 801 from row to row. For example, considering the pattern of connections in LIM groups 840 in rows LAB2 and LAB3 as illustrated in FIG. 11: In row LAB2, connections 801 provide LIM connections coupled to V-lines E1 and F2 by, respectively, stubs h2 and h1 of row LAB2 via connections 831 as shown. In row LAB3, connections 802 provide LIM connections (group 840) that can become redundant for the connections 801 to LIMs in row LAB2. In particular, in row LAB3, connections 802 provide redundant LIM connections coupled to V-lines E1 and F2, by, respectively stubs h2, and h1 of row LAB3 via connections 831. These row LAB3 LIM connections can be used in a redundant mode to replace the row LAB2 LIM connections just described.

In similar fashion, considering the pattern of connections in DIM groups 810 in rows LAB2 and LAB3 as illustrated in FIG. 11: In row LAB2, a connection 801 provides a DIM connection coupled to V-line C1 by a stub h4 of row LAB2 via a connection 831 as shown. In row LAB3, a connection 802 provides a DIM connection (group 810) that can become redundant for the connection 801 to a DIM in row LAB2. In particular, in row LAB3, a connection 802 provides a redundant DIM connection coupled to V-line C1 by a stub h4 of row LAB3 via a connection 831 as shown. This row LAB3 DIM connection can be used in a redundant mode to replace the row LAB2 DIM connection just described.

In the spare row LAB6, only redundant mode connections 802 exists because row LAB6 is not utilized during normal mode operation. Also, in row LAB7, below spare row LAB6, redundant only mode connections 802 and 832 need not exist because row LAB7 is not used to replace spare row LAB6. Because row LAB6 is not used in normal mode operation, its various connections do not need to be replicated in row LAB7 for redundant mode operation.

In portion 800 as illustrated in FIGS. 11–13, the role of upstream drivers 871 and downstream drivers 872 alternates from row to row between normal mode drivers and redundant mode drivers. For example, in row LAB3, driver 872 is used in normal mode operation and driver 871 is used in redundant mode operation. By contrast, in row LAB4, driver 871 is used in normal mode operation and driver 872 is utilized in redundant mode operation. This alternating of drivers from row to row is further illustrated and described in relation to FIGS. 12–13 and accompanying text.

FIG. 12 shows the portion 800 of FIG. 11 configured to provide normal mode operation with a spare row at row LAB 6 and routing for four signal paths, 81, 82, 83, and 84. Signal paths 81 and 82 are downstream signal paths (i.e., signals are driven with the redundant mode row shift direction) and signal paths 83 and 84 are upstream (i.e., signals are driven against the redundant mode row shift direction). Three physical tracks, tracks A, B, and C are used to provide routing for the two downstream signal paths 81 and 82. Three other physical tracks, tracks D, E, and F are used to provide routing for the two upstream signal paths 83 and 84.

Beginning with signal path 81, in row LAB1, the signal path 81 is provided on track B. However, in row LAB 1, the signal path 81 stitches from one V-line to another as follows. It is coupled to a stub h5 by a connection 831. From stub h5, it is coupled by a connection 801 to a downstream driver 872 as shown. From the driver 872 it is coupled to a stub h6 by a connection 831, and from stub h6 it is coupled by another connection 831 to a V-line in track A as indicated. Signal path 81 continues in track A until row LAB5 where it is coupled by a connection 831 to a stub h6, which in turn is coupled by a connection 801 to a driver 872 input. The output of the driver 872 is coupled by a connection 831 to a stub h4 which in turn is coupled by another connection 831 to a V-line in track C as indicated.

Now turning to signal path 82, in row LAB1, the signal path is provided on track C. In row LAB3, the signal path 82 stitches from one V-line to another as follows: It is coupled to a stub h4 by a connection 831. From the stub h4, it is coupled by a connection 801 to a driver 872 input as shown. From the driver 872 output in row LAB3, it is coupled to a stub h5 by a connection 831, and from stub h5 it is coupled by another connection 831 to a V-line in track B as indicated. Signal path 82 continues in track B until row LAB8 where it is coupled by a connection 831 to a stub h5, which in turn is coupled by a connection 801 to a driver 872 input. The output of the driver 872 in row LAB8 is coupled by a connection 831 to a stub h6 which in turn is coupled by another connection 831 to a V-line in track A as indicated.

Stitching for upstream signal paths 83 and 84 will be described from the bottom to the top of the page. Turning to signal path 83, in row LAB8, the signal path is provided on track E. In row LAB7, the signal path 83 stitches from one V-line to another as follows: It is coupled to a stub h2 by a connection 831. From the stub h2, it is coupled by a connection 801 to a driver 871 input as shown. From the driver 871 output in row LAB7, it is coupled to a stub h1 by a connection 831, and from stub h1 it is coupled by another connection 831 to a V-line in track F as indicated. Signal path 83 continues in track F until row LAB2 where it is coupled by a connection 831 to a stub h1, which in turn is coupled by a connection 801 to a driver 871 input. The output of the driver 871 in row LAB2 is coupled by a connection 831 to a stub h3 which in turn is coupled by another connection 831 to a V-line in track D as indicated.

Turning to signal path 84, in row LAB8, the signal path is provided on track D. In row LAB4, the signal path 84 stitches from one V-line to another as follows: It is coupled to a stub h3 by a connection 831. From the stub h3, it is coupled by a connection 801 to a driver 871 input as shown. From the driver 871 output in row LAB4, it is coupled to a stub h2 by a connection 831, and from stub h2 it is coupled by another connection 831 to a V-line in track E as indicated.

In normal mode operation, connections are not utilized in spare row LAB6. Thus downstream driver 872 is tristated in that row and signal paths extend through the row without making stitching connections. Other redundant drivers are tristated as well during normal mode operation. In particular, upstream driver 871 in row LAB1, downstream driver 872 in row LAB2, upstream driver 871 in row LAB3, downstream driver 872 in row LAB4, upstream driver 871 in row LAB5, and upstream driver 871 in row LAB 8 are also redundant and thus turned off in normal mode operation.

FIG. 13 shows the portion 800 of FIG. 11 configured to implement redundant mode operation in particular region to repair a bad row LAB2.

Redundant mode operation is engaged to affect routing from bad row LAB2 to spare row LAB6. As shown in FIG. 13, with redundancy engaged, provision is made for the same four signal paths (81, 82, 83, and 84) illustrated in the normal mode operation of FIG. 12. However, in the redundant operation illustrated in FIG. 13, tails of respective V-lines are utilized to shift stitching connections down one row in the regions from a bad row to a spare row.

In row LAB1, note that all connections illustrated in FIG. 13 are identical to those shown in FIG. 12. Since row LAB1 is above bad row LAB2, no shifting of connections from row LAB1 relative to normal mode is necessary. However, beginning from row LAB2, connections are shifted downward to bypass the bad row LAB2 and utilize spare row LAB6 to accommodate the same signal paths and corresponding stitching connections in connection groups 820, DIM connections in connection groups 810, and LIM connections in connection groups 840.

As illustrated in FIG. 13, stitching connections are shifted downward relative to the normal mode operation illustrated in FIG. 12 as follows: in bad row LAB2, drivers 871 and 872 are tristated. Instead of being stitched from track F to track D in row LAB2 as illustrated in FIG. 12, upstream signal path 83 is stitched from track F to track D in row LAB3 as illustrated in FIG. 13. In row LAB3, the signal path 84 connects to a stub h1 via a connection 831, the stub h1 is in turn coupled to the input of an upstream driver 871 by a redundant mode connection 802 as shown; the output of the driver 871 is coupled by a redundant connection 832 to a stub h3 which in turn is coupled by another connection 832 to tail D1-$t$ in track D for continuing upstream to V-line D1. Instead of being stitched from track C to track B in row LAB3 as illustrated in FIG. 12, downstream signal path 82 is stitched from track C to track B in row LAB4 as illustrated in FIG. 13. The signal path 82 connects via tail C1-$t$ to a redundant mode connection 832 in row LAB4 coupling tail C1-$t$ to a stub h4 which in turn is coupled by a redundant mode connection 802 to a driver 872 which drives a V-line in track B via a redundant mode connection 832 to a stub h5 and a connection 831 coupling the stub h5 to V-line B2 in track B as shown.

As further illustrated in FIG. 13, the following additional stitching connections are shifted downward in redundant mode operation relative to the normal mode operation illustrated in FIG. 12: Instead of being stitched from track D to track E in row LAB4 (FIG. 12), upstream signal path 84 is stitched from track D to track E utilizing tail E1-$t$ in row LAB5 as illustrated (FIG. 13). Instead of being stitched from track A to track C in row LAB5 (FIG. 12), downstream signal path 81 is stitched from track A to track C utilizing tail A1-$t$ in row LAB6 as illustrated.

Figure 14:
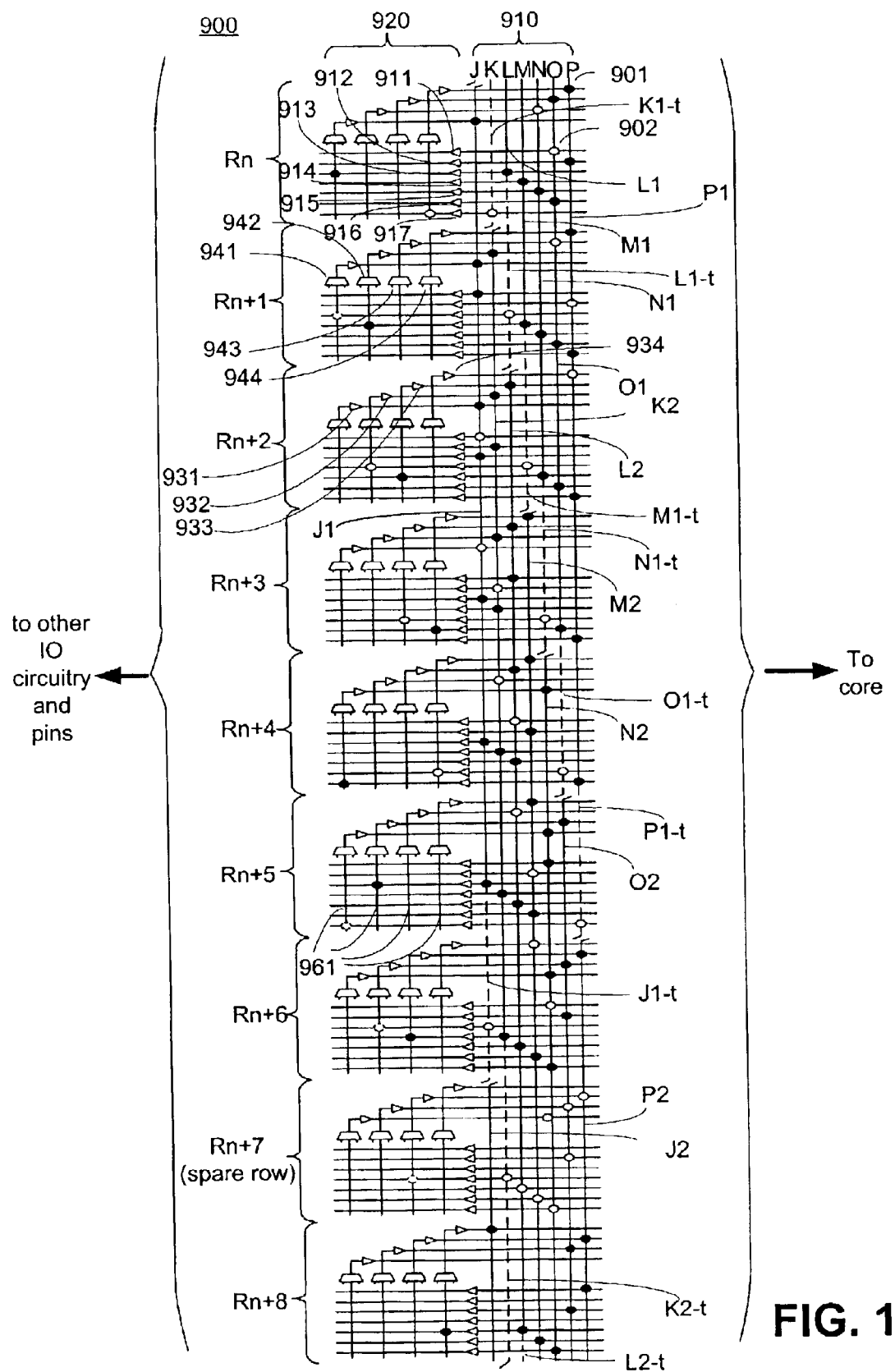
FIG. 14 illustrates an HIO bus portion and additional HIO circuitry having redundant circuitry in accordance with a aspects of the present invention.

FIG. 14 illustrates an HIO circuitry portion 900 including HIO bus portion 910 and HIO listening/driving portion 920. "HIO" refers to the circuitry for communicating with the IOs on the sides of a device. The HIO bus portion 910 has vertical HIO tracks J, K, L, M, N, O, and P, each track spanning a plurality of HIO rows. As illustrated, the illustrated HIO tracks span rows Rn, Rn+1, Rn+2, Rn+3, Rn+4, Rn+5, Rn+6, spare row Rn+7, and row Rn+8. In the presently illustrated embodiment, the HIO rows illustrated correspond to logic region rows on the device of which HIO circuitry portion 900 is a part. However, in alternative embodiments, such correspondence may not exist without necessarily departing from the spirit and scope of the invention.

Each track's illustrated portion includes a plurality of lines. Track J includes line J1, tail J1-$t$, and line J2. Track K includes tail K1-$t$, line K2, and tail K2-$t$. Track L includes line L1, tail L1–2, and line L2 and tail L2-$t$. Track M includes line M1, tail M1-$t$, and line M2. Track N includes line N1, tail N1-$t$, and line N2. Track O includes line O1, tail O1-$t$, and line O2. Track P includes line P1, tail P1-$t$, and line P2.

In the illustrated embodiment, track lines that cross a spare row are one physical length longer, as measured by rows spanned, than track lines that do not cross a spare row. For example, line J1 and tail J1-$t$ are, together, physically six units long, counting rows Rn+1 to Rn+6. By contrast, line L2 and tail L2-$t$ are, together, physically seven units long counting rows Rn+3 to Rn+9 (row Rn+9 is not separately shown, but, as shown, tail L2-$t$ does not end at row Rn+8; rather, it extends toward what would be the next row, row Rn+9). In normal and redundant mode, both line J1 together with tail J1-$t$ and line L2 together with tail L2-$t$ have logical lengths of 5. For example, in normal mode, neither line uses its respective tail, and the portion of line L2 crossing spare row Rn+7 is not counted in logical length since it is bypassed in normal operation mode. Line K2 together with tail K2-$t$ also has a physical length of seven, however, the aspect of consistent logical lengths could be provided with respect to line K2 and tail K2-$t$ even if tail k2-$t$ did not extend into row Rn+8 as that portion of tail K2-$t$ is not necessary. As was discussed in relation to the embodiment illustrated in FIGS. 8–10, alternative embodiments may provide for lines having the same physical length without necessarily departing from other aspects of the illustrated embodiment; however, such alternative embodiments may, depending on the context, need to account for limited stitching of lines ending above a spare row and also may need to account for different logical lengths depending upon whether or not a spare row is crossed.

Listening/driving portion 920 includes, in each row, HIO listening (input) buffers 911, 912, 913, 914, 915, 916, and 917; and HIO output circuitry including HIO output muxes 941, 942, 943, and 944 and HIO output buffers 931, 932, 933, and 934; the HIO output muxes are respectively coupled to the HIO output buffers as shown. Also included in each row are stitching lines 961.

HIO circuitry portion 900 is coupled to additional IO circuitry en route to device pins for external communication (additional IO circuitry and pins not separately shown). HIO circuitry portion 900 is also coupled to communicate signals to and from the device core (device core not separately shown).

HIO circuitry portion 900 further includes connections 901 and connections 902. As will be illustrated and described in more detail in FIGS. 15–16 and accompanying text, connections 901 provide normal mode pathways from HIO bus portion 910 to HIO listening/driving portion 920 to provide HIO signals from the bus to the HIOs. Some connections 901 also provide normal mode pathways for tracks in HIO bus portion 910 to stitch one track line to another through stitching lines 961 via particular HIO output muxes 941–944 and HIO output buffers 931–934 in HIO listening/driving portion 920. Some connections 901 also provide normal mode pathways for tracks in HIO bus portion 910 to receive signals from HIO output buffers 931–934 in rows in which the particular track is not stitching. Some normal connections 901 along with some connections 902 provide redundant mode pathways from HIO bus portion 910 to HIO listening/driving portion 920. Other connections 902 provide redundant mode pathways for tracks in HIO bus portion 920 to stitch one track line to another through stitching lines 961 via particular HIO output muxes 941–944 and HIO output buffers 931–934. Other connections 901 and 902 provide redundant mode pathways for HIO portion 910 to drive tracks of HIO bus portion 920 for purposes other than stitching.

In the illustrated embodiment, connections 901 and 902 are hardwired and are not field programmed based on data loaded into configuration elements. Certain of these connections provide stitching pathway options that are activated based on programming data provided from configuration elements (configuration elements not separately shown) to HIO output muxes 941–944 which may be programmed to select input from stitching lines 961. Certain of these connections also provide listening pathway options that are activated based on programming data provided from configuration elements to listening buffers 911–917. However, in alternative embodiments, connections that are field programmed based on data loaded into configuration elements, fuse or anti-fuse elements may be substituted for hardwired connections such as connections 901 and 902.

Figure 15:
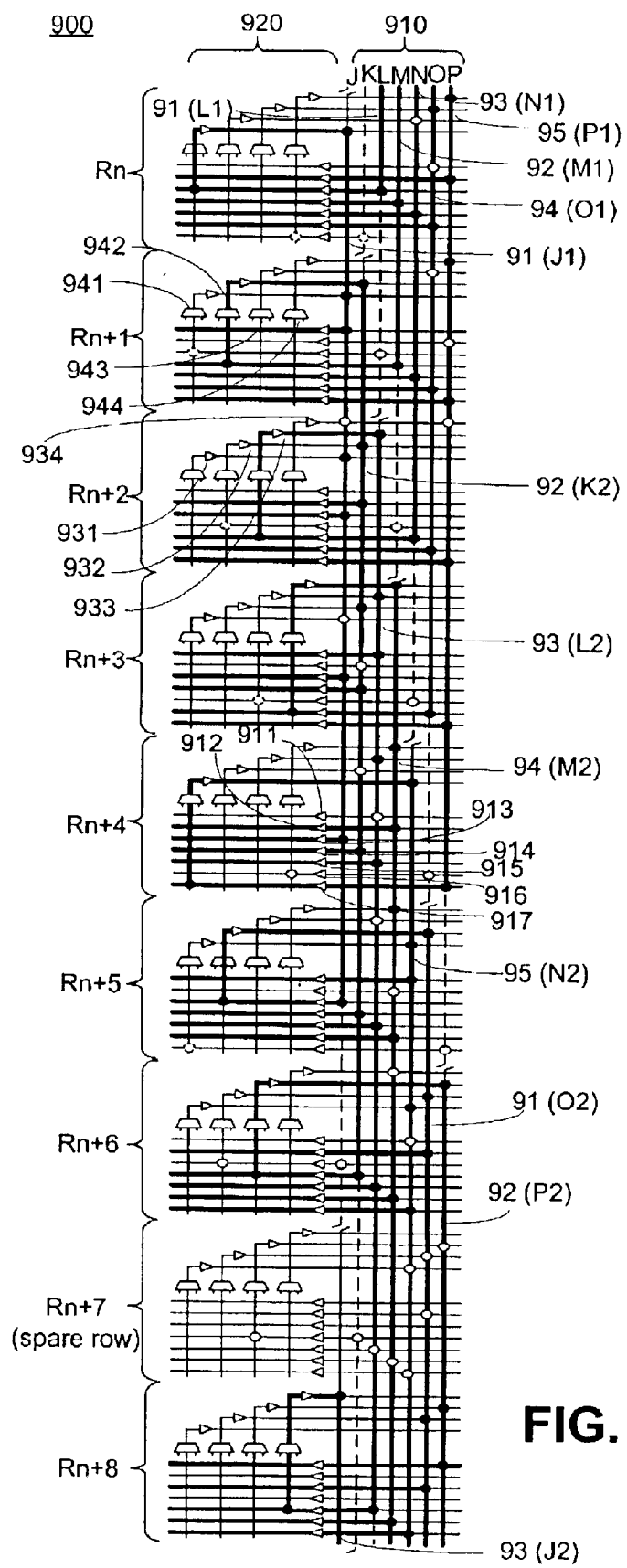
FIG. 15 illustrates the HIO bus portion and additional circuitry of FIG. 14 configured to provide signal paths in normal mode operation.

FIG. 15 shows the HIO circuitry portion 900 configured to provide 5 normal mode signal paths 91, 92, 93, 94, and 95. Bolded lines show each vertical path and show listening and stitching pathways associated with each signal path.

Beginning with signal path 91, in row Rn, signal path 91 is provided on line L1 in track L. In row Rn, path 91 is listened to through an HIO listening buffer 913 as shown. A pathway option to buffer 913 is provided by a connection 901 as shown. Also in row Rn, signal path 91 stitches from line L1 in track L to line J1 in track J as follows: it is coupled by a connection 901 through listening buffer 913 as shown (the same connection used for listening is also used for part of the stitching pathway); another connection 901 couples the signal path 91 to a stitching line 961 as shown. Mux 941 (row Rn) is programmable to select the stitching line 961 as input and provides output to a buffer 931 as shown. Buffer 931 in turn is coupled to provide the signal path to line J1 in track J through a connection 901 as shown.

Signal path 91 continues on line J1 through rows Rn+1, Rn+2, Rn+3, and row Rn+4 to row Rn+5. In row Rn+1 it is listened to through a listening buffer 911 coupled to line J1 by a connection 901 as shown. In rows Rn+2, Rn+3, Rn+4, and Rn+5, it is listened to through a listening buffer 913 coupled to line J1 in each row by a connection 901 as shown. In row Rn+5, path 91 stitches from line J1 in track L to line O2 in track O as follows: it is coupled by a connection 901 through listening buffer 913 as shown (the same connection used for listening is also used for part of the stitching pathway); another connection 901 couples the signal path 91 to a stitching line 961 as shown. Mux 942 (row Rn+5) is programmable to select the stitching line 961 as input and provides output to a buffer 932 as shown. Buffer 932 in turn is coupled to provide the signal path to line O2 in track O through a connection 901 as shown.

Signal path 91 continues on line O2 through rows Rn+6, Rn+7, and row Rn+8. In row Rn+6 it is listened to through a listening buffer 912 coupled to line O2 by a connection 901 as shown. In row Rn+7, it is not listened to; note that row Rn+7 is a spare row and input buffers 911–917 in row Rn+7 are not listened to in normal mode operation. In row Rn+8 it is listened to through a listening buffer 913 coupled to line O2 by a connection 901 as shown.

With the exception of the rows Rn+1 and Rn+6, both of which are the first rows after a row in which path 91 is stitched from one track to another, signal path 91 is listened to on a listening buffer 913. This is consistent with the high fan out requirement of many IO signals. In alternative embodiments, the percentage of stitching rows, and thus the percentage of rows in which the particular buffer on which a particular signal path is listened to is altered, may be decreased by using longer lines. The illustrated embodiment shows lines having a logical length of 5; however, other embodiments may use lines having a logical length of 8, 16, or other lengths greater than 5 to further enhance the fan out of signals provided on HIO signal paths.

Additional connections 901 provide options for signal path 91 to receive signals in normal mode operation from HIO circuitry portion 920 in rows Rn+1 (through a buffer 931), Rn+2 (through a buffer 931), Rn+6 (through a buffer 932), and row Rn+8 (through a buffer 932) as shown.

Turning to signal path 92, in row Rn, signal path 92 is provided on line M1 in track M. In rows Rn and Rn+1, signal path 92 listened to through an HIO listening buffer 914 coupled to line M1 by connections 901 in each row as shown. In row Rn+1, signal path 92 stitches from line M1 in track M to line K2 in track K as follows: it is coupled by a connection 901 through listening buffer 914 as shown; another connection 901 couples the signal path 92 to a stitching line 961 as shown. Mux 942 (row Rn+1) is programmable to select the stitching line 961 as input and provides output to a buffer 932 as shown. Buffer 932 in turn is coupled to provide the signal path to line K2 in track K through a connection 901 as shown.

Signal path 92 continues on line K2 through rows Rn+2, Rn+3, Rn+4, and row Rn+5 to row Rn+6. In row Rn+2 it is listened to through a listening buffer 912 coupled to line K2 by a connection 901 as shown. In rows Rn+3, Rn+4, Rn+5, and Rn+6, it is listened to through a listening buffer 914 coupled to line K2 in each row by a connection 901 as shown. In row Rn+6, path 92 stitches from line K2 in track K to line P2 in track P as follows: it is coupled by a connection 901 through listening buffer 914 as shown; another connection 901 couples the signal path 92 to a stitching line 961 as shown. Mux 943 (row Rn+6) is programmable to select the stitching line 961 as input and provides output to a buffer 933 as shown. Buffer 933 in turn is coupled to provide the signal path to line P2 in track P through a connection 901 as shown.

Signal path 92 continues on line P2 through rows Rn+7 and Rn+8. In spare row Rn+7, it is not listened to. In row Rn+8 it is listened to through a listening buffer 911 coupled to line P2 by a connection 901 as shown.

Additional connections 901 provide options for signal path 92 to receive signals in normal mode operation from HIO circuitry portion 920 in rows Rn+2 (through a buffer 932), Rn+3 (through a buffer 932) and Rn+8 (through a buffer 933) as shown.

Turning to signal path 93, in row Rn, signal path 93 is provided on line N1 in track N. In rows Rn, Rn+1, and Rn+2 signal path 93 listened to through an HIO listening buffer 915 coupled to line N1 in each row by a connection 901 as shown. In row Rn+2, signal path 93 stitches from line N1 in track N to line L2 in track L as follows: it is coupled by a connection 901 through a listening buffer 915 as shown; another connection 901 couples the signal path 93 to a stitching line 961 as shown. Mux 943 (row Rn+2) is programmable to select the stitching line 961 as input and provides output to a buffer 933 as shown. Buffer 933 in turn is coupled to provide the signal path to line L2 in track L through a connection 901 as shown.

Signal path 93 continues on line L2 through rows Rn+3, Rn+4, Rn+5, Rn+6, and Rn+7 to row Rn+8. In row Rn+3 path 93 is listened to through a listening buffer 911 coupled to line L2 by a connection 901 as shown. In rows Rn+4, Rn+5, Rn+6, and row Rn+8, it is listened to through a listening buffer 915 coupled to line L2 in each row by a connection 901 as shown. In spare row Rn+7, it is not listened to. In row Rn+8, path 92 stitches from line L2 in track L to line J2 in track J as follows: it is coupled by a connection 901 through listening buffer 915 as shown; another connection 901 couples the signal path 93 to a stitching line 961 as shown. Mux 944 (row Rn+8) is programmable to select the stitching line 961 as input and provides output to a buffer 934 as shown. Buffer 934 in turn is coupled to provide the signal path to line J2 in track J through a connection 901 as shown.

Additional connections 901 provide options for signal path 93 to receive signals in normal mode operation from HIO circuitry portion 920 in rows Rn+3 (through a buffer 933) and Rn+4 (through a buffer 933) as shown.

Turning to signal path 94, in row Rn, signal path 94 is provided on line O1 in track O. In rows Rn, Rn+1, Rn+2, and Rn+3 signal path 94 listened to through an HIO listening buffer 916 coupled to line O1 in each row by a connection 901 as shown. In row Rn+3, signal path 94 stitches from line O1 in track O to line M2 in track M as follows: it is coupled by a connection 901 through a listening buffer 916 as shown; another connection 901 couples the signal path 94 to a stitching line 961 as shown. Mux 944 (row Rn+3) is programmable to select the stitching line 961 as input and provides output to a buffer 934 as shown. Buffer 934 in turn is coupled to provide the signal path to line M2 in track M through a connection 901 as shown.

Signal path 94 continues on line M2 through rows Rn+4, Rn+5, Rn+6, Rn+7, and row Rn+8. In row Rn+4 path 94 is listened to through a listening buffer 912 coupled to line M2 by a connection 901 as shown. In rows Rn+5 Rn+6, and row Rn+8, it is listened to through a listening buffer 916 coupled to line M2 in each row by a connection 901 as shown. In spare row Rn+7, it is not listened to.

Additional connections 901 provide options for signal path 94 to receive signals in normal mode operation from HIO circuitry portion 920 in rows Rn (through a buffer 933), Rn+4 (through a buffer 934), and Rn+5 (through a buffer 934) as shown.

Turning to signal path 95, in row Rn, signal path 95 is provided on line P1 in track P. In rows Rn+1, Rn+2, Rn+3, and Rn+4 signal path 95 listened to through an HIO listening buffer 917 coupled to line P1 in each row by a connection 901 as shown. In row Rn+4, signal path 95 stitches from line P1 in track P to line N2 in track N as follows: it is coupled by a connection 901 through a listening buffer 917 as shown; another connection 901 couples the signal path 95 to a stitching line 961 as shown. Mux 941 (row Rn+4) is programmable to select the stitching line 961 as input and provides output to a buffer 931 as shown. Buffer 931 in turn is coupled to provide the signal path to line N2 in track N through a connection 901 as shown.

Signal path 95 continues on line N2 through rows Rn+5, Rn+6, Rn+7, and row Rn+8. In row Rn+5 path 94 is listened to through a listening buffer 911 coupled to line N2 by a connection 901 as shown. In rows Rn+6 and row Rn+8, it is listened to through a listening buffer 917 coupled to line N2 in each row by a connection 901 as shown. In spare row Rn+7, it is not listened to.

Additional connections 901 provide options for signal path 95 to receive signals in normal mode operation from HIO circuitry portion 920 in rows Rn (through a buffer 934), Rn+1 (through a buffer 934), Rn+5 (through a buffer 931), and Rn+6 (through a buffer 931) as shown.

Figure 16:
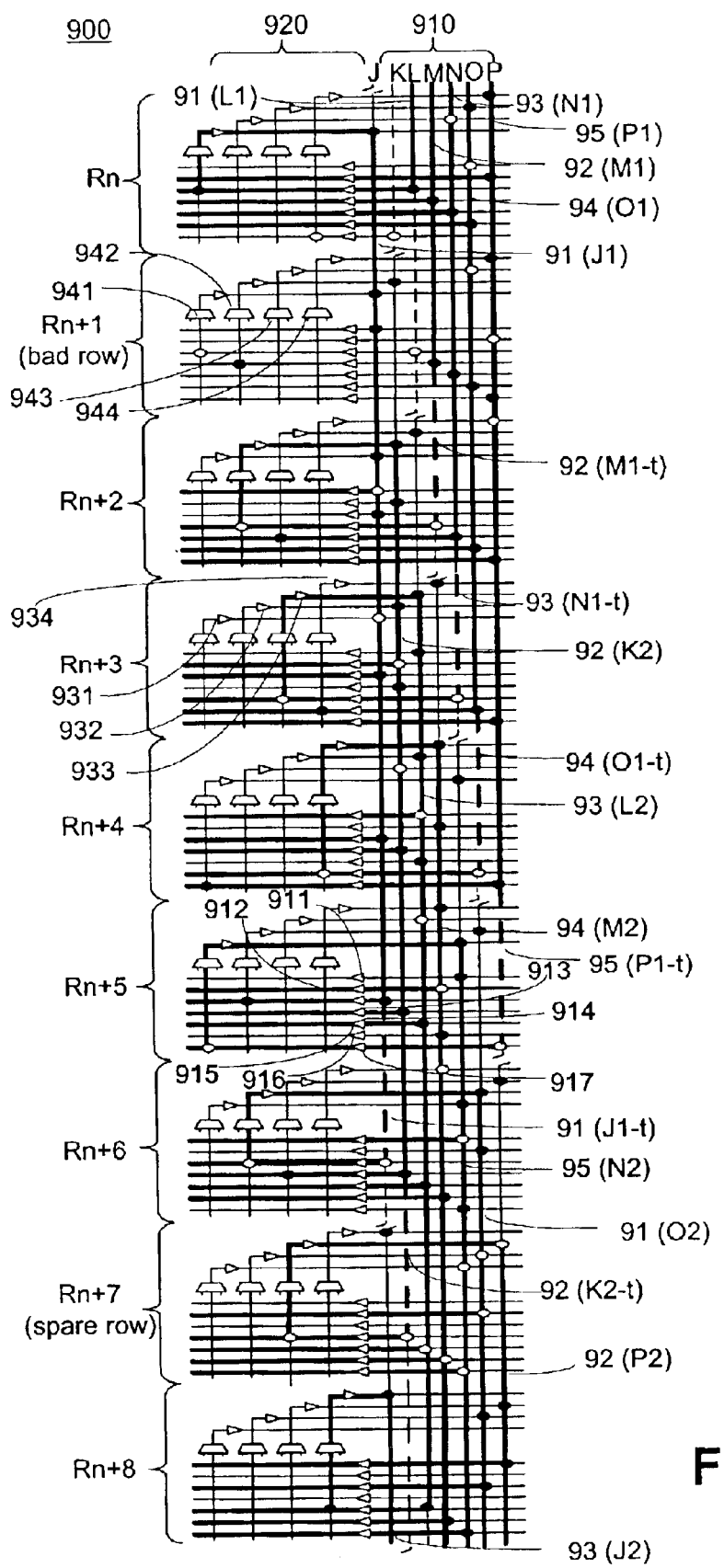
FIG. 16 illustrates the HIO bus portion and additional circuitry of FIG. 14 configured to provide redundant mode signal paths corresponding to the normal mode signal paths of FIG. 15 using redundant circuitry when a bad row exists.

FIG. 16 illustrates the HIO circuitry portion 900 of FIG. 14 configured to provide redundant mode versions of the signal paths illustrated in FIG. 15 to repair a bad row Rn+1. As illustrated in FIG. 16, when redundant mode operation is engaged, each connection from row to row between a bad row Rn+1 and a spare row Rn+7 is such that normal mode and redundant mode connections in a particular row are utilized to provide redundancy for a normal mode connection in the row above the particular row. This will now be described in more detail, first in regard to stitching connections, then in regard to connections for HIOs to listen to the HIO bus, and finally in regard to output connections for the HIO bus to listen to HIO outputs.

In row Rn, signal paths are provided on the same tracks as were provided in the normal mode operation illustrated in FIG. 15. In row Rn+1, listening buffers 911–917 are not listened to. HIO buffers 931–934 are tristated in bad row Rn+1 for redundant mode operation and do not drive the HIO bus.

As illustrated in FIG. 16, beginning in row Rn+1 and continuing to spare row Rn+7, stitching connections in redundant mode operation are shifted downwardly relative to normal mode operation as follows:

Instead of stitching from line M1 to line K2 in row Rn+1, signal path 92 utilizes tail M1-*t* to connect for stitching to line K2 in row Rn+2. Tail M1-*t* is coupled by a redundant mode connection 902 to a listening buffer 914 in row Rn+2 which is coupled by a connection 902 to a stitching line 961 which may be programmably selected by a mux 942 (in row Rn+2) to provide signal path 92 to an HIO output buffer 932 which is coupled by a connection 901 to line K2 as shown.

Instead of stitching from line N1 to line L2 in row Rn+2, signal path 93 utilizes tail N1-*t* to connect for stitching to line L2 in row Rn+3. Tail N1-*t* is coupled by a redundant mode connection 902 to a listening buffer 915 in row Rn+3 which is coupled by a connection 902 to a stitching line 961 which may be programmably selected by a mux 943 (in row Rn+3) to provide signal path 93 to an HIO output buffer 933 which is coupled by a connection 901 to line L2 as shown.

Instead of stitching from line O1 to line M2 in row Rn+4, signal path 94 utilizes tail O1-*t* to connect for stitching to line M2 in row Rn+3. Tail O1-*t* is coupled by a redundant mode connection 902 to a listening buffer 916 in row Rn+4 which is coupled by a connection 902 to a stitching line 961 which may be programmably selected by a mux 944 (in row Rn+4) to provide signal path 94 to an HIO output buffer 934 which is coupled by a connection 901 to line M2 as shown.

Instead of stitching from line P1 to line N2 in row Rn+4, signal path 95 utilizes tail P1-*t* to connect for stitching to line N2 in row Rn+5. Tail P1-*t* is coupled by a redundant mode connection 902 to a listening buffer 917 in row Rn+5 which is coupled by a connection 902 to a stitching line 961 which may be programmably selected by a mux 941 (in row Rn+5) to provide signal path 95 to an HIO output buffer 931 which is coupled by a connection 901 to line N2 as shown.

Instead of stitching from line J1 to line O2 in row Rn+5, signal path 91 utilizes tail J1-*t* to connect for stitching to line O2 in row Rn+6. Tail J1-*t* is coupled by a redundant mode connection 902 to a listening buffer 913 in row Rn+6 which is coupled by a connection 902 to a stitching line 961 which may be programmably selected by a mux 942 (in row Rn+6) to provide signal path 91 to an HIO output buffer 932 which is coupled by a connection 901 to line O2 as shown.

Instead of stitching from line K2 to line P2 in row Rn+6, signal path 92 utilizes tail K2-*t* to connect for stitching to line P2 in spare row Rn+7. Tail K2-*t* is coupled by a redundant mode connection 902 to a listening buffer 914 in row Rn+7 which is coupled by a connection 902 to a stitching line 961 which may be programmably selected by a mux 943 (in row Rn+7) to provide signal path 92 to an HIO output buffer 933 which is coupled by a connection 902 to line P2 as shown.

In row Rn+8, connections remain the same as in normal mode operation. Row Rn+7 is a spare row and does not need normal mode connections; row Rn+8 is not utilized to replace row Rn+7 in a redundant mode.

As further illustrated in FIG. 16, from rows Rn+1 to Rn+7, listening pathways also shifted down relative to normal mode operation. As illustrated, connections 901 and 902 provide redundant mode options for the HIO listening pathways already described that exist in normal mode operation. Beginning with signal path 91, instead of being listened to from line J1 by a buffer 911 in row Rn+1 and buffers 913 in, respectively, rows Rn+2, Rn+3, Rn+4, and Rn+5 via respective connections 901 as in normal mode operation, signal path 91 is, in redundant mode operation, listened to from line J1 by a buffer 911 in row Rn+2 (via a connection 902), and by buffers 913 in, respectively, rows Rn+3 (via a connection 901), Rn+4(via a connection 901), and Rn+5 (via a connection 901), and, from tail J1-*t*, by a buffer 913 in row Rn+6 (via a connection 902) as illustrated. Further, instead of being listened to from line O2 by a buffer 912 in row Rn+6 via a connection 901 as in normal mode operation, signal path 91 is, in redundant mode, listened to by a buffer 912 in spare row Rn+7 via a connection 902 as illustrated.

Turning to signal path 92, instead of being listened to from line M1 by a buffer 914 in row Rn+1 via a connection 901 as in normal mode operation, signal path 92 is, in redundant mode operation, listened to from tail M1-*t* by a buffer 914 in row Rn+2 (via a connection 902). Further, instead of being listened to from line K2 by a buffer 912 in row Rn+2 via a connection 901 as in normal mode operation, signal path 92 is, in redundant mode, listened to by a buffer 912 in row Rn+3 via a connection 902 as illustrated. Instead of being listened to from line K2 by buffers 914 in, respectively, rows Rn+3, Rn+4, Rn+5, and Rn+6 via respective connections 901 as in normal mode operation, signal path 92 is, in redundant mode operation, listened to from line K2 by buffers 914 in, respectively, row Rn+4, Rn+5, and Rn+6 via respective connections 901 and from tail K2-*t* by a buffer 914 in spare row Rn+7 via a connection 902 as illustrated.

Turning to signal path 93, instead of being listened to from line N1 by a buffer 915 in, respectively, row Rn+1 and Rn+2 via respective connections 901 as in normal mode operation, signal path 93 is, in redundant mode operation, listened to from line N1 by a buffer 915 in row Rn+2 via a connection 901 and from tail N1-*t* by a buffer 915 in row Rn+3 via a connection 902 as illustrated. Further, instead of being listened to from line L2 by a buffer 911 in row Rn+3 via a connection 901 as in normal mode operation, signal path 93 is, in redundant mode, listened to by a buffer 911 in row Rn+4 via a connection 902 as illustrated. Instead of being listened to from line L2 by buffers 915 in, respectively, rows Rn+4, Rn+5, and Rn+6 by respective connections 901 as in normal mode operation, signal path 93 is listened to from line L2 by buffers 915 in, respectively, rows Rn+5 and Rn+6 by respective connections 901 and from tail L2-*t* by a buffer 915 in spare row Rn+7 via a connection 902.

Turning to signal path 94, instead of being listened to from line O1 by buffers 916 in, respectively, rows Rn+1, Rn+2, and Rn+3, via respective connections 901 as in normal mode operation, signal path 94 is, in redundant mode operation, listened to from line O1 by buffers 916 in, respectively, rows Rn+2 and Rn+3 via respective connections 901 and, from tail O1-*t*, by a buffer 916 in row Rn+4 via a connection 902. Further, instead of being listened to from line M2 by a buffer 912 in row Rn+4 via a connection 901 as in normal mode operation, signal path 94 is, in redundant mode, listened to by a buffer 912 in row Rn+5 via a connection 902 as illustrated. Instead of being listened to from line M2 by buffers 916 in, respectively, rows Rn+5 and Rn+6 as in normal mode operation, signal path 94 is, in redundant mode operation, listened to from line M2 by buffers 916 in, respectively, row Rn+6 via a connection 901 and spare row Rn+7 via a connection 902 as shown.

Turning to signal path 95, instead of being listened to from line P1 by buffers 917 in, respectively, rows Rn+1, Rn+2, Rn+3, and Rn+4 via respective connections 901 as in normal mode operation, signal path 95 is, in redundant mode operation, listened to from line P1 by buffers 917 in, respectively, rows Rn+2, Rn+3, and Rn+4 via respective connections 901 and, from tail P1-*t*, by a buffer 917 in row Rn+5 via a connection 902. Further, instead of being listened to from line N2 by a buffer 911 in row Rn+5 via a connection 901 as in normal mode operation, signal path 95 is, in redundant mode, listened to from line N2 by a buffer 911 in row Rn+6 via a connection 902 as illustrated. Instead of being listened to from line N2 by a buffer 917 row Rn+6 via a connection 901 as in normal mode operation, signal path 95 is, in redundant mode operation, listened to from line N2 by a buffer 917 in spare row Rn+7 via a connection 902 as shown.

Now turning to connections 901 and 902 providing options, in addition to those already described in the context of stitching, for signal paths 91–95 to receive signals from HIO circuitry portion 920 through output buffers 931–934: From row to row, connections 901 and 902 provide redundancy for connections 901 in a previous row providing options for signal paths in HIO bus portion 910 to receive signals from HIO output drivers 931–934. In row Rn+2, a connection 901 and a connection 902 provide redundant pathways from, respectively, output buffers 931 and 934 to, respectively, signal paths 91 and 95 as illustrated in FIG. 16 which provide redundancy for connections 901 providing like pathways in row Rn+1 as illustrated in FIG. 15. In row Rn+3, a connection 902 and a connection 901 provide redundant pathways from, respectively, output buffers 931 and 932 to, respectively, signal paths 91 and 92 as illustrated in FIG. 16, which provide redundancy for connections 901 providing like pathways in row Rn+2 as illustrated in FIG. 15. In row Rn+4, a connection 902 and a connection 901 provide redundant pathways from, respectively, output buffers 932 and 933 to, respectively, signal paths 92 and 93 as illustrated in FIG. 16, which provide redundancy for connections 901 providing like pathways in row Rn+3 as illustrated in FIG. 15. In row Rn+5, a connection 902 and a connection 901 provide redundant pathways from, respectively, output buffers 933 and 934 to, respectively, signal paths 93 and 94 as illustrated in FIG. 16, which provide redundancy for connections 901 providing like pathways in row Rn+4 as illustrated in FIG. 15. In row Rn+6, a connection 902 and a connection 901 provide redundant pathways from, respectively, output buffers 934 and 931 to, respectively, signal paths 94 and 91 as illustrated in FIG. 16 which provide redundancy for connections 901 providing like pathways in row Rn+5 as illustrated in FIG. 15. In row Rn+7, connections 902 provide redundant pathways from, respectively, output buffers 931 and 932 to, respectively, signal paths 95 and 91 as illustrated in FIG. 16 which provide redundancy for connections 901 providing like pathways in row Rn+6 as illustrated in FIG. 15.

Redundant mode operation is obtained by providing programming data for output buffers 931–934, muxes 941–944 and additional IO muxes coupled to receive signals from listening buffers 911–917 in bad row Rn+1 (additional IO muxes are to the left of illustrated circuitry and are not separately shown) that deactivates that row; and redundant mode operation is further obtained by shifting the normal mode configuration data that would otherwise be provided for programmable elements in respective rows Rn+1 through Rn+6 (i.e. for output buffers 931–934, muxes 941–944 and the additional IO muxes not separately shown that are coupled to receive signals from listening buffers 911–917) down one row to program those elements in respective rows Rn+2 through Rn+7. As already explained, in alternative embodiments, connections such as pass gates might be substituted for illustrated connections 901 and 902 (which are hard wired) and programming data for such connections would then also be shifted in similar fashion. Also, in alternative embodiments, IO input buffers might be substituted for the illustrated buffers 911–917 and such substitute buffers may be provided as tristatable based on programming data which could then also be shifted.

Figure 17:
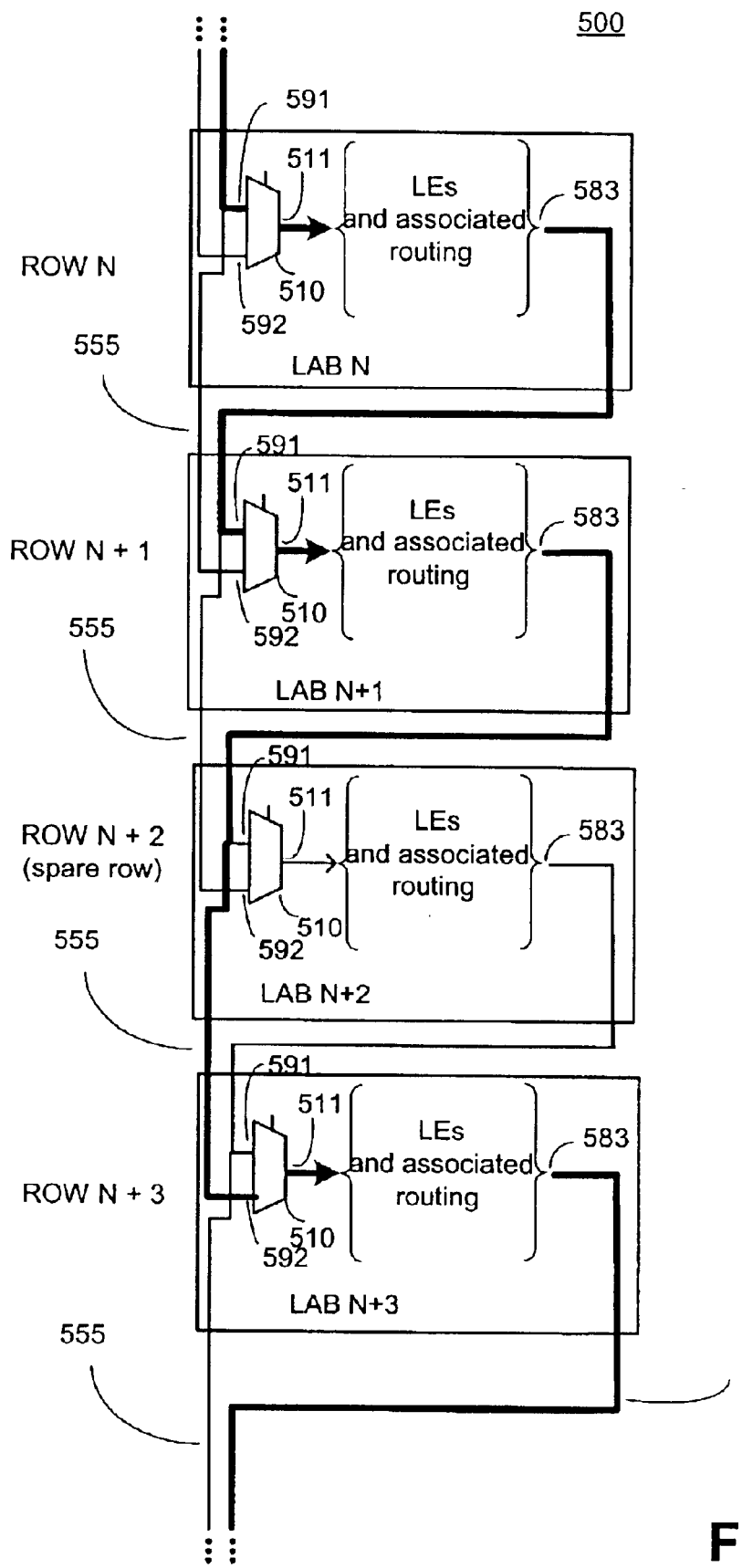
FIG. 17 illustrates a dedicated LAB-to-LAB routing architecture portion configured for normal mode operation in accordance with an aspect of the present invention.

FIG. 17 illustrates a LAB-to-LAB dedicated routing architecture portion 500 with redundant circuitry configured for normal mode operation in accordance with an embodiment of an aspect the present invention. Dedicated LAB-to-LAB routing may be utilized to perform carry chain functions or other functions. For example, such architectures allow a value to be operated on by one LAB's logic and then passed for further operation by another LAB's logic, and so on through a chain of multiple LABs.

LAB-to-LAB architecture portion 500 includes LABN, LABN+1, LABN+2, and LABN+3 provided in, respectively, logic region rows N, N+1, N+2, and N+3. Muxes 510 have outputs 511 coupled to the LEs and associated routing of LAB as shown. Muxes 510 have first inputs 591 and second inputs 592. First inputs 591 are coupled to outputs 583 of the LAB logic of an adjacent row. For example, first input 591 of the mux 510 in row N+1 is coupled to selectively receive signals from a logic in LABN of adjacent logic region row N. Second inputs 592 are coupled to selectively receive signals from outputs 583 of a logic region two rows away. For example, input 592 of mux 510 in row N+3 is coupled to selectively receive signals from an output 583 in row N+1 as shown.

Muxes 510 are programmable to select input from: an input 591, an input 592, or neither. In normal mode, this allows one or more spare rows to be defined without necessarily breaking the chain of dedicated LAB-to-LAB routing. In the example illustrated in FIG. 17, the muxes 510 have been programmed to define a path from LAB to LAB indicated by the bolded lines. In row N, the mux 510 selects input 591 and provides signals at that input to the LEs and associated routing of LABN. The logic of LABN may perform operations to generate an output at output 583. The output from output 583 in row N is then provided to at input 591 of the mux 510 in row N+1 which selects that input to provide to the logic (LEs and associated routing) of LABN+1. Row N+2 is defined as a spare row, and thus is bypassed in normal mode operation. The mux 510 in spare row N+2 is programmed to select neither input 591 nor input 592. The output from output 583 in LABN+1 is provide over path 555 to the input 592 of mux 510 in row N+3 which in turn selects that input 592 to provide to the logic of LABN+3.

Figure 18:
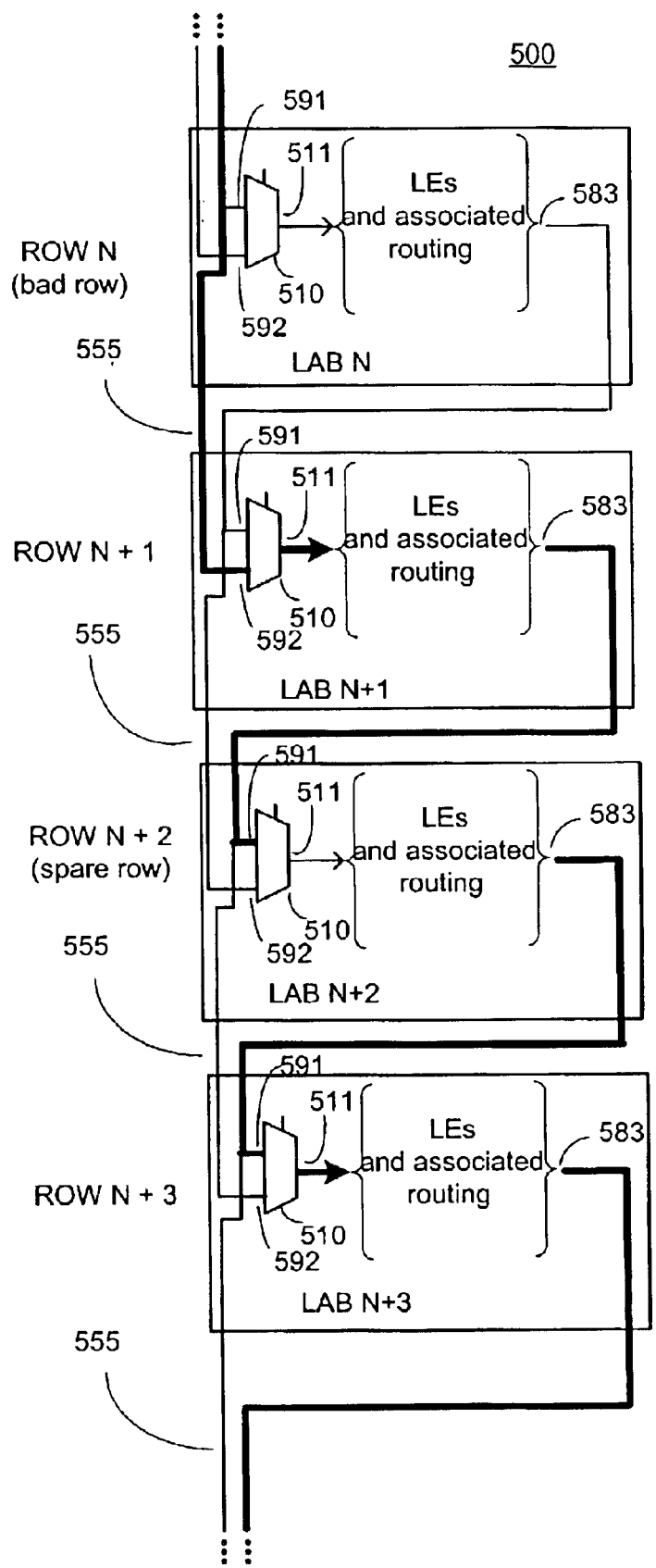
FIG. 18 illustrates the dedicated LAB-to-LAB routing architecture of FIG. 17 configured for redundant mode operation to bypass a bad row in a repairable region above a bad row.

FIG. 18 illustrates the architecture portion 500 of FIG. 17 configured to repair a row N. If row N is determined to be bad, then mux 510 in row N may be programmed to select neither input 591 and 592, and LABN may be bypassed by the architecture portion 500. Output from a LAB in a row above LABN (row above LABN not separately shown) is provided over pathway 555 to input 592 of mux 510 in row N+1 which selects that input to provide to the logic of LABN+1. The spare row N+2 is now programmed to be utilized. Output from output 583 in row N+1 is provided at input 591 of the mux 510 in row N+2 which is now programmed to select that input and provide it to logic in LABN+2. Output from output 583 of row N+2 is provided to input 591 of mux 510 in row N+3 which is programmed to select that input and provide it to logic in LABN+3.

Figure 19:
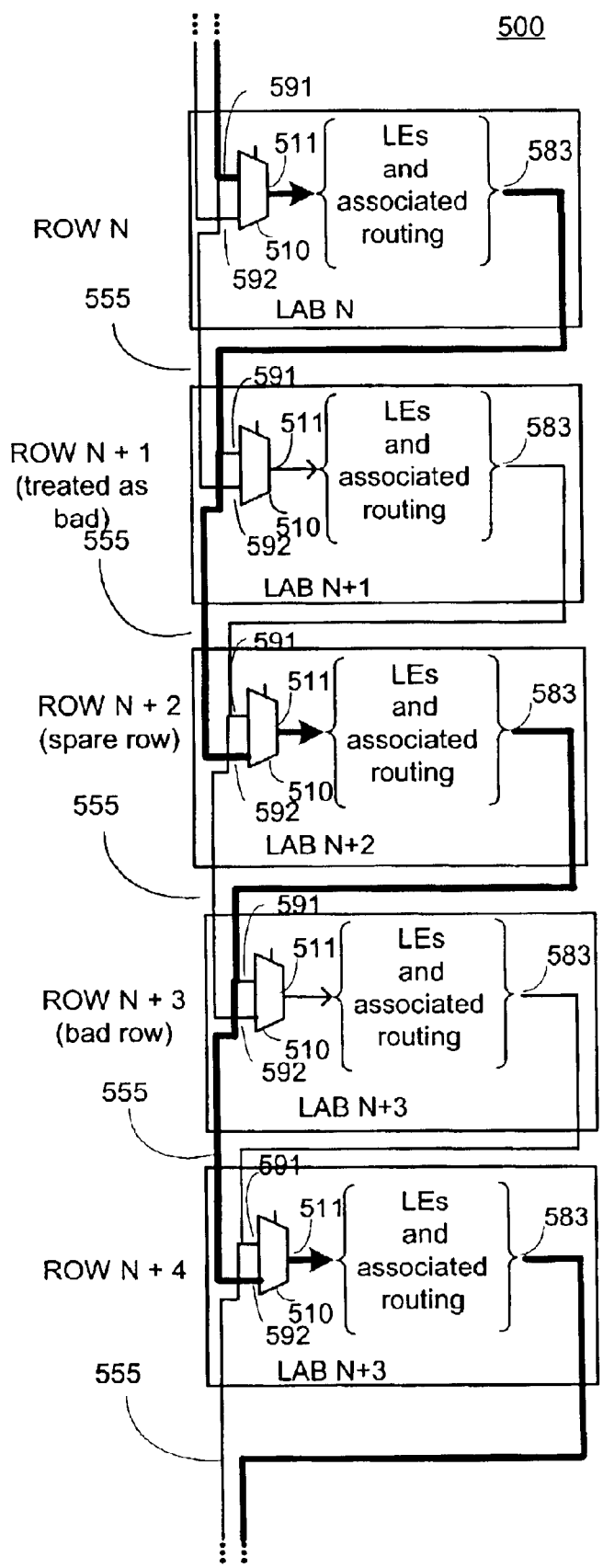
FIG. 19 illustrates the dedicated LAB-to-LAB routing architecture of FIG. 17 configured to accommodate a bad row in the row just below a spare row.

FIG. 19 illustrates architecture 500 configured to accommodate repair of a bad row in row N+3 when the repairable region defined above row N+2 does not necessarily have a row that is bad. Row N+3 is bad, and therefore, in redundant mode operation, is bypassed by programming the multiplexor 510 in row N+3 to select neither input 591 nor input 592. Since there is no actual bad row in the repairable region defined above spare row N+2, that row would otherwise be programmed for normal mode operation in which it is bypassed. However, when the row below spare row N+2 is bad, programming the repairable region defined above spare row N+2 to utilized spare row N+2, allows for the architecture portion 500 to bypass bad row N+3 without requiring additional routing to bypass two adjacent rows in the LAB-to-LAB routing chain. In the example illustrated in FIG. 19, row N+1 is treated as bad, even though it is not actually bad. Row N+1 is bypassed and the mux 510 in row N+1 selects neither input 591 nor 592. Mux 510 in spare row is programmed to select input 592 which is coupled to receive signals from output 583 in row N. In row N+2, input at input 592 is provided to logic in LABN+2 as shown. Row N+3 is bypassed and the mux 510 in row N+3 is programmed to select neither input 591 nor 592. Mux 510 in row N+4 is programmed to select input from input 592 which is couple to receive signals from output 583 in spare row N+2.

The illustrated embodiment in FIGS. 17–19 provides signals downstream, i.e., provided from row to row with the row shift direction. However, alternative embodiments may provide signals upstream, i.e., provided from row to against the row shift direction. Those skilled in the art will appreciate minor modifications to the connections illustrated in FIGS. 17–19 will provide such upstream arrangements.

As another example alternative, routing may be provided to selectively skip more than one adjacent bad row. For example, in an alternative embodiment, multiplexors might be provided that have more inputs than muxes 510 of architecture 500 and those additional inputs might, for example, be coupled to logic outputs from three rows away, while still providing inputs that might be selected to receive signals from logic outputs either two rows away or from an adjacent row.

Also, it may be preferred to modify the embodiment of FIGS. 17–19 so that muxes 510 simply listen to one input, e.g., input 592, for spare rows in normal mode operation and bad rows in redundant mode operation, rather than selecting neither input. Because logic elements in such rows will ordinarily be set to idle by the PLD's configuration elements, muxes 510 in such rows are not providing outputs to activated elements in any event. Such control logic may be less costly to implement than providing for neither input to be selected, and thus may be preferred.

Figure 20:
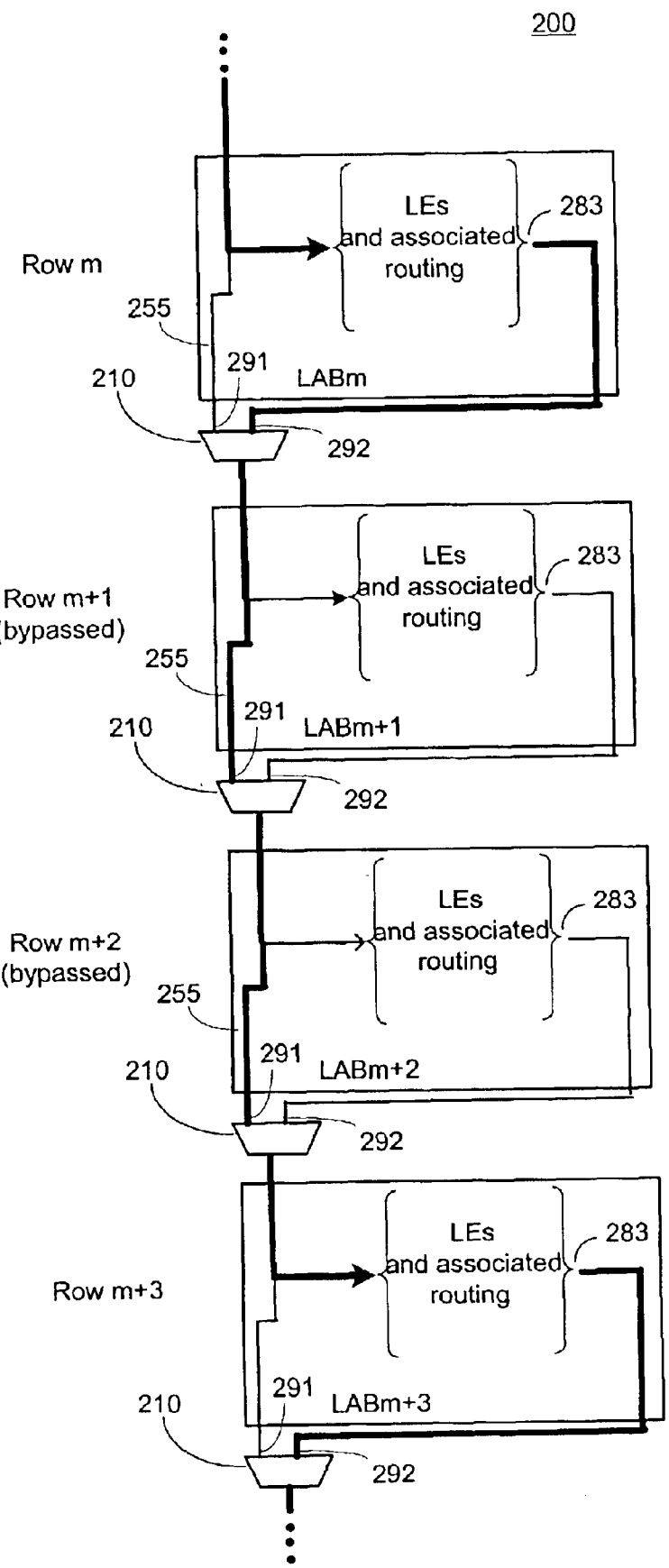
FIG. 20 illustrates an alternative embodiment of a dedicated LAB-to-LAB routing architecture in accordance an aspect f the present invention.

FIG. 20 illustrates a LAB-to-LAB routing architecture portion 200 which provides the ability to bypass an arbitrary number of spare rows in a LAB-to-LAB chain. In the illustrated example, architecture portion 200 is configured to bypass two rows.

LAB-to-LAB architecture portion 200 includes LABm, LABm+1, LABm+2, and LABm+3 provided in, respectively, logic region rows m, m+1, m+2, and m+3. Muxes 210 have inputs 291, 292, and outputs 211. Inputs 291 are coupled as shown to receive signals from outputs 283 of logic in LABs m, m+1, m+2, and m+3. Mux outputs 211 are coupled to provide output to both the logic of a LAB in the next row, and to another mux 210 in the next row at input 292 as shown.

As configured, the mux 210 coupled to receive output from output 283 in LABm is programmed to select its input 291. However, the muxes 210 respectively coupled to receive output from outputs 283 in, respectively, LABm+1 and LABm+2 are both programmed to select their respective inputs 292. Thus, the output of the mux 210 just above row m+3 provides to the logic of LABm+3 signals generated at the output 283 of LABm in row m. In this manner, two rows may be bypassed in a chain of dedicated LAB-to-LAB routing. Those skilled in the art will appreciate that, by modifying the programming of muxes 210 in architecture portion 200, a greater or lesser number of rows may be bypassed in the dedicated LAB-to-LAB routing.

The illustrated embodiment in FIG. 20 provides signals downstream, i.e., provided from row to row with the row shift direction. However, alternative embodiments may provide signals upstream, i.e., provided from row to against the row shift direction. Those skilled in the art will appreciate minor modifications to the connections illustrated in FIG. 20 will provide such upstream arrangements.

It will be appreciated by those skilled in the art that the various aspects of the invention illustrated herein may be implemented as part of larger electronic systems including one or several different devices.

Although embodiments of the present invention have been described in the context of a programmable logic device having a row-based redundancy scheme, the invention is equally applicable to programmable logic devices using column-based redundancy schemes. Because the terminology of rows and columns is relative to the orientation of the device, in a typical device having rows and columns perpendicular to each other, one may interchange the words row and column by merely rotating a device by 90 degrees. For clarity, the present invention is described and claimed in terms of row-based arrangements, but the present description and claims apply equally to column-based redundancy arrangements.

Furthermore, although the term "row" is typically associated with a straight-line arrangement of items, alternative embodiments may employ row arrangements that are curved, or partially curved, or that have occasional jogs or gaps without necessarily departing for the spirit and scope of the present inventions. Devices including such rows may still have a routing architecture including a plurality of signal paths each of which spans a plurality of rows and accommodates a redundancy scheme that is within the scope of the present invention.

What is claimed is:

1. A programmable logic device comprising:

a plurality of signal paths, each spanning a plurality of logic region rows and each including a plurality of lines;

normal mode stitching circuitry coupling first lines of signal paths to second lines of the signal paths; and redundant mode stitching circuitry coupling tails of the first lines of the signal paths to the second lines of the signal paths.

2. The programmable logic device of claim 1 further comprising:

first sets of connections including at least one normal mode connection, the first sets of connections coupling the first lines of the signal paths to drive logic region rows; and second sets of redundant-mode-only connections including at least one redundant-mode-only connection, the second sets of connections coupling the tails of the first lines of the signal paths to drive other logic region rows, the second sets of connections being redundant for the first sets of connections.

3. The programmable logic device of claim 1 further comprising:

first sets of connections including at least one normal mode connection coupling respective logic region rows to drive the signal paths; and second sets of connections including at least one redundant mode connection, the second sets of connections coupling other logic region rows to drive the signal paths, the second sets of connections being redundant for the first sets of connections.

4. The programmable logic device of claim 3 wherein all connections in the second sets of connections are redundant-mode-only connections.

5. The programmable logic device of claim 1 wherein the normal mode stitching circuitry includes stitching multiplexors and stitching drivers of the signal paths mad the redundant mode stitching circuitry includes redundant mode stitching multiplexors and redundant mode stitching drivers of the signal paths.

6. The programmable logic device of claim 5 wherein:

the signal paths are first signal paths; and the redundant stitching multiplexors of the first signal paths are also stitching multiplexors of second signal paths.

7. The programmable logic device of claim 1 wherein:

a redundant mode of the programmable logic device has a row shift direction;

some of the plurality of signal paths are downstream with the row shift direction; and others of the plurality of signal paths are upstream against the row shift direction.

8. The programmable logic device of claim 7 wherein:

the normal mode stitching circuitry includes stitching multiplexors and stitching drivers of the signal paths and the redundant mode stitching circuitry includes redundant mode stitching multiplexors and redundant mode stitching drivers of the signal paths;

in a first row, a stitching driver of an upstream signal path and a redundant stitching driver of a downstream signal path are coupled to an output of a first multiplexor, the first multiplexor being a stitching multiplexor of the upstream signal path and a redundant stitching multiplexor of the downstream signal path; and in a second row a stitching driver of the downstream signal path and a redundant stitching driver of the upstream signal path are coupled to an output of a second multiplexer, the second multiplexor being a stitching multiplexor of the downstream signal path and being a redundant stitching multiplexor of the upstream signal path.

9. The programmable logic device of claim 8 wherein the first row is adjacent to the second row.

10. The programmable logic device of claim 3 wherein the normal mode stitching circuitry includes stitching multiplexors and stitching drivers of the signal paths and the redundant mode stitching circuitry includes redundant mode stitching multiplexors and redundant mode stitching drivers of the signal paths.

11. The programmable logic device of claim 10 wherein:

the signal paths are first signal paths; and the redundant stitching multiplexors of the first signal paths are also stitching multiplexors of second signal paths.

12. The programmable logic device of claim 11 wherein at least some of the redundant mode connections of the fourth sets of connections are also normal mode connections coupled to drive the second signal paths through the redundant stitching multiplexors of the first signal paths.

13. A method of providing routing and row-redundancy in a programmable logic device comprising:

providing signal paths spanning multiple rows of logic regions, the signal paths being segmented into multiple lines within at least one repairable region;

providing a spare row at the bottom of a repairable region of rows;

providing circuitry coupled to utilize the programmable logic device without relying on the spare row in a normal mode of operation;

providing circuitry coupled to utilize the spare row and bypass a bad in the repairable region in a redundant mode of operation; and providing tail portions of first ones of the multiple lines coupling the first ones of the multiple lines to second ones of the multiple lines through redundant stitching circuitry such that stitching is shifted within at least a portion of the repairable region below the bad row in the redundant mode of operation.

14. The method of claim 13 further comprising:

providing first connections from row to row of at least certain of the rows in the repairable region;

wherein:

the first connections couple signal paths to drive logic resources in at least certain of the rows; and a pattern of the first connections from row to row of the at least certain of the rows have an overlap such that at least some of the first connections in one row are redundant for at least some of the first connections in another row.

15. The method of claim 13 further comprising:

providing first connections from row to row of at least certain of the rows in the repairable region;

wherein:

the first connections couple logic resources in the at least certain of the rows to drive signal paths; and a pattern of the first connections from row to row of the at least certain of the rows have an overlap such that at least some of the first connections in one row are redundant for at least some of the first connections in another row.

16. A programmable logic device comprising:

interconnect means including vertical lines segmented within a repairable region;

logic regions;

means for coupling the interconnect means to the logic regions;

first means for switching between vertical lines of the interconnect means in a normal mode; and second means for switching between vertical lines of the interconnect means in a redundant mode.

17. The programmable logic device of claim 16 wherein the means for coupling the interconnect moans to the logic regions includes first coupling means for driving logic regions from the interconnect means and second coupling means for driving the interconnect from the logic regions, a pattern of the first and second means for coupling from row to row being such that at least same connections in one row provide redundancy for at least some connections in another row.

18. A programmable logic device comprising:

a plurality of lines, each spanning a plurality of logic region rows;

first sets of connections including at least one normal mode connection, the first sets of connections coupling the lines to drive logic region rows; and second sets of connections including at least one redundant-mode-only connection, the second sets of connections coupling tails of the first lines to drive other logic region rows, the second sets of connections being redundant for the first sets of connections.

19. The programmable logic device of claim 18 wherein the plurality of lines includes first lines and second lines, the programmable logic device further comprising:

normal mode stitching circuitry coupling the first lines from first positions on the first lines to the second lines to provide normal mode signal paths; and redundant mode stitching circuitry coupling the first lines from second positions on the first lines to the second lines to provide signal paths redundant for the normal mode signal paths.

20. The programmable logic device of claim 19 wherein the plurality of lines further includes third lines, the programmable logic device further comprising:

additional normal mode stitching circuitry coupling the first lines from third positions on the first lines to third lines to provide additional normal mode signal paths; and additional redundant mode stitching circuitry coupling the first lines from fourth positions on the first lines to the third lines to provide additional signal paths redundant for the additional normal mode signal paths.

21. The programmable logic device of claim 20 wherein the first and third positions on the first lines are the same and wherein the second and fourth positions on the first lines are the same.

22. A programmable logic device comprising:

a plurality of lines, each spanning a plurality of logic region rows, the plurality of lines including first lines and second lines;

first sets of connections including at least one normal mode connection coupling logic region rows to drive the first lines; and second sets of connections including at least one redundant mode connection, the second sets of connections coupling other logic region rows to drive the second lines, the second sets of connections being redundant for the first sets of connections.

23. The programmable logic device of claim 22 further comprising:

normal mode stitching circuitry coupling the first lines from first positions on the first lines to the second lines to provide normal mode signal paths; and redundant mode stitching circuitry coupling the first lines from second positions on the first lines to the second lines to provide signal paths redundant for the normal mode signal paths.

24. The programmable logic device of claim 23 wherein the plurality of lines further includes third lines, the programmable logic device further comprising:

additional normal mode stitching circuitry coupling the first lines from third positions on the first lines to third lines to provide additional normal mode signal paths; and additional redundant mode stitching circuitry coupling the first lines from fourth positions on the first lines to the third lines to provide additional signal paths redundant for the additional normal mode signal paths.

25. The programmable logic device of claim 24 wherein the first and third positions on the first lines are the same and wherein the second and fourth positions on the first lines are the same.

26. A method of providing routing and row-redundancy in a programmable logic comprising:

providing signal paths spanning multiple rows of logic regions, the signal paths being segmented into multiple lines within at least one repairable region;

providing a spare row at the bottom of a repairable region of rows;

providing circuitry coupled to utilize the programmable logic device without relying on the spare row in a normal mode of operation;

providing circuitry coupled to utilize the spare row and bypass a bad in the repairable region during a redundant mode of operation; and providing first connections from row to row of at least certain of the rows in the repairable region;

wherein:

the first connections couple signal paths to drive logic resources in at least certain of the rows; and a pattern of the first connections from row to row of the at least certain of the rows have an overlap such that at least some of the first connections in one row are redundant for at least some of the first connections in another row.

27. The method of claim 26 further comprising:

providing second connections from row to row of at least certain of the rows in the repairable region;

wherein:

the second connections couple logic resources in the at least certain of the rows to drive signal paths; and a pattern of the second connections from row to row of the at least certain of the rows have an overlap such that at least some of the first connections in one row are redundant for at least some of the first connections in another row.

28. A method of providing routing and row-redundancy in a programmable logic comprising:

providing signal paths spanning multiple rows of logic regions, the signal paths being segmented into multiple lines within at least one repairable region;

providing a spare row at the bottom of a repairable region of rows;

providing circuitry coupled to utilize the programmable logic device without relying on the spare row in a normal mode of operation;

providing circuitry coupled to utilize the spare row and bypass a bad in the repairable region during a redundant mode of operation; and coupling first lines of the multiple lines from first positions on the first lines to second lines of the multiple lines in a normal mode;

coupling the first lines from second positions on the first lines to the second lines in a redundant mode.

29. The method of claim 28 further comprising:

coupling the first lines to third lines.

30. The method of claim 29 wherein:

in the normal mode, the first lines are coupled to the third lines from third positions on the first lines; and in the redundant mode, the first lines are coupled to the third lines from fourth positions on the first lines.

31. The method of claim 30 wherein the first and third positions on the first lines are the same and the second and fourth positions on the first lines are the sane.

32. A programmable logic device comprising:

interconnect means including vertical lines segmented within a repairable region;

logic regions;

means for coupling the interconnect means to the logic regions;

wherein the means for coupling the interconnect means to the logic regions includes first coupling means for driving logic regions from the interconnect means and second coupling means for driving the interconnect means from the logic regions, a pattern of the first and second means for coupling from row to row being such that at least some connections in one row provide redundancy for at least some connections in another row.

33. A programmable logic device comprising:

a first signal path of a plurality of signal paths, each of the plurality of signal paths spanning a plurality of logic region rows and each comprising a plurality of lines, the first signal path comprising a plurality of lines including a first line and a second line;

first stitching circuitry coupling the first line to the second line;

first redundant stitching circuitry coupling a tall of the first line to the second line;

a first set of connections coupling the first line to routing resources of a first logic region row;

a second set of connections coupling the tail of the first line to routing resources of a second logic region row;

a second signal path spanning a plurality of logic region rows, the second signal path comprising a plurality of lines including a third line and a fourth line;

second stitching circuitry coupling the third line to the fourth line, at least a portion of the second stitching circuitry including at least a portion of the first redundant stitching circuitry;

second redundant stitching circuitry coupling a tail of the third line to the fourth line;

a third set of connections coupling the third line to routing resources of the second logic region row; and a fourth set of connections coupling the tall of the third line to routing resources of a third logic region row;

wherein:

a pattern of the second set of connections and a pattern of the first set of connections have an overlap such that connections of the second set are redundant for at least some of the connections of the first set; and a pattern of the fourth set of connections and a pattern of the third set of connections have an overlap such that connections of the fourth set are redundant for at least some of the connections of the third set.

34. The programmable logic device of claim 33 further comprising:

a third signal path spanning a plurality of logic region rows, the third signal path comprising a plurality of lines including a fifth line and a sixth line; and third stitching circuitry coupling the fifth line to the sixth line, at least a portion of the third stitching circuitry including at least a portion of the second redundant stitching circuitry.

35. The programmable logic device of claim 34 wherein:

the first stitching circuitry includes a first multiplexor coupled to a first driver, in input of the first multiplexor being coupled to the first line and an output of the first driver being coupled to the second line;

the first redundant stitching circuitry includes a first redundant multiplexor coupled to a first redundant driver, an input of the first redundant multiplexor being coupled to the tail of the first line and an output of the first redundant driver being coupled to the second line;

the second stitching circuitry includes a second multiplexer coupled to a second driver, an input of the second multiplexor being coupled to the third line and an output of the second driver being coupled to the fourth line, the second multiplexor being the first redundant multiplexor;

the second redundant stitching circuitry includes a second redundant multiplexor coupled to a second redundant driver, an input of the second redundant multiplexor being coupled to the tail of the third line and an output of the second redundant driver being coupled to the fourth line;

the third stitching circuitry includes a third multiplexor coupled to a third driver, an input of the third multiplexor being coupled to the fifth line and an output of the third driver being coupled the sixth line, the third multiplexer being the second redundant multiplexor.

36. The programmable logic device of claim 34 further comprising:

fifth set of connections coupling routing resources of the first logic region row to the first stitching circuitry;

a sixth set of connections coupling routing resources of the second logic region row to the first redundant stitching circuitry;

seventh set of connections coupling routing resources of the second logic region row to the second stitching circuitry; and an eighth set of connections coupling routing resources of the third logic region row to the second redundant stitching circuitry;

a pattern of the sixth set of connections and a pattern of the fifth set of connections having an overlap such that at least some of the connections of the sixth set are redundant for at least some of the connections of the fifth set; and a pattern of the eighth set of connections and a pattern of the seventh set of connections having an overlap such that at least some of the connections of the eighth set are redundant for at least some of the connections of the seventh set.

37. The programmable logic device of claim 36 wherein:

the routing resources coupled by the first set of connections and the routing resources coupled by the second set of connections are coupled to be driven by signals from the first signal path;

the routing resources coupled by the third set of connections and the routing resources coupled by the fourth set of connections are coupled to be driven by signals from the second signal path;

the routing resources coupled by the fifth set of connections and the routing resources coupled by the sixth set of connections are coupled to drive signals to the first or second signal path; and the routing resources coupled by the seventh set of connections and the routing resources coupled by the eighth set of connections are coupled to drive signals to the second or third signal path.

38. The programmable logic device of claim 37 wherein:

the overlap of the pattern of the sixth set of connections and the pattern of fifth set of connections is partial such that some of the connections of the sixth set are redundant for some of the connections of the fifth set; and the overlap of the pattern of the eighth set of connections and the pattern of seventh set of connections is partial such that some of the connections of the eighth set are redundant for some of the connections of the seventh set.

39. The programmable logic device of claim 33 wherein the first row is adjacent to the second row and the second row is adjacent to the third row.

40. A programmable logic device comprising:

normal mode moans for stitching between routing lines of one signal path; and redundant mode means for stitching between routing lines of another signal path;

wherein a portion of the normal mode means is also a portion of the redundant mode means.

41. A programmable logic device comprising:

a plurality of logic regions provided in rows of logic regions;

a plurality of horizontal channels provided in the rows of logic regions; and a plurality of vertical channels, each spanning a plurality of the rows of logic regions;

wherein:

a logic region of a first row is coupled by sets of normal mode connections to a first vertical channel, a second vertical channel, and a first horizontal channel of the first row;

a logic region in a second row is coupled by sets of redundant mode connections to the first vertical channel, the second vertical channel, and a first horizontal channel of the second row such that the sets of redundant mode connections are redundant for the sets of normal mode connections.

42. The programmable logic device of claim 41 wherein at least some connections in the groups of redundant mode connections are also normal mode connections.

43. The programmable logic device of claim 41 wherein the first row is adjacent to the second row.

44. A programmable logic device comprising:
3-sided routing means coupled to logic regions; and
redundant 3-sided routing means coupled to logic regions.

45. An integrated circuit comprising:
an array of logic resources arranged in rows and columns;
interconnect coupling at least some of the logic resources to each other, the interconnect including interconnect lines segmented within a repairable region of the integrated circuit;
redundant logic resources and redundant interconnect providing one or more repairable regions in which a portion of logic that does not function properly is replaceable.

46. The integrated circuit of claim 45 wherein, if a logic resource or interconnect of a row does not function properly, rendering the row a bad row, redundant resources and interconnect in rows from a spare row to the bad row accommodates shifting of rows to replace the bad row and utilize the spare row.

47. The integrated circuit of claim 45 wherein normal switching resources used to couple interconnect lines in normal operation are shared with redundant switching resources used to couple other interconnect lines in redundant operation.

48. The integrated circuit of claim 45 wherein the redundant interconnect includes tails of the interconnect lines that extend the physical length of the interconnect lines so that the logical length of the interconnect lines does not change from normal to redundant operation.

49. The integrated circuit of claim 46 wherein an arbitrary number of spare rows may be used to define an arbitrary number of repairable regions.

50. The integrated circuit of claim 45 wherein the interconnect is coupled to the logic resources on three sides to enable signals to be input to and output from the logic resources.

51. A method of providing routing and redundancy on an integrated circuit comprising:
providing interconnect coupling at least some logic resources of the integrated circuit to each other, the interconnect including interconnect lines segmented within a repairable region of the integrated circuit;
providing redundant logic resources and redundant interconnect providing one or more repairable regions;
determining whether or not any logic is not function properly; and
utilizing the redundant logic resources and redundant interconnect to replace logic that is not functioning properly.

52. The method of claim 51 wherein, if a logic resource or interconnect of a row does not function properly, rendering the row a bad row, utilizing the redundant logic resources and redundant interconnect comprises, from row to row from the bad row to a spare row:
shifting programming of rows one row away from the bad row and toward the spare row so that the same number of rows are provided in a redundant mode as in a normal mode; and
utilizing resources in each row that are redundant for resources in another row.

53. The method of claim 52 wherein utilizing the redundant logic resources and redundant interconnect further comprises, from row to row from the bad row to a spare row:
utilizing tails of first interconnect lines to shift connections between first interconnect lines and second interconnect lines in one row to another row.

54. The method of claim 51 wherein interconnect lines are arranged such that an arbitrary number of spare rows to replace circuitry of normal mode rows may be defined up to a limit by providing necessary redundant circuitry, the limit being equal to a number of normal mode rows in an array of resources on the integrated circuit.

55. A programmable logic device comprising:
a track bundle of a plurality of track bundles, the track bundle including a plurality of tracks, each track in the track bundle including a plurality of wires and each track in the track bundle spanning a plurality of logic region rows;
stitching circuitry coupling first wires in ones of the tracks in the truck bundle to second wires in other ones of the tracks in the track bundle to provide normal mode signal paths; and
redundant stitching circuitry coupling tails of the first wires in the ones of the tracks in the track bundle to the second wires in the other ones of the tracks in the track bundle to provide redundant mode signal paths corresponding to the normal mode signal paths.

56. The programmable logic device of claim 55 wherein:
the stitching circuitry is programmable to enable stitching along normal signal paths during normal mode operation of the programmable logic device and to not enable stitching along normal signal paths during redundant mode operation of the programmable logic device; and
the redundant stitching circuitry is programmable to not enable stitching along redundant signal paths during normal mode operation of the programmable logic device and to enable stitching along redundant signal paths during redundant mode operation of the programmable logic device.

57. The programmable logic device of claim 55 further comprising:
normal mode connections interposed between the first wires and the stitching circuitry; and
redundant mode connections interposed between the tails and the stitching circuitry;
wherein:
the normal mode connections are programmable to activate normal mode signal paths to stitching circuitry during normal mode operation of the programmable logic device; and
the redundant mode connections are programmable to activate redundant mode signal paths to redundant stitching circuitry during redundant mode operation of the programmable logic device.

58. The programmable logic device of claim 55 wherein a number of the tracks in the track bundle is at least one greater than a number of the normal mode signal paths.

59. The programmable logic device of claim 55 further comprising:
connections in logic region rows coupling at least some tracks in the track bundle to routing resources of the logic region rows;
wherein, from logic region row to logic region row within a repairable region of logic region rows, patterns of the connections have overlaps such that at least some connections coupling the track bundle to routing resources oh one logic region row are redundant for at least some connections coupling the track bundle to routing resources of a other logic region row.

60. The programmable logic device of claim 59 further comprising:
stubs provided in logic region rows coupling at least some tracks in the track bundle to the routing resources of the logic region rows via the connections.

61. The programmable logic device of claim 60 wherein at least some of the stubs also couple at least some tracks in the track bundle to stitching circuitry and at least some other of the stubs also couple at least some tracks in the track bundle to redundant stitching circuitry.

62. The programmable logic device of claim 61 wherein a number of the stubs in logic region rows is equal to at least one greater than a number of the normal mode signal paths.

63. The programmable logic device of claim 62 wherein the number of the stubs in logic region rows is equal to at least two greater than the number of the normal mode signal paths.

64. The programmable logic device of claim 61 wherein a number of the stubs in logic region rows is equal to at least a number of tracks in the track bundle.

65. The programmable logic device of claim 61 wherein a number of the stubs in logic region rows is equal to at least one greater than a number of tracks in the track bundle.

66. The programmable logic device of claim 59 wherein the connections include normal connections and redundant connections, redundant connections in one row being redundant for normal connections in another row.

67. The programmable logic device of claim 57 wherein redundant mode connections and at least some normal mode connections in one row are redundant for normal mode connections in another row.

68. The programmable logic device of claim 55 wherein the connections include connections coupled to drive the routing resources of the logic region rows with signals from the track bundle and connections coupled to drive the track bundle with signals from the routing resources of the logic region rows.

69. The programmable logic device of claim 68 wherein the connections coupled to drive the track bundle couple the routing resources of the logic region rows through the stitching circuitry.

70. The programmable logic device of claim 66 wherein the connections coupled to drive the track bundle include normal connections and redundant connections and the redundant connections and at least some of the normal connections in one row are redundant for the normal connections in another row.

71. The programmable logic device of claim 55 wherein the stitching circuitry includes programmable stitching drivers and the redundant stitching circuitry includes redundant programmable stitching drivers, the programmable logic advice further comprising:
first configuration elements coupled to programmable stitching drivers to selectively enable or not enable the programmable stitching drivers; and
second configuration elements coupled to redundant programmable stitching driven to selectively enable or not enable the programmable stitching drivers;
wherein normal signal paths are provided by pluralities of wires stitched together one-to-another by stitching circuitry when normal drivers are enabled and redundant drivers are not enabled and redundant signal paths are provided by pluralities of wire tails and wires stitched together a-tail-of-one-wire-to-another-wire by redundant stitching circuitry when normal drivers are not enabled and redundant drivers are enabled.

72. The programmable logic device of claim 71 wherein a number of signal paths provided on the wires and a number of redundant signal paths provided on the wires and wire tails of the track bundle is equal to one less than a number of track in the track bundle.

73. The programmable logic device of claim 55 wherein:
one or more spare rows are defined in the plurality of logic region rows;
a first wire of the plurality of wires in at least one of the plurality of tracks in the track bundle crosses at least one spare row to route signals in normal mode operation to at least one row on each side of each of the at least one spare row;
a second wire of the plurality of wires in at least one other of the plurality of tracks in the track bundle crosses a fewer number of spare rows than is crossed by the first wire;
the first wire has a physical length longer than that of the second wire such that a logical length of the first wire is equal to a logical length of the second wire.

74. The programmable logic device of claim 73 wherein the first wire crosses one spare row, the second wire crosses no spare rows, and the physical length of the first wire is one greater than the physical length of the second wire.

75. The programmable logic device of claim 55 wherein:
one or more spare rows are defined in the plurality of logic region rows;
a first wire of the plurality of wires in at least one of the plurality of tracks in the track bundle crosses at least one spare row to route signals in normal mode operation to at least one row on both sides of the at least one spare row;
a second wire of the plurality of wires in at least one other of the plurality of tracks in the track bundle cronies a fewer number of spare rows than is crossed by the first wire;
the first wire has a physical length equal to that of the second wire such that a logical length of the first wire is less than a logical length of the second wire.

76. A method of providing routing and redundancy in a programmable logic device comprising:
providing a plurality of logic region rows including a spare row;
providing a plurality of routing lines including at least a first line that crosses at least one spare row to route signals in normal mode operation to at least one row on each side of each of the at least one spare row and including a second line that crosses a fewer number of spare rows than is crossed by the first line;
proving a physical length of the first line that is longer than a physical length of the second line such that a logical length of the first line is equal to a logical length of the second line.

77. The method of claim 76 wherein the first line crosses one spare row, the second line crosses no spare rows, arid the physical length of the first line is one greater than the physical length of the second line.

78. A programmable logic device comprising:
means for providing normal mode signal paths and redundant mode signal paths, the redundant mode signal paths including portions of the normal mode signal paths; and means for selecting between the normal mode signal paths and the redundant mode signal paths.

79. IO circuitry comprising:

IO bus signal paths, each spuming a plurality of IO rows and each including a plurality of bus lines having tails;

groups of IO input elements corresponding to IO rows and coupled to receive signals from at least certain of the signal paths;

groups of IO output elements corresponding to IO rows and coupled to provide signals to at least certain of the signal paths;

wherein:

first bus lines of signal paths are stitched to second bus lines of the same signal paths through at least certain IO input elements and IO output elements, the at least certain IO input elements and IO output elements corresponding to first rows; and tails of the first bus lines are stitched to the second bus lines through at least certain IO input elements and IO output elements, the at least certain IO input elements and IO output elements corresponding to second rows.

80. The IO circuitry of claim 79 further comprising:

first connections corresponding to the IO rows and coupling at least certain of the signal paths to at learnt certain of the IO input elements in the IO rows;

wherein, within a repairable region of rows, at least some first connections corresponding to one row provide redundancy for at least some first connections corresponding to another row.

81. The IO circuitry of claim 80 further comprising:

second connections corresponding to the IO rows and coupling at least certain of the signal paths to at least certain of the IO output elements in the IO rows;

wherein, within a repairable region of rows, at least some second connections corresponding to one row provide redundancy for at least some second connections corresponding to another row.

82. The IO circuitry of claim 79 further comprising:

sets of connections coupling at least certain signal paths to at least certain IO input elements in groups of IO input elements corresponding to IO rows;

wherein:

a number of IO input elements in each group of IO input elements is equal to at least two greater than a number of signal paths;

IO input elements have positions within groups of IO elements; and over a span of at least 2 m rows, in m−1 of every m rows to which a signal path is coupled to IO input elements, the signal path is coupled to an IO input element having the same position, m being a logical length of IO bus lines providing the signal path.

83. The IO circuitry of claim 79 wherein bus lines of the signal paths are provided on tracks, the first bus lines are provided on first tracks and the second bus lines are provided on second tracks and a number of tracks is equal to at least one greater than a number of signal paths.

84. The IO circuitry of claim 79 wherein bus lines of the signal paths are provided on tracks, the first bus lines arc provided on first tracks and the second bus lines are provided on second tracks and a number of tracks is at least two greater than the number of signal paths.

85. A programmable logic device comprising the IO circuitry of claim 79.

86. A programmable logic device comprising the IO circuitry of claim 80.

87. A programmable logic device comprising the IO circuitry of claim 81.

88. A programmable logic device comprising the IO circuitry of claim 82.

89. A programmable logic device comprising the IO circuitry of claim 83.

90. A programmable logic device comprising the IO circuitry of claim 84.

91. A method of providing routing and redundancy in an HIO portion of an integrated circuit, the method comprising:

providing a plurality of HIO bus lines in a staggered segmented pattern;

providing groups of IO input buffers corresponding to IO rows;

providing circuitry coupled to switch signals between HIO bus lines; and providing a redundant circuitry coupled to switch signals between HIO bus lines.

92. The method of 91 wherein:

pluralities of bus lines coupled together by the form signal paths;

IO buffers in the groups of IO buffers have positions;

a signal path is, from row to row, listened to by an IO buffer having the same position in every row except a row after a stitching row.

93. IO circuitry comprising:

means for routing IO signals to and from IO rows; and redundant means for routing IO signals to and from IO rows.

94. A programmable logic device comprising:

a plurality of logic regions provided in rows; and multiplexors;

wherein:

a first input multiplexor is coupled to a first logic region in a first row;

a second input of the multiplexor is coupled to a second logic region in a second row;

an output of the multiplexor is coupled to a third logic region in a third row; and the multiplexer may be programmed to select the first input in a mode in which the second row is not used by the programmable logic device.

95. The programmable logic device of claim 94 wherein the first row is adjacent to the second row.

96. The programmable logic device of claim 95 wherein the third row is adjacent to the second row.

97. The programmable logic device of claim 94 wherein:

a redundant mode of the programmable logic device has a row shift direction; and logic regions of the plurality of logic regions provide signals from one to another downstream with the row shift direction.

98. The programmable logic device of claim 94 wherein:

a redundant mode of the programmable logic device has a row shift direction; and logic regions of the plurality of logic regions provide signals from one to another upstream against the row shift direction.

99. The programmable logic device of claim 94 wherein:

a redundant mode of the programmable logic device has a row shift direction;

the plurality of logic regions includes a first plurality of logic regions and a second plurality of logic regions;

logic regions of the first plurality of logic regions provide signals from one to another downstream with the row shift direction;

logic regions of the second plurality of logic regions provide signals from one to another upstream against the row shift direction.

100. A method of providing dedicated routing and redundant routing between logic regions comprising:

providing first connections coupling one logic region to another across a plurality of rows; and providing second connections coupling one logic region to another across a plurality of rows;

wherein:

the first connections couple a first logic region to second logic region;

the second connections couple a first logic region to a third logic region; and the second connections may be used bypass the second logic region if the second logic region is a spare row and a normal mode is in effect or may be used to bypass the second logic region if the second logic region is a bad row and a redundant mode is in effect.

101. A programmable logic device comprising:

dedicated routing means between logic regions; and redundant dedicated routing means between logic regions.

102. An electronic system including the programmable logic device of claim 1.

103. An electronic system including the programmable logic device of claim 18.

104. An electronic system including the programmable logic device of claim 22.

105. An electronic system including the programmable logic device of claim 33.

106. An electronic system including the programmable logic device of claim 41.

107. An electronic system including the integrated circuit of claim 45.

108. An electronic system including the programmable logic device of claim 55.

109. An electronic system including the programmable logic device of claim 85.

\* \* \* \* \*